United States Patent
Tanaka et al.

(10) Patent No.: US 6,692,165 B2
(45) Date of Patent: Feb. 17, 2004

(54) SUBSTRATE PROCESSING APPARATUS

(75) Inventors: Akiko Tanaka, Kyoto (JP); Masakazu Sanada, Kyoto (JP); Osamu Tamada, Kyoto (JP); Masahiko Harumoto, Kyoto (JP); Kayoko Nakano, deceased, late of Kyoto (JP), by Soichi Nakano, legal representative

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/090,099

(22) Filed: Feb. 28, 2002

(65) Prior Publication Data

US 2002/0121341 A1 Sep. 5, 2002

(30) Foreign Application Priority Data

| Mar. 1, 2001 | (JP) | P2001-057495 |
| Jul. 19, 2001 | (JP) | P2001-220355 |
| Jul. 23, 2001 | (JP) | P2001-220993 |
| Sep. 25, 2001 | (JP) | P2001-291405 |
| Dec. 26, 2001 | (JP) | P2001-393293 |

(51) Int. Cl.[7] .................................................. G03D 5/00
(52) U.S. Cl. ..................... 396/611; 396/627; 118/52; 427/240
(58) Field of Search ........................ 396/604, 611, 396/626, 627; 118/52–56, 319–321; 427/240, 420, 560

(56) References Cited

U.S. PATENT DOCUMENTS

| 5,759,614 A | * | 6/1998 | Tomoeda et al. ............ 427/240 |
| 5,854,953 A | * | 12/1998 | Semba ........................ 396/611 |
| 5,965,200 A | * | 10/1999 | Tateyama et al. ............ 427/240 |
| 6,092,937 A | | 7/2000 | Snodgrass et al. .......... 396/611 |

FOREIGN PATENT DOCUMENTS

| JP | 10-20508 | 1/1998 |
| JP | 10-340836 | 12/1998 |
| JP | 11-221511 | 8/1999 |

* cited by examiner

*Primary Examiner*—D. Rutledge
(74) *Attorney, Agent, or Firm*—Ostrolenk, Faber, Gerb & Soffen, LLP

(57) ABSTRACT

A developer is supplied onto a substrate and thereafter a rinse discharge nozzle is moved toward an operating direction. The rinse discharge nozzle is so moved on the substrate as to continuously supply pure water onto the substrate from a slit discharge port of the rinse discharge nozzle while sucking and recovering the pure water from the surface of the substrate through a slit suction port, and a series of development is performed in a stationary state of the substrate.

27 Claims, 49 Drawing Sheets

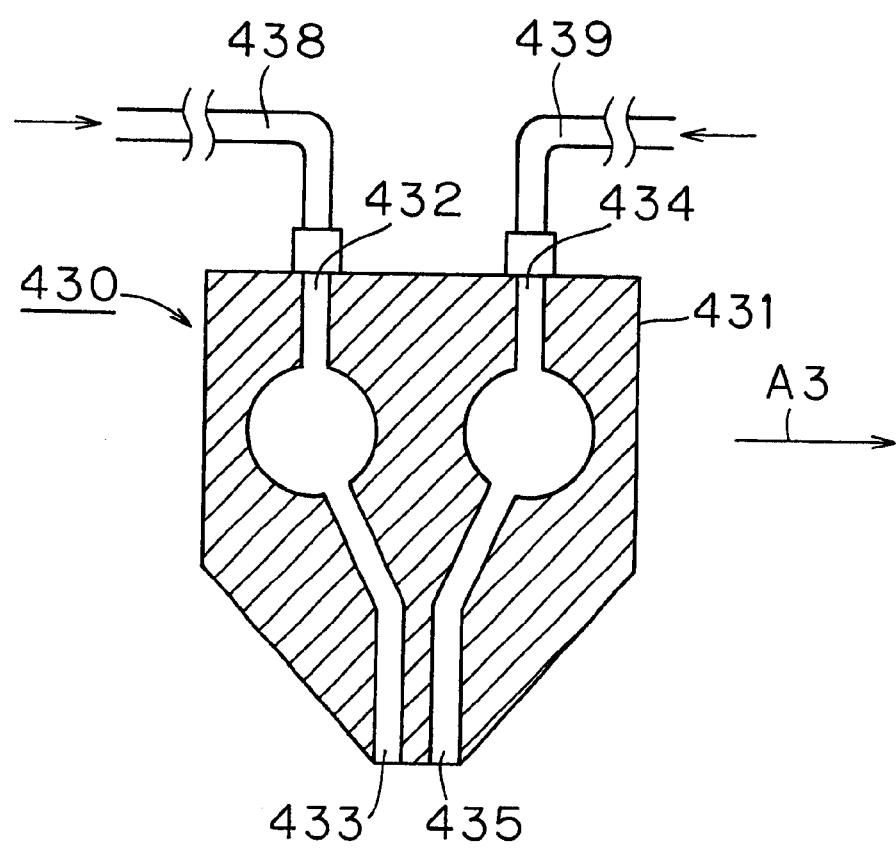

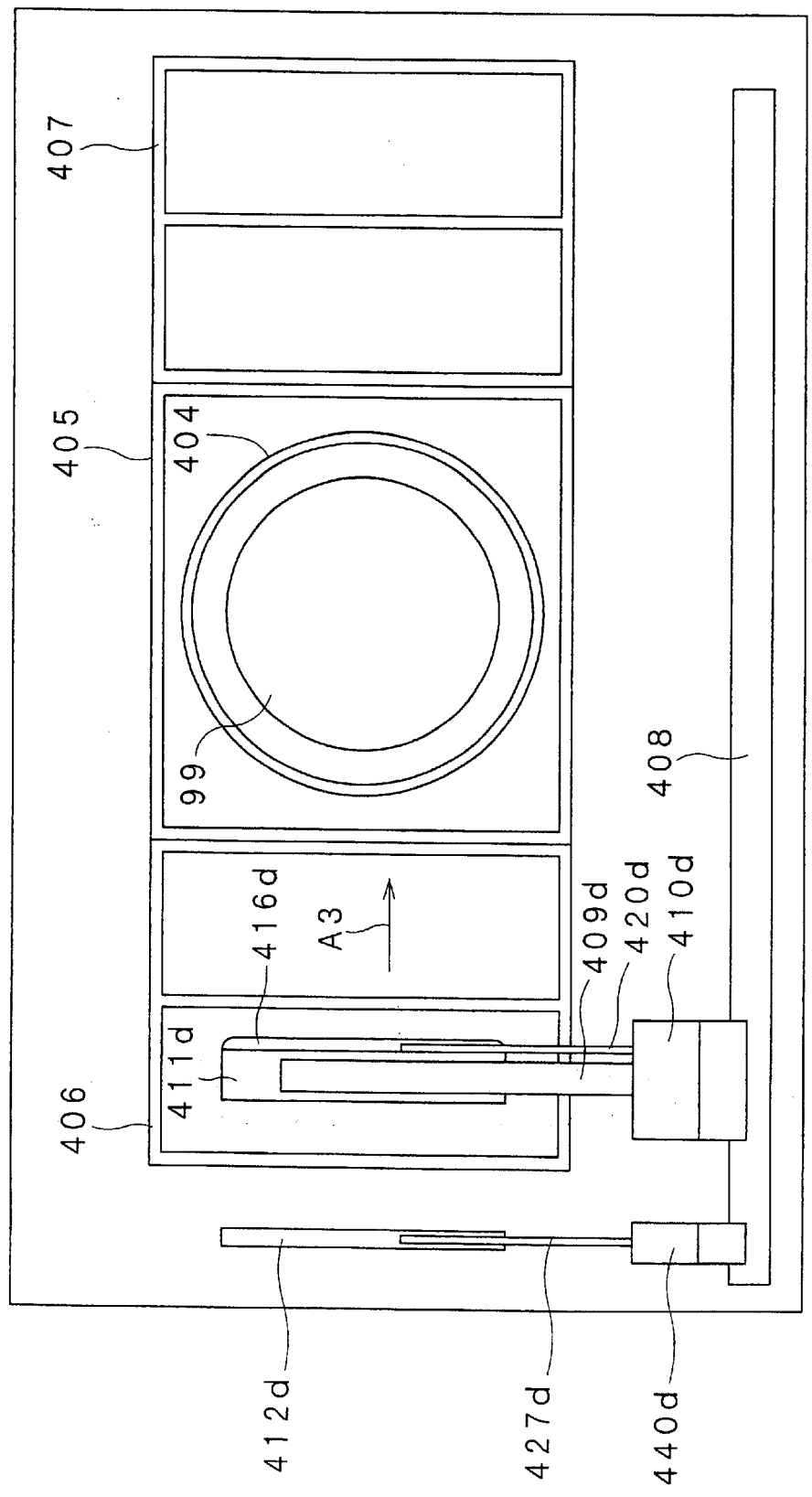

SUBSTRATE PROCESSING APPARATUS

BACKGROUND OF THE INVENTION

1. Field of the Invention

The present invention relates to a substrate processing apparatus for developing a substrate such as a semiconductor wafer, a glass substrate for a liquid crystal display, a glass substrate for a photomask, a substrate for an optical disk or the like.

2. Description of the Background Art

A substrate developing apparatus is employed for developing a photosensitive film of photoresist or the like formed on a substrate such as a semiconductor wafer, a glass substrate for a liquid crystal display (LCD), a glass substrate for a photomask, a substrate for an optical disk or the like.

In relation to development of an exposed photosensitive film formed on the surface of a substrate in a semiconductor manufacturing process or an LCD manufacturing process, known is a developing apparatus discharging a developer from a spray discharge nozzle while horizontally holding the substrate and rotating the same about a vertical axis thereby uniformly and sufficiently supplying the developer to the overall surface of the rotated substrate for developing the photosensitive film or dropping a developer onto the substrate kept in a stationary state from a nozzle having a discharge width at least equivalent to the maximum width of the substrate while moving this nozzle in parallel with the surface of the substrate thereby heaping the developer on the overall surface of the substrate, for example.

The developing apparatus heaping the developer on the overall surface of the substrate for developing the photosensitive film of photoresist or the like generally rotates the substrate at a high speed after a lapse of a prescribed developing time from supply of the developer onto the surface of substrate for discharging a rinse such as pure water, for example, to the surface of the rotated substrate from a discharge nozzle while draining the developer off the substrate by centrifugal force and replacing the developer with the pure water on the overall surface of the substrate, in order to stop development of the photosensitive film with the developer. Thereafter the developing apparatus further continuously rotates the substrate for draining the rinse off the substrate and drying the substrate thereby ending the processing.

However, the conventional developing apparatus performs at least the processing of supplying the rinse while draining the developer for stopping development of the photosensitive film with the developer to the subsequent processing of draining the rinse and drying the substrate in the state rotating the substrate at a high speed, and hence the developer or the rinse drained off the substrate by centrifugal force is disadvantageously splashed back from the periphery to adhere the surface or the back surface of the substrate again and contaminate the substrate. Following further refinement of patterns, a fine pattern formed by the developer may collapse due to influence by the centrifugal force resulting from high-speed rotation of the substrate.

In the process of manufacturing a semiconductor device, for example, a slit scan development system is recently widely employed as one of methods of developing a photoresist film formed on the surface of a substrate such as a semiconductor wafer. This development system linearly horizontally moves a developer discharge nozzle having a slit discharge port substantially equivalent to or longer by about several mm than the diameter of a substrate from a first end to a second end of the substrate horizontally held in a stationary state by a substrate holding part while discharging a developer onto the substrate from the slit discharge port of the developer discharge nozzle for heaping the developer on the substrate. Thus, line width uniformity of a resist film pattern can be remarkably improved by heaping the developer while keeping the substrate stationary.

When the developer discharge nozzle moves at a speed of 50 mm/sec. in this slit scan development, for example, developing time difference of six seconds at the maximum results in a substrate of 300 mm in diameter. In a developing time of about 60 seconds applied to a conventional manufacturing process, development of photoresist substantially converges and hence the developing time difference resulting in the substrate surface does not appear as difference in work dimension exceeding allowance. In manufacturing of a recent semiconductor device, however, a hyperfine working technique is employed while allowance for work dimensions is strictly managed. Therefore, the difference in work dimension resulting from developing time difference, hardly regarded as problematic in general, recently comes into question as the case may be. When the developing time is reduced in order to improve the throughput, further, the difference in work dimension resulting from developing time difference disadvantageously gets remarkable.

Therefore, a scan rinse system of providing a rinse discharge nozzle supplying a rinse (pure water) onto a substrate for stopping development with a slit discharge port for heaping a developer through a developer discharge nozzle, thereafter holding a prescribed developing time and discharging the rinse onto the substrate from the slit discharge port of the rinse discharge nozzle while moving the rinse discharge nozzle at the same speed in the same direction as the developer discharge nozzle is proposed in order to eliminate the developing time difference in the substrate surface.

When a developer discharge nozzle (not shown) heaps a developer 301 on the overall upper surface of a substrate W horizontally held by a substrate holding part 310 and thereafter a rinse discharge nozzle 312 discharges a rinse 302 onto the substrate W from a slit discharge port thereof while horizontally moving from a first end to a second end of the substrate W as shown in FIG. 31A, however, the rinse 302 discharged from the rinse discharge nozzle 312 also flows frontward in the direction of movement of the rinse discharge nozzle 312, as shown in FIG. 31B. The rinse 302 flowing frontward from the rinse discharge nozzle 312 partially washes away the developer 301 located in front of the rinse discharge nozzle 312 from the substrate W. Therefore, it follows that development is stopped in front of the rinse discharge nozzle 312 before the rinse discharge nozzle 312 moves. Consequently, developing time difference in the surface of the substrate W cannot be efficiently eliminated and work dimension difference resulting from the developing time difference cannot be eliminated either.

FIGS. 48A to 48E are model diagrams showing exemplary developing steps through a developing apparatus capable of performing uniform development at a low cost.

As shown in FIG. 48A, a developer discharge nozzle 511 moves from a position on a side located outside a substrate 500 held in a stationary state by a substrate holding part 501 to a position on another side located outside the substrate 500 through the substrate 500 along with a rinse discharge nozzle 516. The developer discharge nozzle 511 is inclined in a direction opposite to a scanning direction A3 with respect to the substrate 500, in order to suppress flowage of a developer in the scanning direction A3 while inducing flowage of the developer in the direction opposite to the scanning direction A3 on the surface of the substrate 500 thereby improving uniformity of development and preventing development defects.

Then, the substrate 500 held by the substrate holding part 501 is rotated by 180° as shown in FIG. 48B, and the developer discharge nozzle 511 moves along with the rinse discharge nozzle 516, which in turn supplies a rinse onto the substrate 500 thereby stopping development, as shown in FIG. 48C. A pure water discharge nozzle 512 cleans a resist film or the like provided on the substrate 500, as shown in FIG. 48D. Thereafter the substrate 500 is horizontally rotated about a vertical axis to be dried, as shown in FIG. 48E.

Thus, development can be stopped by supplying the rinse onto the substrate 500 from the rinse discharge nozzle 516 after supplying the developer onto the substrate 500 from the developer discharge nozzle 511, whereby a uniform developing time can be attained on the substrate 500. Further, the developer discharge nozzle 511 moves on the substrate 500 along with the rinse discharge nozzle 516, whereby the structures of moving elements are simplified and miniaturized for saving the space therefor. Consequently, uniform development can be performed at a low cost.

However, the aforementioned developing apparatus requires a motor (rotating/driving unit) for rotating the substrate 500 thereby drying the same, to hinder miniaturization of the developing apparatus or reduction of the space therefor. Further, a time of about 10 seconds is required for rotating the substrate 500 and drying the same, to result in reduction of the throughput of the development.

In the process of manufacturing a semiconductor device, for example, the slit scan development system is recently widely employed as one of methods of developing a photoresist film formed on the surface of a substrate such as a semiconductor wafer. This development system linearly horizontally moves a developer discharge nozzle having a slit discharge port on its lower end surface from a first end to a second end of a substrate horizontally held by a substrate holding part in a stationary state while discharging a developer onto the substrate from the slit discharge port of the developer discharge nozzle for heaping the developer on the substrate. Thus, line width uniformity of a resist film pattern can be remarkably improved by heaping the developer while keeping the substrate stationary. The scan rinse system supplying pure water (rinse) for stopping development after a lapse of a prescribed time from heaping of a developer while horizontally linearly moving a pure water discharge nozzle is also recently employed in order to further improve the line width uniformity of the pattern.

When selectively horizontally linearly moving the developer discharge nozzle and the pure water discharge nozzle respectively for discharging the developer and the pure water onto the substrate respectively, however, a driving system as well as control operations are complicated. Further, the developer discharge nozzle used in the slit scan development system and the pure water discharge nozzle used in the scan rinse system are manufactured with specific materials by specific working methods for attaining maximum process performance, leading to extremely high costs.

In addition, a driving system and a control system are disadvantageously complicated not only in the apparatus selectively moving the developer discharge nozzle and the pure water discharge nozzle respectively for discharging the developer and the pure water onto the substrate but also in an apparatus selectively moving a developer discharge nozzle and a pure water discharge nozzle to a central position of a substrate respectively for discharging a developer and pure water onto the substrate while rotating the substrate about a vertical axis.

A further conventional substrate processing apparatus moves a developer supply nozzle from a first end to a second end of a substrate for supplying a developer to the overall upper surface of the substrate and moves a rinse supply nozzle from the first end to the second end of the substrate at the same speed as that for moving the said developer supply nozzle after a lapse of a prescribed time for supplying a rinse to the overall upper surface of the substrate and stopping development on the surface of the substrate.

According to this substrate processing apparatus, the developing time can be rendered substantially identical on the overall upper surface of the substrate, whereby uneven development can be prevented while line width uniformity of a resist pattern after development can be improved.

However, the aforementioned substrate processing apparatus supplies the rinse at a feed rate for supplying the rinse to only a part of the substrate corresponding to a position of movement during movement of the rinse supply nozzle for attaining a substantially identical developing time on the overall upper surface of the substrate.

Therefore, a cleaning effect for the substrate is so insufficient that particles of dissolution products etc. resulting from development are retained on the substrate, leading to reduction of the product yield or the like.

SUMMARY OF THE INVENTION

The present invention is directed to a substrate processing apparatus supplying a developer to a substrate for developing the same and thereafter supplying a rinse for washing away the developer.

A substrate processing apparatus according to the present invention comprises a substrate holding element horizontally holding a substrate in a stationary state, a developer supplying moving element including a developer discharge port having a discharge width at least equivalent to the diameter of the substrate for moving from a developer supply start position on a first end of the substrate held by the substrate holding element to a developer supply end position on a second end and supplying a developer to the surface of the substrate, and a rinse supplying moving element including a rinse discharge port having a discharge width at least equivalent to the diameter of the substrate for moving from the developer supply start position to the developer supply end position after the developer supplying moving element supplies the developer to the overall surface of the substrate for supplying a rinse to the overall surface of the substrate from the rinse discharge port, while the rinse supplying moving element has a rinse suction port having a suction width at least equivalent to the diameter of the substrate at the back of the rinse discharge port in the direction of movement of the rinse supplying moving element so that the rinse supplying moving element moves from the developer supply start position to the developer supply end position after the developer supplying moving element supplies the developer to the overall surface of the substrate for supplying the rinse to the overall surface of the substrate from the rinse discharge port while recovering the supplied rinse from the rinse suction port.

The rinse can be recovered from the substrate while keeping the substrate in a stationary state.

Another substrate processing apparatus according to the present invention comprises a substrate holding element horizontally holding a substrate, a developer supply element having a slit developer discharge port for discharging a developer onto the substrate from the slit developer discharge port while relatively horizontally moving with respect to the substrate held by the substrate holding element and heaping the developer on the overall upper surface of the substrate, a rinse supply element having a slit rinse discharge port for discharging a rinse onto the substrate from the slit rinse discharge port while relatively moving in the same direction as the direction of relative movement of the developer supply element with respect to the substrate held by the substrate holding element for stopping development reaction with the developer, and an anti-flow element preventing the rinse discharged onto the substrate from the slit rinse discharge port of the rinse supply element from flowing frontward in the direction of the relative movement of the rinse supply element with respect to the substrate and preventing the developer on the substrate from being swept away frontward in the direction of the relative movement by the rinse.

The anti-flow element prevents the rinse discharged onto the substrate, whereby developing time difference can be eliminated on the surface of the substrate.

Still another substrate processing apparatus according to the present invention comprises a substrate holding element holding a substrate, a developer discharge nozzle discharging a developer, a processing solution discharge nozzle discharging a processing solution for stopping development, a gas injection nozzle injecting a gas for removing the developer and the processing solution from the substrate and drying the substrate, and a moving element moving the developer discharge nozzle, the processing solution discharge nozzle and the gas injection nozzle from a position on a first side located outside the substrate held by the substrate holding element in a stationary state to a position on a second side located outside the substrate through the substrate.

In this case, it is not necessary to rotate the substrate for drying the same, whereby no rotating/driving unit is required for rotating the substrate. Further, no time is required for a step of rotating the substrate, whereby the throughput of development is improved. Consequently, miniaturization, reduction of a space and improvement of production efficiency are enabled.

A further substrate processing apparatus according to the present invention comprises a substrate holding element horizontally holding a substrate, a solution discharge nozzle having a discharge port for discharging a developer onto the substrate from the discharge port, a developer supply source, and a developer supply pipe connecting the solution discharge nozzle and the developer supply source with each other in a channel manner, and the substrate processing apparatus further comprises a pure water supply source and a pure water supply pipe connected to the pure water supply source and communicatively connected to the solution discharge nozzle, for interposing a first on-off valve in the developer supply pipe while interposing a second on-off valve in the pure water supply pipe for selectively opening the first on-off valve and the second on-off valve.

The single solution discharge nozzle can discharge the developer and the pure water onto the substrate, whereby this substrate processing apparatus has a relatively simple driving system and relatively simple control operations, can be miniaturized, and can reduce the cost.

According to an aspect of the present invention, the substrate processing apparatus further comprises a developer recovery pipe communicatively connected to the solution discharge nozzle, a third on-off valve interposed in the developer recovery pipe, a recovery suction element sucking the contents of the solution discharge nozzle through the developer recovery pipe, and a recovery tank arranged between the solution discharge nozzle and the recovery suction element for recovering the developer sucked from the solution discharge nozzle.

Unused part of the developer remaining in the solution discharge nozzle can be recovered and reused after discharging the developer onto the substrate from the solution discharge nozzle, whereby consumption of the developer can be reduced.

According to another aspect of the present invention, the substrate processing apparatus further comprises a drain pipe communicatively connected to the solution discharge nozzle, a fourth on-off valve interposed in the drain pipe, and a drain suction element sucking the contents of the solution discharge nozzle through the drain pipe.

The pure water remaining in the solution discharge nozzle can be reliably discharged from the solution discharge nozzle after supplying the pure water onto the substrate.

A further substrate processing apparatus according to the present invention comprises a substrate holding element holding a substrate, a developer supply element supplying a developer from a first end to a second end of the main surface of the substrate held by the substrate holding element, a stop bath supply element supplying a stop bath from the first end to the second end of the main surface of the substrate after the developer is supplied to the main surface of the substrate, a detergent supply element supplying a detergent to the main surface of the substrate, and a control part causing the detergent to be supplied to the main surface of the substrate from the detergent supply element after the stop bath is supplied to the substrate. In the substrate processing apparatus, the detergent supply element includes: a detergent supply nozzle having a discharge port having a width substantially identical to or in excess of the diameter of the substrate, and a detergent supply nozzle moving element moving the detergent supply nozzle from a first end toward a second end of a position where the substrate holding element holds the substrate, and said control part causes said detergent to be supplied from the detergent supply nozzle while moving the detergent supply nozzle from the first end toward the second end of the position where the substrate is held or vice versa after the stop bath is supplied to the substrate.

The substrate supplied with the stop bath can be sufficiently cleaned.

Accordingly, an object of the present invention is to provide a substrate processing apparatus capable of preventing a substrate from contamination in the process of development.

Another object of the present invention is to provide a substrate developing apparatus capable of preventing pattern collapse with a developer in the process of development.

Still another object of the present invention is to provide processing equipment for a substrate capable of eliminating developing time difference in a substrate surface thereby eliminating work dimension difference resulting from the developing time difference when performing slit scan development/slit scan rinsing.

A further object of the present invention is to provide a developing apparatus enabling miniaturization, reduction of a space and improvement of production efficiency.

A further object of the present invention is to provide processing equipment for a substrate having a relatively simple driving system and relatively simple control operations and capable of reducing the cost.

A further object of the present invention is to provide a substrate processing apparatus capable of sufficiently cleaning a substrate supplied with a stop bath.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 43 is a schematic sectional view showing an exemplary common nozzle obtained by integrating the rinse discharge nozzle with the gas injection nozzle;

FIG. 44 is a plan view of a developing apparatus according to an eleventh embodiment of the present invention;

DESCRIPTION OF THE PREFERRED EMBODIMENTS

<First Embodiment>

Figure 1:
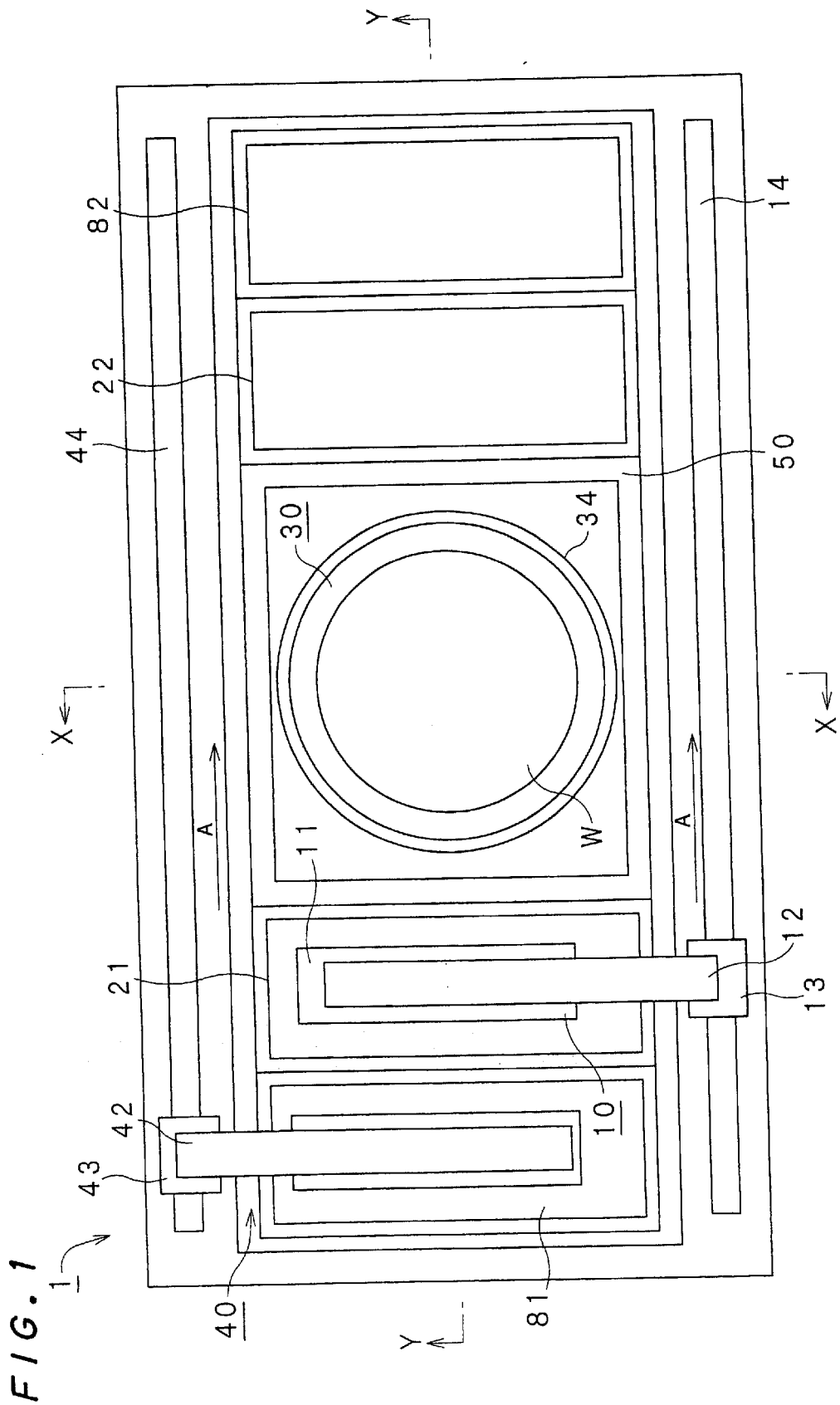
FIG. 1 is a plan view of a substrate developing apparatus according to a first embodiment of the present invention.

A substrate developing apparatus according to the present invention is now described. FIG. 1 is a plan view of a substrate developing apparatus 1 according to a first embodiment of the present invention, FIG. 2 is a sectional view taken along the line X—X in FIG. 1 showing a principal part of the substrate developing apparatus 1 with a developer discharge nozzle 11 located on a substrate W as described later, FIG. 3 is a sectional view taken along the line X—X in FIG. 1 showing the principal part of the substrate developing apparatus 1 with a rinse discharge nozzle 41 located on the substrate W as described later, and FIG. 4 is a sectional view taken along the line Y—Y in FIG. 1 showing still the principal part of the substrate developing apparatus 1.

As shown in FIG. 1, the substrate developing apparatus 1 comprises a developer discharge unit 10, a rinse discharge unit 40, an outer cup 50 comprising a processing part 30, a developer nozzle standby pot 21 and a rinse nozzle standby pot 81 provided on a first end of the outer cup 50 and a developer nozzle standby pot 22 and a rinse nozzle standby pot 82 provided on a second end of the outer cup 50. Referring to FIG. 1, a guide rail 14 is arranged under the outer cup 50, and a nozzle arm 12 forming the developer discharge unit 10 described later is provided to be movable along the guide rail 14 in a scanning direction A and a direction opposite thereto by an arm driving part 13.

Figure 2:
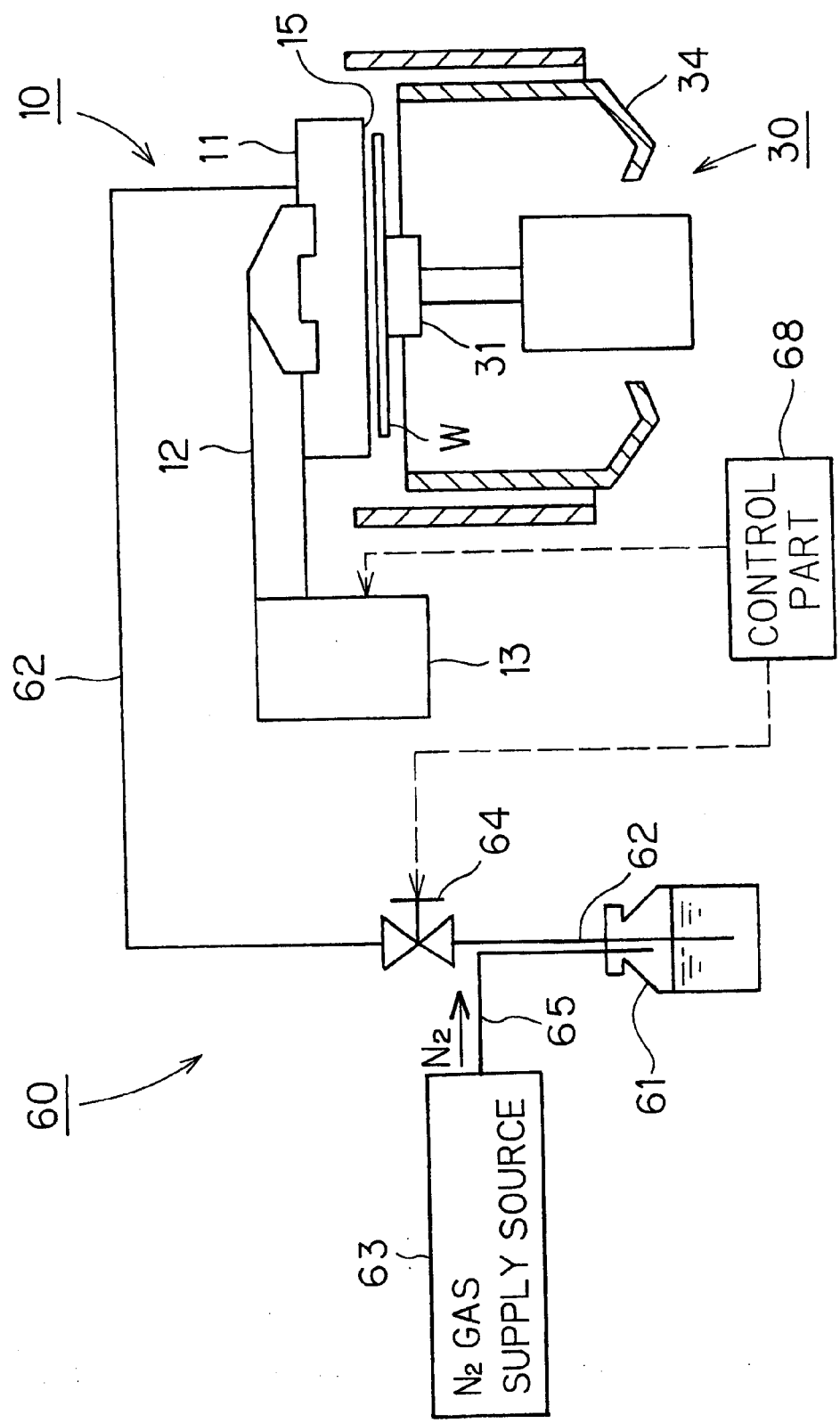
FIGS. 2 and 3 are sectional views of a principal part of the substrate developing apparatus taken along the line X—X in FIG. 1.
Figure 3:
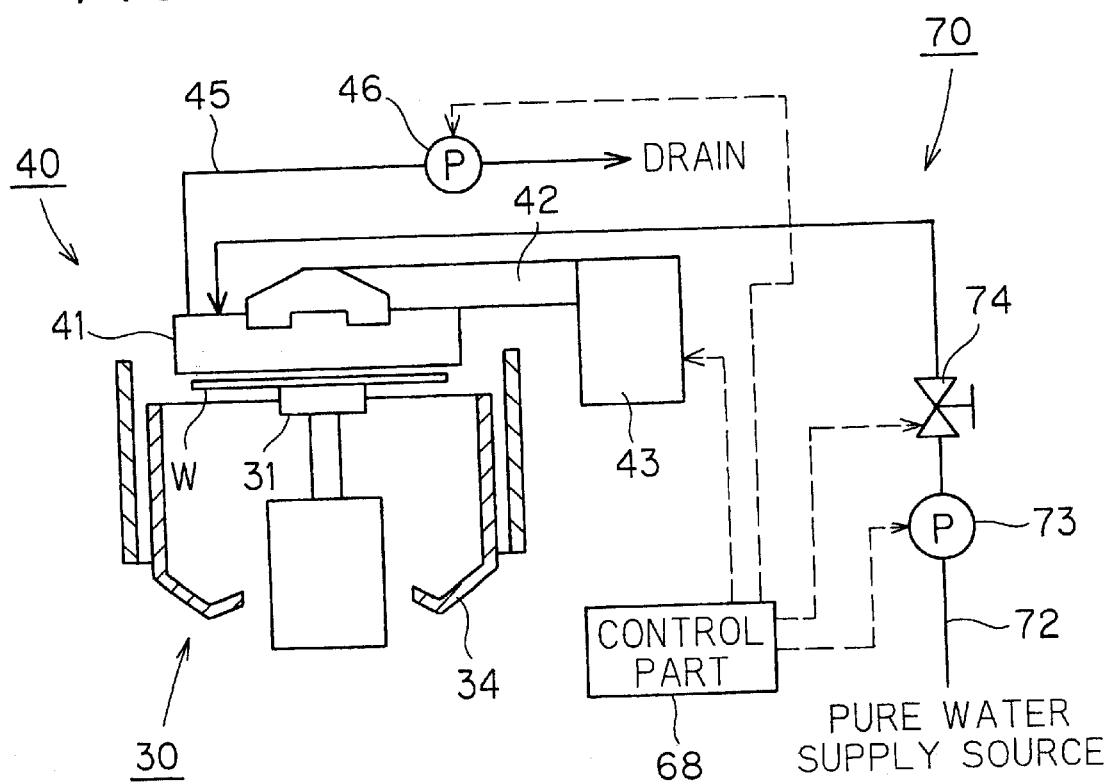
Figure 4:
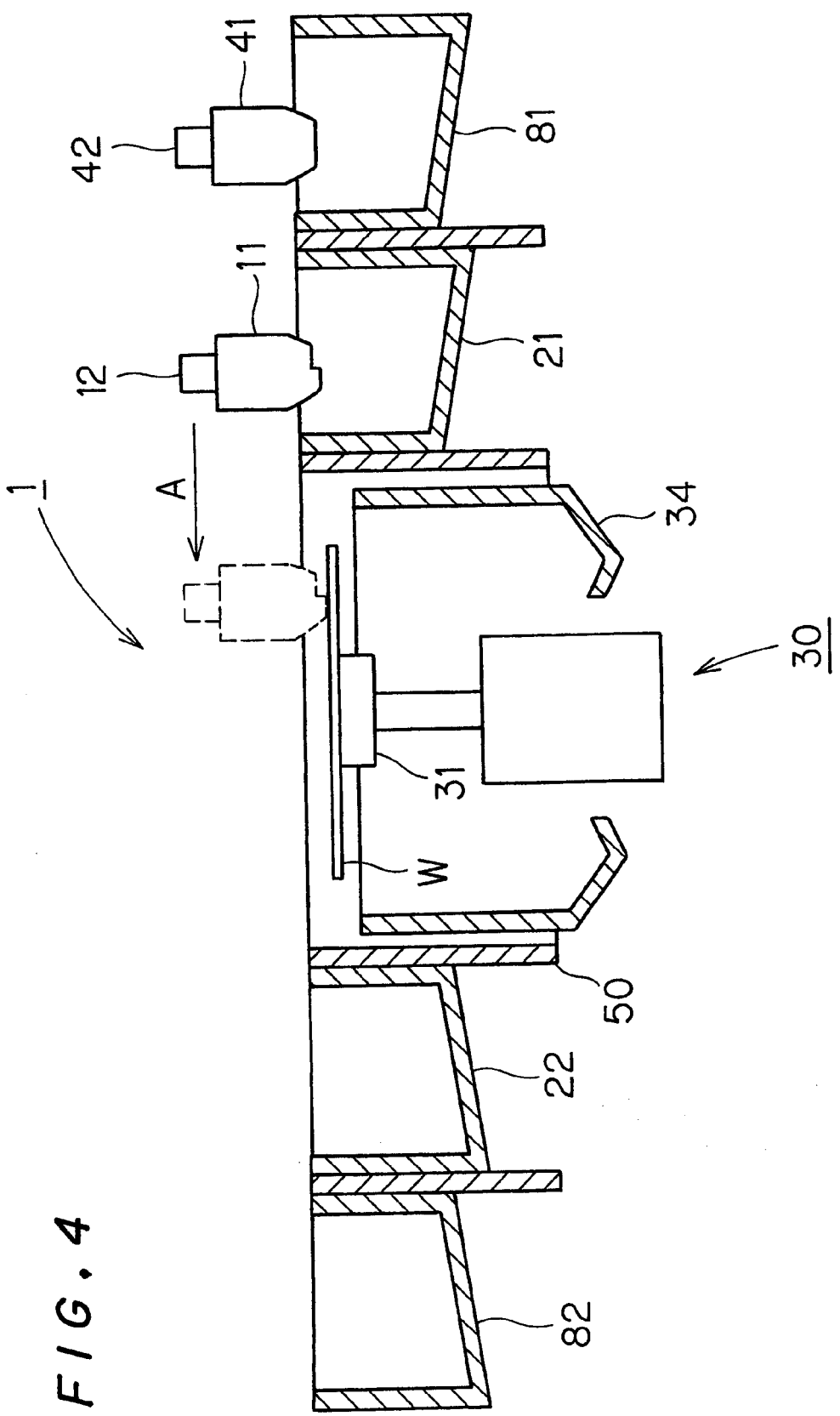
FIG. 4 is a sectional view of the principal part of the substrate developing apparatus taken along the line Y—Y in FIG. 1.

As shown in FIGS. 2, 3 and 4, the processing part 30 comprises a suction chuck 31 horizontally sucking/holding the substrate W in a stationary state. A solution recovery cup 34 recovering a developer and a rinse is provided around the suction chuck 31 to be vertically movable by a vertical moving element (not shown). While the suction chuck 31 horizontally holds the substrate W in the stationary state in this embodiment, the present invention is not restricted to this but any element is employable so far as the same has a structure capable of horizontally holding the substrate W.

As shown in FIG. 2, the developer discharge unit 10 comprises the nozzle arm 12 and the developer discharge nozzle 11 provided on the lower end of the nozzle arm 12. The developer discharge nozzle 11 stands by in the developer nozzle standby pot 21 provided on the first end of the processing part 30 before starting discharging the developer, while going out from the developer nozzle standby pot 21 and moving on the substrate W held by the suction chuck 31 due to the nozzle arm 12 moving along the guide rail 14 by the arm driving part 13 for linearly moving to the developer nozzle standby pot 22 provided on the second end of the processing part 30 along the scanning direction A (see FIGS. 1 and 4).

As shown in FIG. 2, a developer supply source system 60 supplies the developer to the developer discharge nozzle 11. The developer supply source system 60 is formed by a solution storage part 61 storing the developer, a pipe 62 communicatively connecting the solution storage part 61 and the developer discharge nozzle 11 with each other, an $N_2$ gas supply source 63 supplying an $N_2$ gas to the solution storage part 61 through a pipe 65 for feeding the developer from the solution storage part 61 to the developer discharge nozzle 11 and an on-off valve 64 interposed in the pipe 62.

A control part 68 formed by a microcomputer is electrically connected to the arm driving part 13, the on-off valve 64 and the $N_2$ gas supply source 63, for controlling discharge conditions such as a timing for scanning (movement) of the developer discharge nozzle 11 by the arm driving part 13, timings for starting and stopping discharging the developer from the developer discharge nozzle 11 by the on-off valve 64, the quantity and speed for discharging the developer, and the like.

Figure 5:
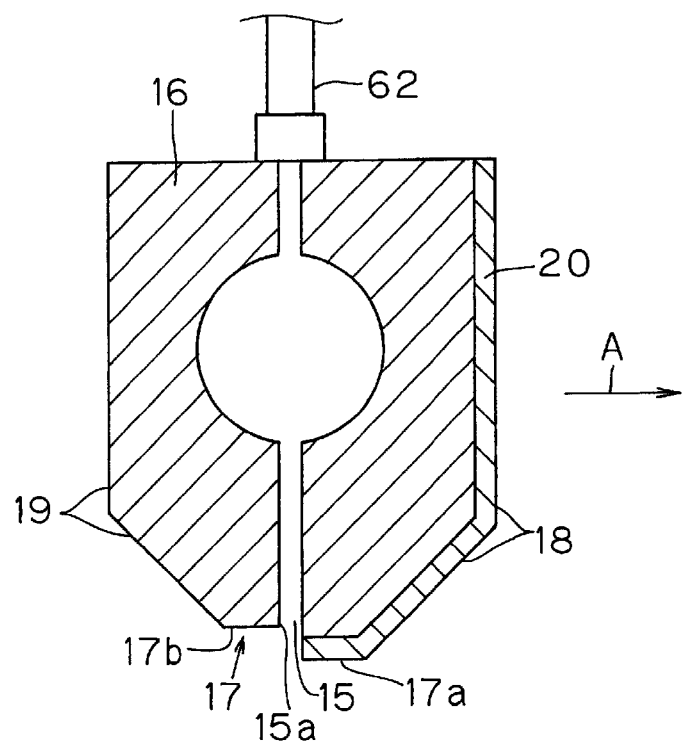
FIG. 5 is a sectional view of a developer discharge nozzle according to the first embodiment of the present invention.

FIG. 5 is a sectional view of the developer discharge nozzle 11.

A nozzle body part 16 of the developer discharge nozzle 11 has a stepped bottom surface 17. This nozzle body part 16 is formed with a slit discharge port 15 as a developer discharge port vertically downwardly extending and opening on the bottom surface 17. The stepped bottom surface 17 consists of a planar bottom surface (hereinafter referred to as a front bottom surface) 17a located in front of the slit discharge port 15 in the scanning direction A and a planar bottom surface (hereinafter referred to as a rear bottom surface) 17b located at the back of the slit discharge port 15 in the scanning direction A. The front bottom surface 17a is formed on a position lower than the rear bottom surface 17b. Thus, the interval between the surface of the substrate W horizontally held by the suction chuck 31 shown in FIG. 1 in a stationary state and the front bottom surface 17a is smaller than the interval between the surface of the substrate W and the rear bottom surface 17b. The developer discharge nozzle 11 scans along the scanning direction A so that the front and rear bottom surfaces 17a and 17b keep a parallel state with respect to the surface of the substrate W.

The nozzle body part 16 of the developer discharge nozzle 11 is made of a relatively hard hydrophilic material such as stainless steel, quartz glass, Pyrex glass, ceramics (e.g., alumina, SiC or αC) or the like. Toward the scanning direction A, the front bottom surface 17a located in front of the slit discharge port 15 on the bottom surface 17 of the nozzle body part 16 and an outer wall surface 18 located in front of the slit discharge port 15 are coated with a water-repellent material layer 20 of resin such as PPS (polyphenylene sulfide), PTFE (polytetrafluoroethylene) or the like. The water-repellent material layer 20 employed in the present embodiment is made of PTFE. In a region and on an outer wall surface 19 located at the back of the slit discharge port 15 on the bottom surface 17 of the nozzle body part 16 toward the scanning direction A, the hydrophilic material is exposed. The hydrophilic material is exposed also on an inner wall surface 15a of the slit discharge port 15.

Figure 7:
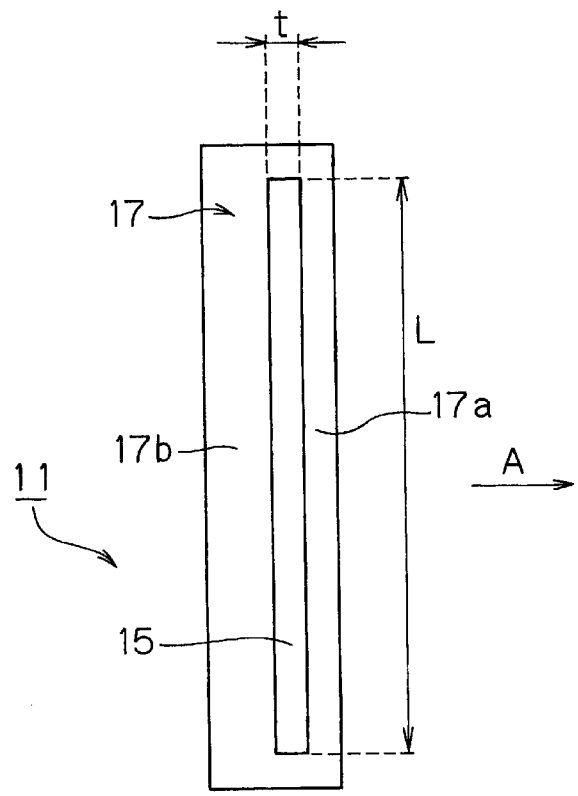
FIG. 7 is a bottom plan view of the developer discharge nozzle according to the first embodiment of the present invention.

As shown in FIG. 7, the longitudinal discharge width direction of the slit discharge port 15 of the developer discharge nozzle 11 is arranged perpendicularly to the scanning direction A of the developer discharge nozzle 11. The length of a shorter side t of the slit discharge port 15 is 0.05 to 1.00 mm, and set to 0.1 mm in this embodiment. On the other hand, the longitudinal discharge width L of the slit discharge port 15 is set identical to or larger than (at least equivalent to) the diameter of the substrate W to be processed, and set to 210 mm in this embodiment in order to process the substrate W of eight inches in diameter.

The developer discharge nozzle 11 scans along the scanning direction A keeping the bottom surface 17 parallel to the surface of the substrate W. The interval between the slit discharge port 15 and the surface of the substrate W is 0.2 to 5.0 mm, more preferably 0.5 mm to 2.0 mm, and set to 1.0 mm in this embodiment.

Referring again to FIGS. 1 and 3, the rinse discharge unit 40 comprises a nozzle arm 42 and the rinse discharge nozzle 41 mounted on the lower end of the nozzle arm 42. The rinse discharge nozzle 41 stands by in the rinse nozzle standby pot 81 provided on the first end of the processing part 30 before starting discharging the rinse, while going out from the rinse nozzle standby pot 81 and moving on the substrate W held by the suction chuck 31 due to the nozzle arm 42 moving along the guide rail 44 by the arm driving part 43 for linearly moving to the rinse nozzle standby pot 82 provided on the second end of the processing part 30 when supplying the rinse onto the substrate W in practice after the aforementioned developer discharge nozzle 11 supplies the developer to the substrate W and develops the same (see FIGS. 1 and 4).

As shown in FIG. 3, a rinse supply source system 70 supplies pure water to the rinse discharge nozzle 41 as the rinse. The rinse supply source system 70 is formed by a pipe 72 guiding the pure water supplied from a pure water supply source serving as utility, a pump 73 interposed in the pipe 72 for feeding the pure water to the rinse discharge nozzle 41 and an on-off valve 74 interposed in the pipe 72.

The rinse discharge nozzle 41 is connected with a suction pipe 45 having a suction pump 46 interposed in an intermediate portion thereof, for sucking and recovering the pure water supplied onto the W through a slit suction port 51 formed on the bottom surface of the rinse discharge nozzle 41 as described later and discharging the same to a drain due to driving of the suction pump 46.

The control part 68 is further connected with the arm driving part 43, the on-off valve 74, the pump 73 and the suction pump 46 for controlling various discharge conditions such as a timing for scanning (movement) of the rinse discharge nozzle 41 by the arm driving part 43, timings for starting and stopping discharging the rinse from the rinse discharge nozzle 41 by the on-off valve 74, the quantity and speed for discharging the pure water and the like and suction/recovery of the pure water from the substrate W through the slit suction port 51 as described later.

Figure 6:
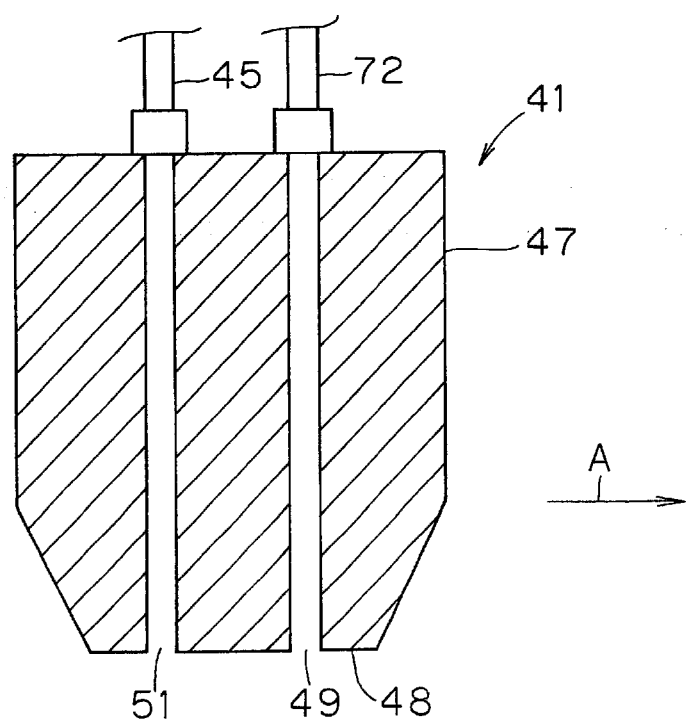
FIG. 6 is a sectional view of a rinse discharge nozzle according to the first embodiment of the present invention.

FIG. 6 is a sectional view of the rinse discharge nozzle 41.

A nozzle body part 47 of the rinse discharge nozzle 41 has a bottom surface 48. This nozzle body part 47 is formed with a slit discharge port 49 corresponding to a rinse discharge port vertically downwardly extending on a front position of the bottom surface 48 in the direction of movement toward the scanning direction A and opening on the bottom surface 48. This slit discharge port 49 communicates with the pipe 72, for supplying the pure water guided through the pipe 72 to the substrate W as the rinse. The nozzle body part 47 is also formed with the slit suction port 51 corresponding to a rinse suction port vertically downwardly extending on a rear position of the bottom surface 48 in the direction of movement toward the scanning direction A and opening on the bottom surface 48. This slit suction port 51 communicates with the pipe 45, for sucking and recovering the pure water supplied onto the substrate W through the pipe 45. The rinse discharge nozzle 41 scans along the scanning direction A keeping the bottom surface 48 thereof parallel to the surface of the substrate W.

The nozzle body part 47 of the rinse discharge nozzle 41 is also made of a relatively hard hydrophilic material such as stainless steel, quartz glass, Pyrex glass, ceramics (e.g., alumina, SiC or αC) or the like.

Figure 8:
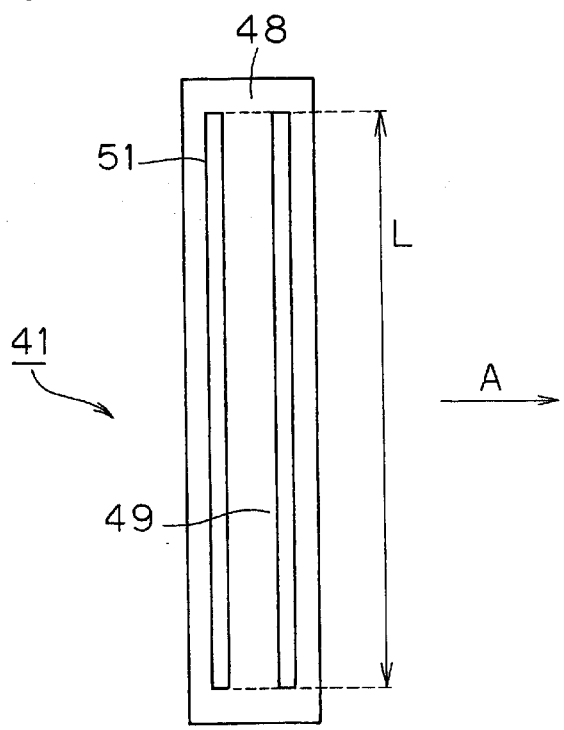
FIG. 8 is a bottom plan view of the rinse discharge nozzle according to the first embodiment of the present invention.

As shown in FIG. 8, the longitudinal discharge width direction of the slit discharge port 49 formed on the bottom surface 48 of the rinse discharge nozzle 41 is arranged vertically to the scanning direction A of the rinse discharge nozzle 48. The longitudinal discharge width L of the slit discharge port 49 is set identical to or larger than (at least equivalent to) the diameter of the substrate W to be processed, and is set to 210 mm according to this embodiment in order to process the substrate W of eight inches in diameter.

The longitudinal suction width direction of the slit suction port 51 formed on the bottom surface 48 of the rinse discharge nozzle 41 is also arranged vertically to the scanning direction A of the rinse discharge nozzle 41. The longitudinal suction width L of the slit suction port 51 is also set identical to or larger than (at least equivalent to) the diameter of the substrate W to be processed, and is set to 210 mm according to this embodiment in order to process the substrate W of eight inches in diameter.

The rinse discharge nozzle 41 scans along the scanning direction A keeping the bottom surface 48 parallel to the surface of the substrate W. The intervals between the slit discharge and suction ports 49 and 51 and the surface of the substrate W are 0.2 to 5.0 mm, more preferably 0.5 to 2.0 mm, and set to 1.0 mm according to this embodiment.

Figure 9:
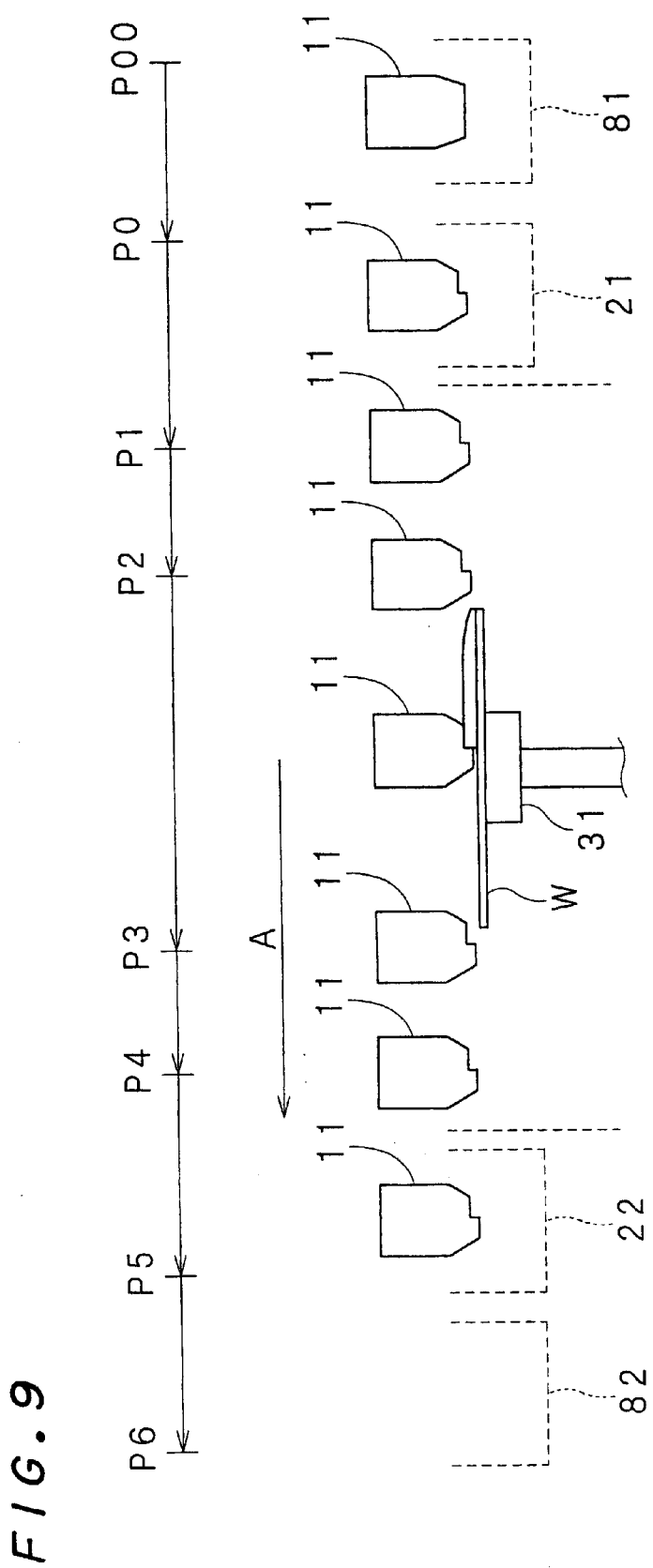
FIG. 9 is a sectional view showing scanning of the developer discharge nozzle on a substrate.
Figure 10:
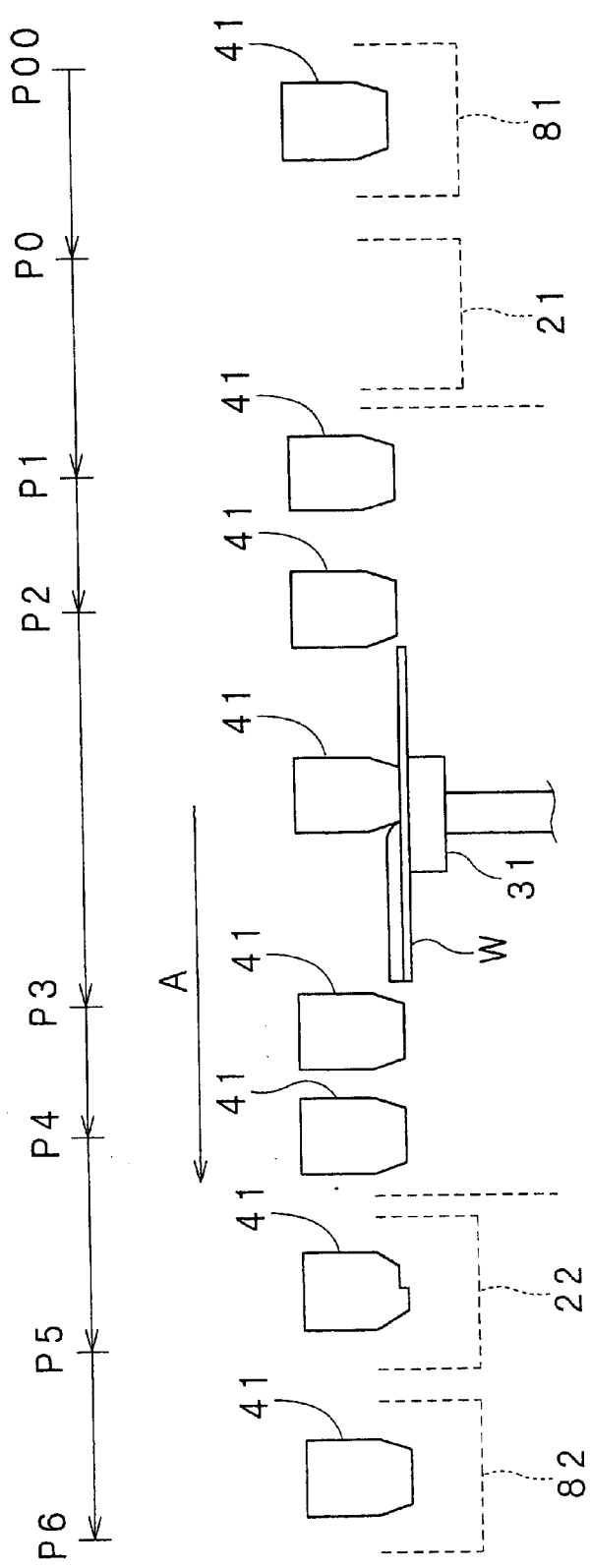
FIG. 10 is a sectional view showing scanning of the rinse discharge nozzle on the substrate.

Operations of the substrate developing apparatus according to this embodiment having the aforementioned structure are now described with reference to FIGS. 9 and 10. The suction chuck 31 horizontally holds the substrate W in a stationary state through a series of processing.

Before heaping the developer on the substrate W, the developer discharge nozzle 11 stands by on a position P0 in the standby pot 21. In order to heap the developer on the substrate W, the developer discharge nozzle 11 rises, thereafter moves toward the scanning direction A and lowers on a scanning start position P1 in the outer cup 50 (see FIG. 9).

Thereafter the developer discharge nozzle 11 starts scanning along the scanning direction A toward the substrate W from the scanning start position P1 at a prescribed scanning rate. At this point of time, the developer discharge nozzle 11 discharges no developer. According to this embodiment, the scanning rate is set to 10 to 500 mm/sec.

After starting scanning, the developer discharge nozzle 11 starts discharging the developer on a position P2 at a prescribed flow rate before the slit discharge port 15 (see FIG. 5) thereof reaches the substrate W. According to this embodiment, the flow rate of the developer is set to 1.5 L/min.

The developer discharge nozzle 11 linearly continuously moves along the scanning direction A while discharging the developer, reaches the developer supply start position on the first end of the substrate W and starts supplying the developer to the substrate W. The developer discharge nozzle 11 further continuously moves on the substrate W along the scanning direction A, continuously supplies the developer, reaches the developer supply end position on the second end of the substrate W and completes heaping the developer on the overall surface of the substrate W. The supplied developer is held on the substrate W by surface tension.

After passing through the substrate W, the developer discharge nozzle 11 stops discharging the developer on a position P3 out of the substrate W. The developer discharge nozzle 11 stops scanning when reaching a scanning stop position P4 in the outer cup 50. Thereafter the developer discharge nozzle 11 rises on the scanning stop position P4, thereafter moves to a position P5 of the standby pot 22, and lowers in the standby pot 22.

Thus, the developer discharge nozzle 11 heaps the developer on the substrate W, which in turn is held for a while to be developed. After a lapse of a prescribed time, the rinse discharge nozzle 41 performs rinsing. Also in this rinsing, the suction chuck 31 horizontally holds the substrate W in the stationary state. Before supplying the rinse onto the substrate W, the rinse discharge nozzle 41 stands by on a position P00 in the standby pot 81. In order to supply the pure water to the substrate W as the rinse, the rinse discharge nozzle 41 rises, thereafter moves along the scanning direction A and lowers on the scanning start position P1 in the outer cup 50 (see FIG. 10).

Thereafter the rinse discharge nozzle 41 starts scanning along the scanning direction A toward the substrate W from the scanning start position P1 at a prescribed scanning rate. At this point of time, the rinse discharge nozzle 41 discharges no pure water. According to this embodiment, the scanning rate is set to 10 to 500 mm/sec. similarly to that of the developer discharge nozzle 11.

After starting scanning, the rinse discharge nozzle 41 starts discharging the rinse on the position P2 at a prescribed flow rate before the slit discharge port 49 (see FIG. 6) thereof reaches the substrate W. According to this embodiment, the flow rate of the rinse is set to 1.5 L/min.

The rinse discharge nozzle 41 continuously linearly moves along the scanning direction A while discharging the pure water, reaches the developer supply start position on the first end of the substrate W, starts supplying the pure water to the substrate W from the slit discharge port 49 and starts replacing the developer with the pure water on the surface of the substrate W. The rinse discharge nozzle 41 starts sucking the pure water from the slit suction port 51 (see FIG. 6) immediately before the slit suction port 51 reaches the developer supply start position on the first end of the substrate W. The rinse discharge nozzle 41 further moves on the substrate W along the scanning direction A. Then, the slit suction port 51 reaches the developer supply start position on the first end of the substrate W and starts sucking and recovering the pure water previously supplied as the rinse to the surface of the substrate W from the slit discharge port 49.

The rinse discharge nozzle 41 further continuously moves along the scanning direction A, for continuously supplying the pure water from the slit discharge port 49 while sucking and recovering the pure water from the surface of the substrate W through the slit suction port 51. When reaching the developer supply end position on the second end of the substrate W, the rinse discharge nozzle 41 completes supplying the rinse to the overall surface of the substrate W from the slit discharge port 49, temporarily replaces the developer with the pure water on the surface of the substrate W and sucks and completely sucks and recovers the pure water supplied to the surface of the substrate W through the slit suction port 51.

After passing through the substrate W, the rinse discharge nozzle 41 stops discharging the pure water from the slit discharge port 49 on the position P3 out of the substrate W and stops sucking the pure water from the slit suction port 51. The rinse discharge nozzle 41 stops scanning when reaching a scanning stop position P4 in the outer cup 50. Thereafter the rinse discharge nozzle 41 rises on the scanning stop position P4, moves to a position P6 of the standby pot 82, and lowers in the standby pot 82.

The substrate developing apparatus according to this embodiment completes a series of development including supply of the developer to the substrate W, supply of the rinse and removal of the rinse. The substrate developing apparatus can repetitively perform the aforementioned operations at need.

Thus, the substrate developing apparatus according to this embodiment can supply the developer to the substrate W, supply the rinse to and recover the rinse from the substrate W while keeping the substrate W in the stationary state, whereby neither the developer nor the rinse is drained by centrifugal force to splash back from the periphery, re-adheres to the surface or the back surface of the substrate W and contaminates the substrate W dissimilarly to the case of rotating the substrate W at a high speed but the series of development on the substrate W can be cleanly performed without contaminating the substrate W. Further, the substrate developing apparatus according to this embodiment can supply the developer to the substrate W, supply the rinse to and recover the rinse from the substrate W while keeping the substrate W in the stationary state, whereby no pattern collapse is caused dissimilarly to the case of rotating the substrate W at a high speed.

In the substrate developing apparatus according to this embodiment, the developer discharge nozzle 11 and the rinse discharge nozzle 41 having the discharge widths at least equivalent to the diameter of the substrate W supply the developer and the rinse from the slit discharge ports 15 and 49 respectively while moving in the same direction (the scanning direction A), whereby the time (developing time) bringing respective portions in the surface of the substrate W into contact with the developer is so uniformalized that the overall surface of the substrate W can be uniformly developed and pattern line width uniformity can be improved.

In the substrate developing apparatus according to this embodiment, in addition, the single rinse discharge nozzle 41 is provided with the slit discharge port 49 discharging the pure water as the rinse and the slit suction port 51 sucking and recovering the pure water, whereby the rinse can be supplied to and recovered from the substrate W with slight time difference, for improving the throughput of the series of development.

In this embodiment, the suction chuck 31 corresponds to the substrate holding part in claim 1, the developer discharge nozzle 11 corresponds to the developer supplying moving element in claim 1, and the rinse discharge nozzle 41 corresponds to the rinse supplying moving element in claim 1.

<Second Embodiment>

Figure 11:
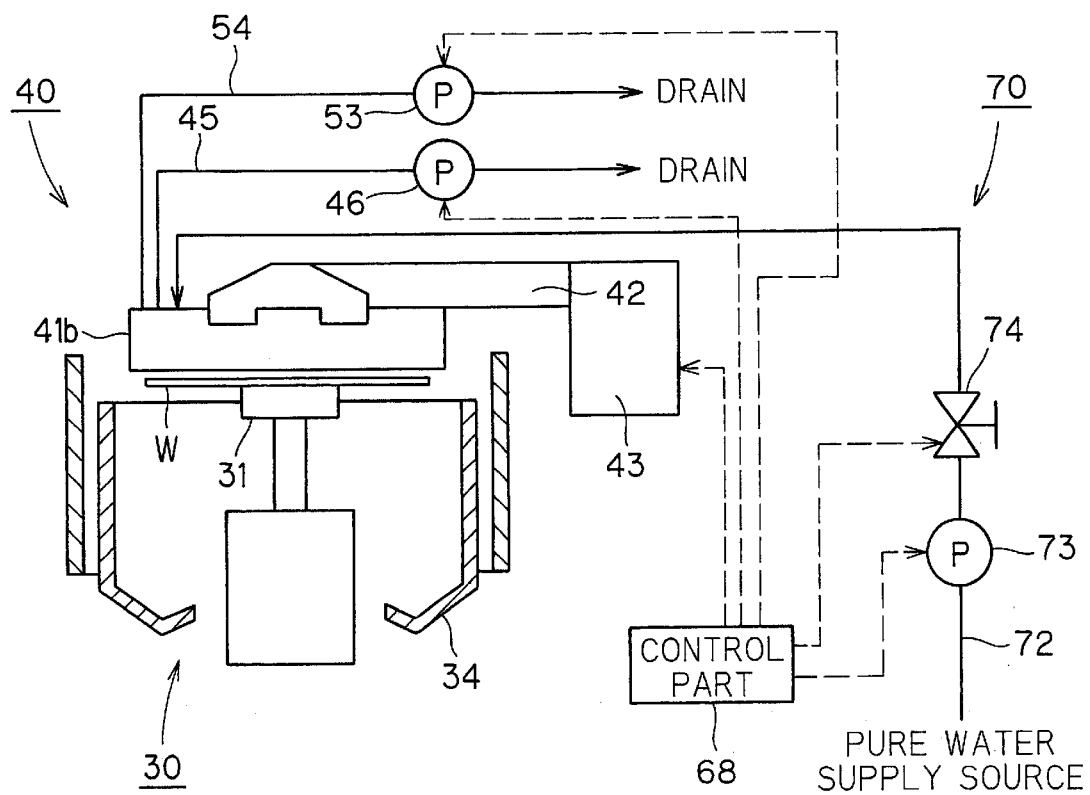
FIG. 11 is a sectional view of a principal part of a substrate developing apparatus according to a second embodiment of the present invention taken along a line X—X.

A second embodiment of the present invention is now described with reference to FIGS. 11, 12 and 13. The second embodiment is different from the first embodiment in a point that a rinse discharge nozzle 41b is formed with a slit suction port 52b sucking and recovering a developer while the slit suction port 52b communicates with a pipe 54 having a suction pump 53 interposed in an intermediate portion thereof for sucking and recovering the developer (see FIGS. 11, 12 and 13). The remaining points of the second embodiment are identical to those of the first embodiment, and hence identical reference numerals are employed for omitting redundant description.

Figure 12:
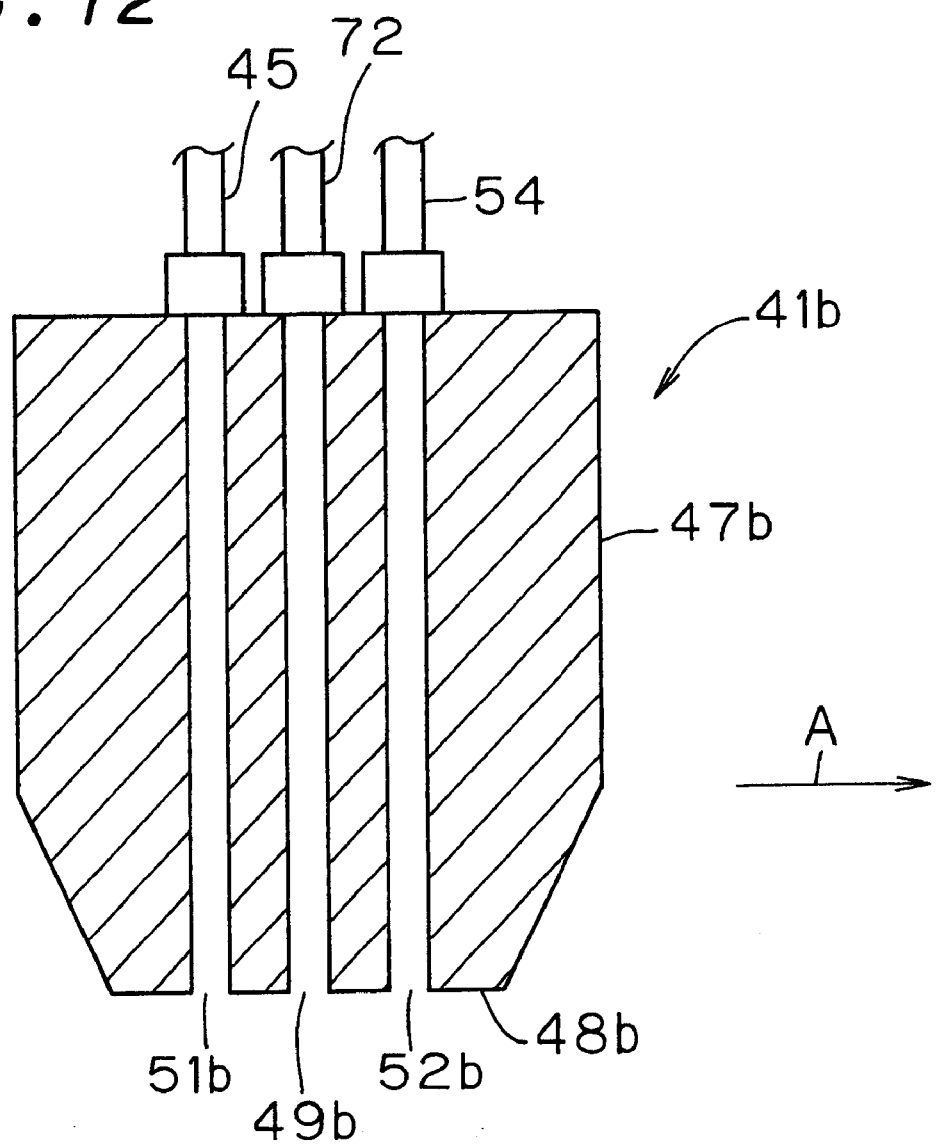
FIG. 12 is a sectional view of a rinse supply nozzle according to the second embodiment of the present invention.

FIG. 12 is a sectional view of the rinse discharge nozzle 41b according to the second embodiment.

A nozzle body part 47b of the rinse discharge nozzle 41b is formed on its bottom surface 48b with the slit suction port 52b vertically downwardly extending on a front position of the bottom surface 48b beyond a slit suction port 49b discharging pure water as a rinse along a direction of movement toward a scanning direction A and opening on the bottom surface 48b. The slit suction port 52b communicates with the pipe 54 driven by a suction pump 53, for sucking and recovering the developer previously heaped on the surface of a substrate W through the pipe 54. The slit discharge port 49b is structured similarly to the aforementioned slit discharge port 49.

Figure 13:
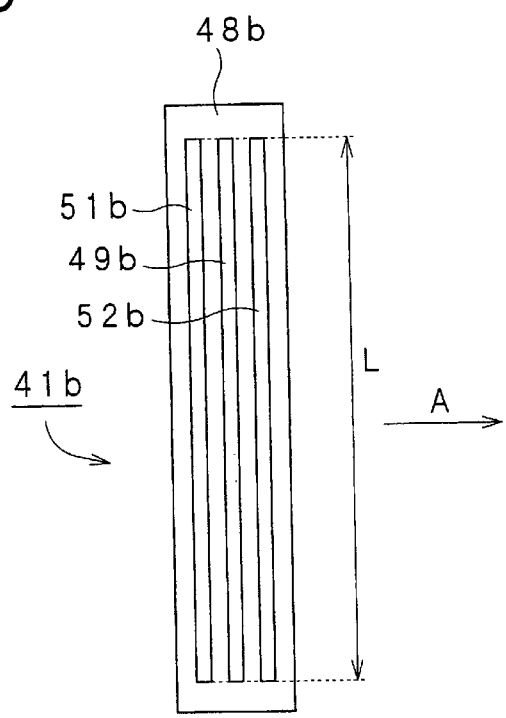
FIG. 13 is a bottom plan view of the rinse supply nozzle according to the second embodiment of the present invention.

As shown in FIG. 13, the longitudinal suction width direction of the slit suction port 52b formed on the bottom surface 48b of the rinse discharge nozzle 41b is also arranged vertically to the scanning direction A of the rinse discharge nozzle 41b. The longitudinal suction width L of the slit suction port 52b is set identical to or larger than (at least equivalent to) the diameter of the substrate W to be processed, and is set to 210 mm according to this embodiment in order to process the substrate W of eight inches in diameter.

According to this structure, the rinse discharge nozzle 41b moves along the scanning direction A after a developer discharge nozzle 11 heaps the developer on the substrate W, to be capable of sucking and recovering the developer from the substrate W through the slit suction port 52b formed on its bottom surface 48b before supplying the pure water as the rinse, supplying the pure water to portions having no developer from the slit discharge port 49b and successively replacing the developer with the pure water following movement of the rinse discharge nozzle 41b. Further, it is possible to successively suck and recover the pure water supplied from the slit discharge port 49b to the substrate W following movement of the rinse discharge nozzle 41b so that no solution remains on the substrate W. The slit suction port 51b of the rinse discharge nozzle 41b is identical in structure to the aforementioned slit suction port 51.

According to the second embodiment, the developer heaped on the substrate W is also recovered so that the pure water is supplied as the rinse in a state leaving no developer, whereby the pure water can be prevented from being mixed with the developer and causing uneven development in the surface of the substrate W.

<Third Embodiment>

A substrate developing apparatus according to a third embodiment of the present invention is now described with reference to FIGS. 14 to 18. The substrate developing apparatus according to the third embodiment is different from those of the aforementioned first and second embodiments in a point that a developer discharge nozzle and a rinse discharge nozzle are integrated for reciprocating on a substrate W, supplying and recovering a developer to and from the substrate W and supplying and recovering a rinse to and from the substrate W and a point that only a single nozzle standby pot is provided on either end of a processing part 30. Parts similar to those in the first and second embodiments are denoted by the same reference numerals, to partially omit redundant description.

Figure 14:
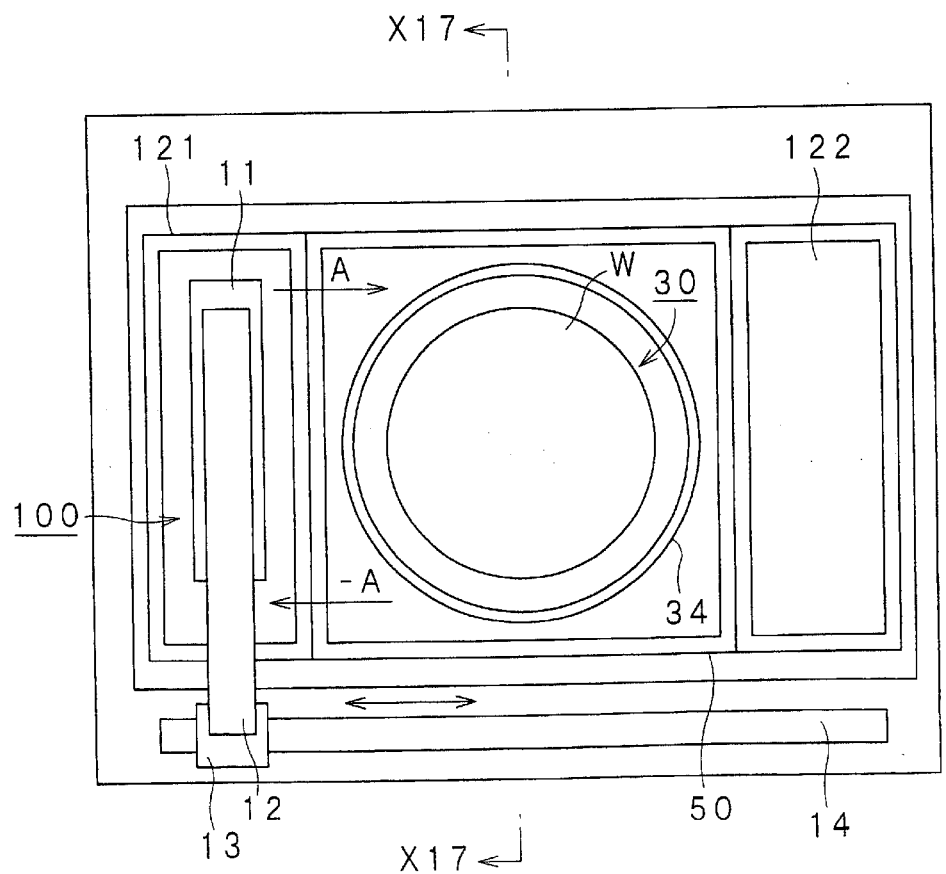
FIG. 14 is a plan view of a substrate developing apparatus according to a third embodiment of the present invention.

As shown in FIG. 14, the substrate developing apparatus according to the third embodiment comprises a developer/rinse discharge unit 100, an outer cup 50 comprising the processing part 30, a nozzle standby pot 121 provided on a first end of the outer cup 50 and a nozzle standby pot 122 provided on a second end of the outer cup 50. Referring to FIG. 14, a guide rail 14 is arranged under the outer cup 50 so that a nozzle arm 12 forming the developer/rinse discharge unit 100 as described later is movable along the guide rail 14 in a scanning direction A and an opposite direction −A by an arm driving part 13.

Figure 17:
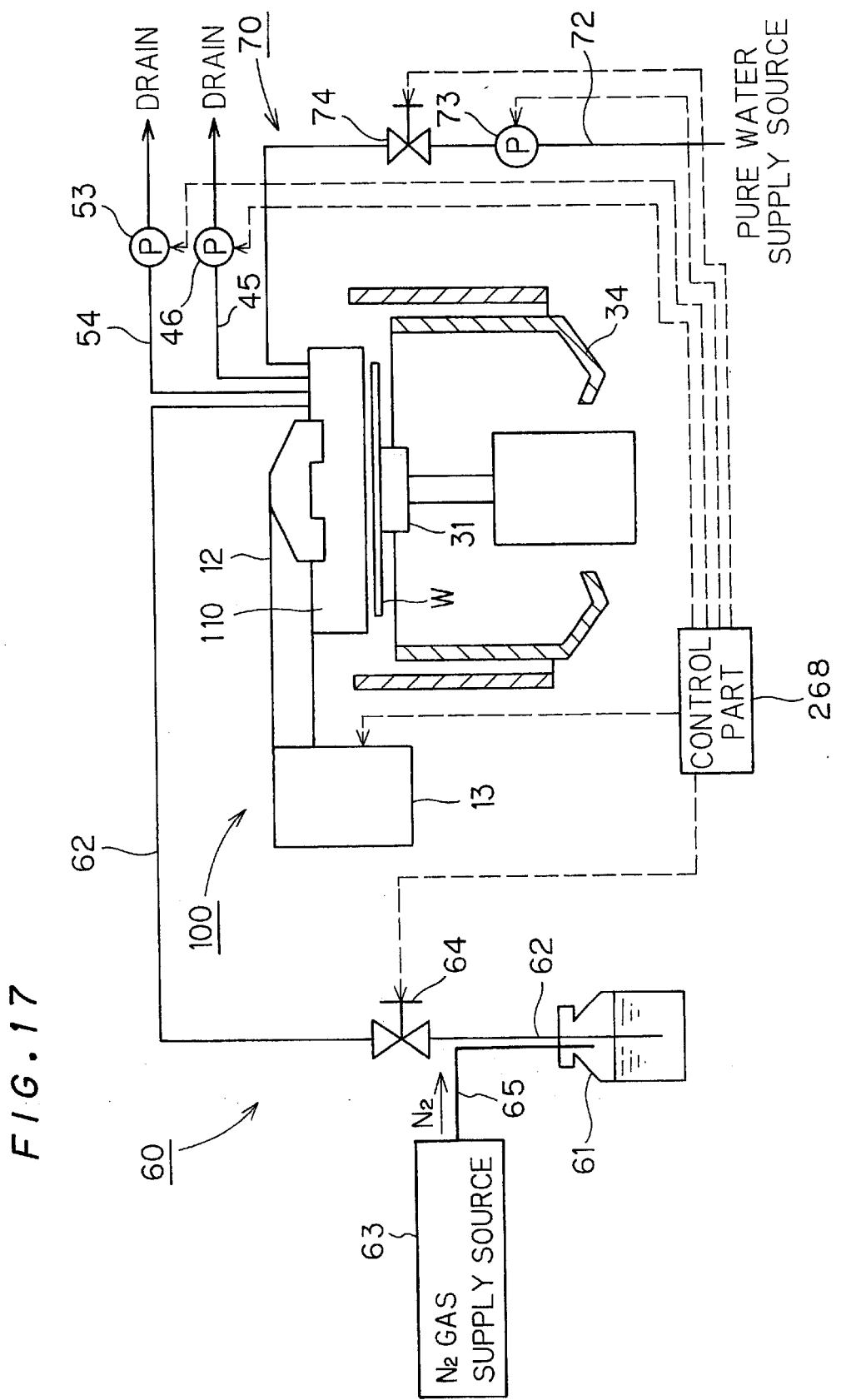
FIG. 17 is a sectional view of a principal part of the substrate developing apparatus taken along the line X17—X17 in FIG. 14.

As shown in FIG. 17, the developer/rinse discharge unit 100 comprises the nozzle arm 12 and a developer/rinse discharge nozzle 110 provided on the lower end of the nozzle arm 12. The developer/rinse discharge nozzle 110 stands by in the nozzle standby pot 121 provided on the first end of the processing part 30 before starting discharging the developer while going out from the nozzle standby pot 121 and moving on the substrate W held by a suction chuck 31 due to the nozzle arm 12 moving along the guide rail 14 by the arm driving part 13 for linearly moving to the nozzle standby pot 122 provided on the second end of the processing part 30 along the scanning direction A in order to supply the developer onto the substrate W in practice (see FIGS. 14 and 17).

As shown in FIG. 17, the developer supply source system 60 supplies the developer to the developer/rinse discharge nozzle 110. The developer supply source system 60 is formed by the solution storage part 61 storing the developer, the pipe 62 communicatively connecting the solution storage part 61 and the developer/rinse discharge nozzle 110 with each other, the $N_2$ gas supply source 63 supplying an $N_2$ gas to the solution storage part 61 through the pipe 65 for feeding the developer from the solution storage part 61 to the developer/rinse discharge nozzle 110 and the on-off valve 64 interposed in the pipe 62.

As shown in FIG. 17, a rinse supply source system 70 supplies pure water to the developer/rinse discharge nozzle 110 as the rinse. The rinse supply source system 70 is formed by a pipe 72 guiding the pure water supplied from a pure water supply source serving as utility to the developer/rinse discharge nozzle 110, a pump 73 interposed in the pipe 72 for feeding the pure water to the developer/rinse discharge nozzle 110 and an on-off valve 74 interposed in the pipe 72.

The developer/rinse discharge nozzle 110 is connected with a suction pipe 45 having a suction pipe 46 interposed in an intermediate portion thereof, for sucking and recovering the pure water supplied onto the substrate W through a slit suction port 151 formed on the bottom surface of the developer/rinse discharge nozzle 110 as described later and discharging the same to a drain due to driving of the suction pump 46.

The developer/rinse discharge nozzle 110 is further connected with a suction pipe 54 having a suction pipe 53 interposed in an intermediate portion thereof, for sucking and recovering the developer supplied onto the substrate W through a suction port 152 formed on the bottom surface of the developer/rinse discharge nozzle 110 as described later and discharging the same to a drain due to driving of the suction pump 53.

A control part 268 formed by a microcomputer is electrically connected to the arm driving part 13, the on-off valve 64, the $N_2$ gas supply source 63, the on-off valve 74, the pump 73, the suction pump 46 and the suction pump 53 for controlling discharge conditions such as a timing for reciprocative scanning (movement) of the developer/rinse discharge nozzle 110 along the guide rail 14 by the arm driving part 13, timings for starting and stopping discharging the developer and the pure water serving as the rinse from the developer/rinse discharge nozzle 110 by the on-off valves 64 and 74, the quantities and speeds for discharging the developer and the pure water and the like, suction timings of the suction pumps 46 and 53 for the pure water serving as the rinse and the developer and the like.

Figure 15:
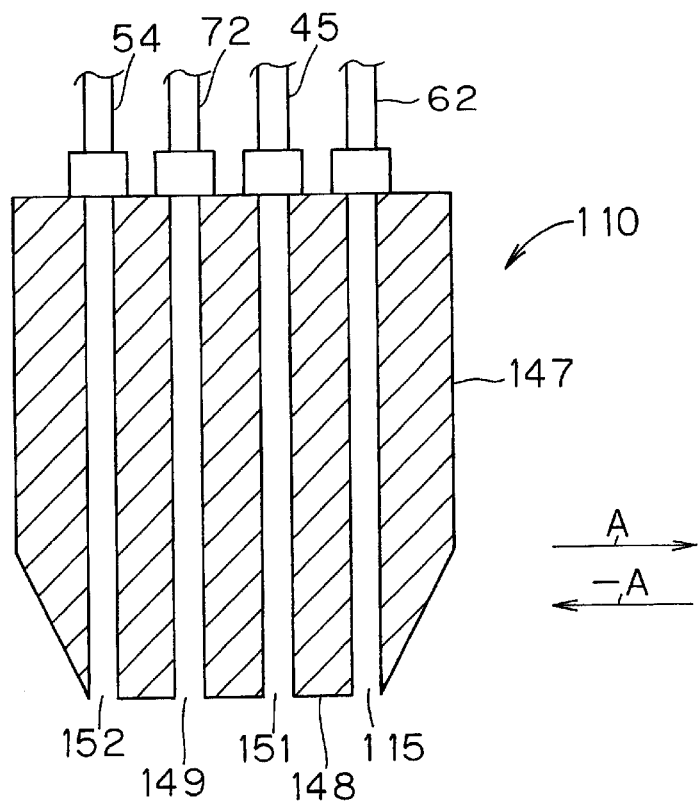
FIG. 15 is a sectional view of a developer/rinse discharge nozzle according to the third embodiment of the present invention.

As shown in FIG. 15, a nozzle body part 147 of the developer/rinse discharge nozzle 110 has a bottom surface 148. This nozzle body part 147 is formed with a slit discharge port 115 serving as a developer discharge port vertically downwardly extending on the frontmost row of the bottom surface 148 in the direction of forward movement toward the scanning direction A and opening on the bottom surface 148, a similar slit suction port 151 corresponding to a rinse suction port on the second row, a slit suction port 149 serving as a rinse discharge port on the third row and a slit suction port 152 serving as a developer suction port on the fourth row (rearmost row) respectively. The slit discharge port 115 communicates with the pipe 62, for supplying the developer guided through the pipe 62 to the substrate W as the rinse in forward movement of the developer/rinse discharge nozzle 110 as described later. The slit discharge port 149 communicates with the pipe 72, for supplying the pure water guided by the pipe 72 toward the substrate W as the rinse in backward movement of the developer/rinse discharge nozzle 110 as described later. The slit suction port 152 communicates with the pipe 54, for sucking and recovering the developer heaped on the substrate W in the backward movement of the developer/rinse discharge nozzle 110 as described later. The slit suction port 151 communicates with the pipe 45, for sucking and recovering the pure water serving as the rinse from the substrate W in the backward movement of the developer/rinse discharge nozzle 110. In the backward movement of the developer/rinse discharge nozzle 110, the slit suction port 152 sucking and recovering the developer is arranged in front of the slit discharge port 149 supplying the rinse in the direction of movement (the direction −A) while the slit discharge port 149 is located in front of the slit suction port 151 sucking and recovering the rinse in the direction of movement (the direction −A).

Figure 16:
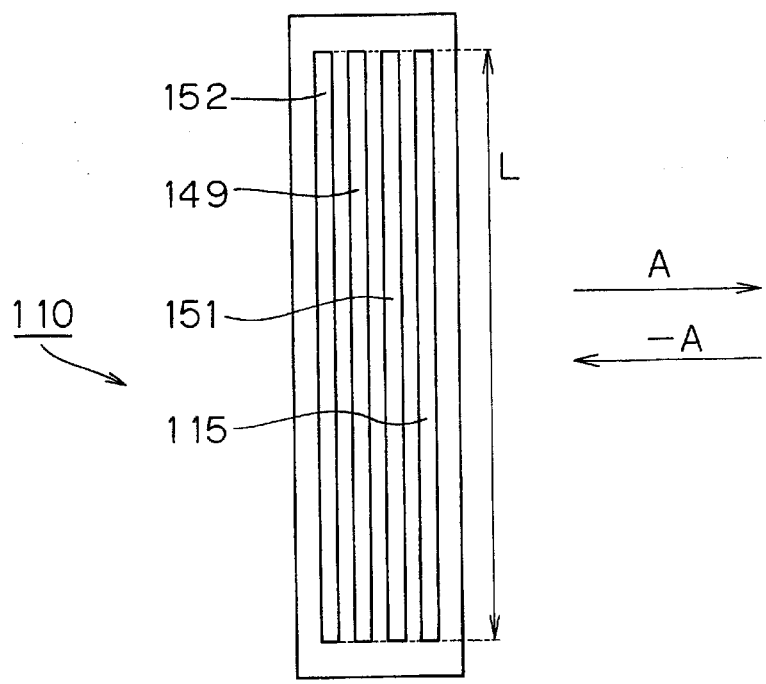
FIG. 16 is a bottom plan view of the developer/rinse discharge nozzle according to the third embodiment of the present invention.

As shown in FIG. 16, the longitudinal discharge width directions of the slit discharge ports 115 and 149 of the developer/rinse discharge nozzle 110 are arranged perpendicularly to the scanning direction A of the developer discharge nozzle 110. The lengths of shorter sides t of the slit discharge ports 115 and 149 are 0.05 to 1.00 mm, and set to 0.1 mm in this embodiment. The longitudinal discharge widths L of the slit discharge ports 115 and 149 are set identical to or larger than (at least equivalent to) the diameter of the substrate W to be processed, and set to 210 mm in this embodiment in order to process the substrate W of eight inches in diameter.

The vertical suction width directions of the slit suction ports 151 and 152 formed on the bottom surface 148 of the developer/rinse discharge nozzle 110 are also arranged perpendicularly to the scanning direction A of the developer discharge nozzle 110. The longitudinal suction widths L of the slit suction ports 151 and 152 are also set identical to or larger than (at least equivalent to) the diameter of the substrate W to be processed, and set to 210 mm in this embodiment in order to process the substrate W of eight inches in diameter.

The developer/rinse discharge nozzle 110 scans along the forward scanning direction A or the backward scanning direction −A keeping the bottom surface 148 parallel to the surface of the substrate W. The intervals between the slit discharge ports 115 and 149 and the slit suction ports 151 and 152 and the surface of the substrate W are 0.2 to 5.0 mm, more preferably 0.5 mm to 2.0 mm, and set to 1.0 mm in this embodiment.

Figure 18:
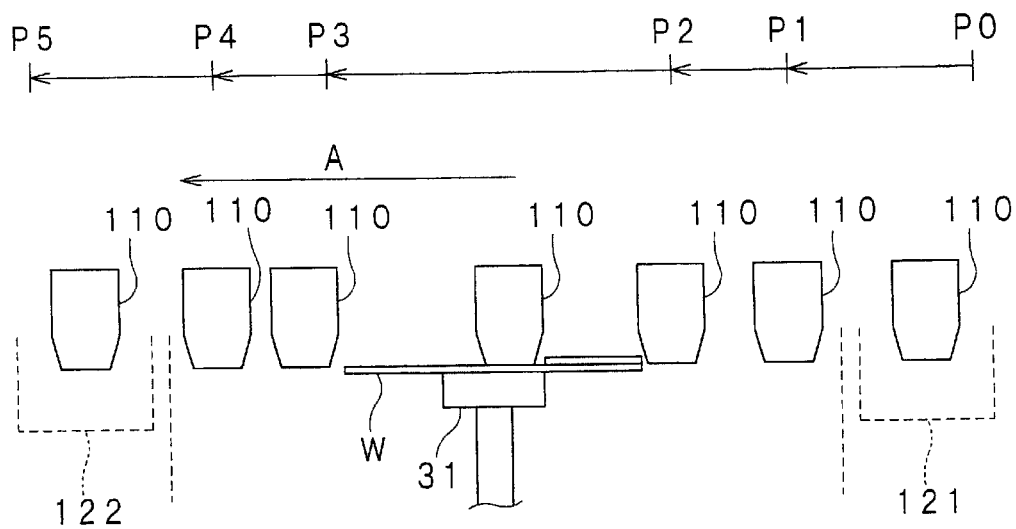
FIG. 18 is a sectional view showing forward scanning of the developer/rinse discharge nozzle according to the third embodiment of the present invention.
Figure 19:
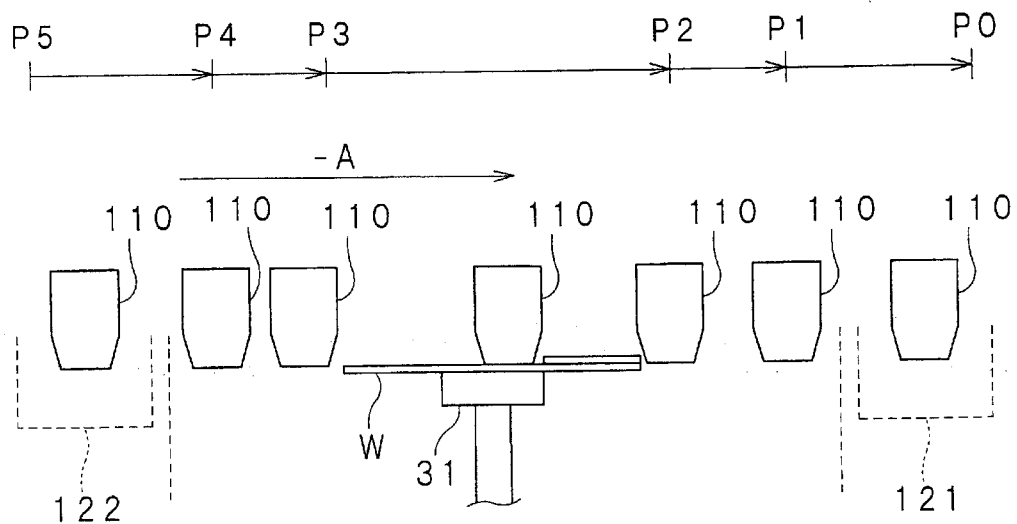
FIG. 19 is a sectional view showing backward scanning of the developer/rinse discharge nozzle according to the third embodiment of the present invention.

Operations of the substrate developing apparatus according to this embodiment having the aforementioned structure are now described with reference to FIGS. 18 and 19. The suction chuck 31 horizontally holds the substrate W in a stationary state through a series of processing.

Before heaping the developer on the substrate W, the developer/rinse discharge nozzle 110 stands by on a position P0 in the standby pot 121. In order to heap the developer on the substrate W, the developer/rinse discharge nozzle 110 rises, thereafter moves toward the scanning direction A and lowers on a scanning start position P1 in the outer cup 50 (see FIG. 18).

Thereafter the developer/rinse discharge nozzle 110 starts scanning, i.e., forward movement along the scanning direction A toward the substrate W from a scanning start position P1 at a prescribed scanning rate. At this point of time, the developer/rinse discharge nozzle 110 discharges no developer. According to this embodiment, the scanning rate is set to 10 to 500 mm/sec.

After starting scanning, the developer/rinse discharge nozzle 110 starts discharging the developer on a position P2 at a prescribed flow rate before the slit discharge port 115 (see FIG. 15) thereof reaches the substrate W. According to this embodiment, the flow rate of the developer is set to 1.5 L/min.

The developer/rinse discharge nozzle 110 linearly continuously moves along the scanning direction A while discharging the developer, reaches a developer supply start position on a first end of the substrate W and starts supplying the developer to the substrate W. The developer/rinse discharge nozzle 110 further continuously moves on the substrate W along the scanning direction A, continuously supplies the developer, reaches a developer supply end position on a second end of the substrate W and completes heaping the developer on the overall surface of the substrate W. The supplied developer is held on the substrate W by surface tension.

After passing through the substrate W, the developer/rinse discharge nozzle 110 stops discharging the developer on a position P3 out of the substrate W. The developer/rinse discharge nozzle 110 stops scanning when reaching a scanning stop position P4 in the outer cup 50. Thereafter the developer/rinse discharge nozzle 110 rises on the scanning stop position P4, thereafter moves to a position P5 of the standby pot 122, and lowers in the standby pot 122.

Thus, the developer/rinse discharge nozzle 110 heaps the developer on the substrate W, which in turn is held for a while to be developed. After a lapse of a prescribed time, the developer/rinse discharge nozzle 110 performs rinsing while performing scanning, i.e., backward movement in the direction −A opposite to that for supplying the developer, as shown in FIG. 19. Also in this rinsing, the suction chuck 31 horizontally holds the substrate W in the stationary state. Before supplying the rinse onto the substrate W, the developer/rinse discharge nozzle 110 stands by on a position P5 in the standby pot 122. In order to supply the pure water to the substrate W as the rinse, the developer/rinse discharge nozzle 110 rises, thereafter moves along the scanning direction −A and lowers on a scanning start position P4 in the outer cup 50 (see FIG. 19).

Thereafter the developer/rinse discharge nozzle 110 starts scanning, i.e., backward movement along the scanning direction −A toward the substrate W from the scanning start position P4 at a prescribed scanning rate. At this point of time, the developer/rinse discharge nozzle 110 discharges no pure water. According to this embodiment, the scanning rate is set to 10 to 500 mm/sec. similarly to that for supplying the developer.

After starting scanning, the developer/rinse discharge nozzle 110 starts suction through the slit suction ports 152 and 151 on the position P3 before the slit suction port 152 (see FIG. 15) thereof reaches the substrate W while discharging the rinse through the slit discharge port 149 at a prescribed flow rate.

The developer/rinse discharge nozzle 110 continuously linearly moves along the scanning direction −A while performing suction and discharging the pure water. When the slit suction port 152 reaches the developer supply end position on the second end of the substrate W, the developer/rinse discharge nozzle 110 starts sucking and recovering the developer heaped on the surface of the substrate W through the slit suction port 152. When further scanning in the direction −A so that the slit discharge port 149 reaches the developer supply end position on the second end of the substrate W, the developer/rinse discharge nozzle 110 starts supplying the pure water onto the substrate W through the slit discharge port 149 on a region where the developer is recovered through the slit suction port 152, and starts replacing the developer with the pure water on the surface of the substrate W. The developer/rinse discharge nozzle 110 further continuously moves on the substrate W in the direction −A. Then, the slit suction port 151 reaches the developer supply end position on the second end of the substrate W, and starts sucking and recovering the pure water previously supplied to the surface of the substrate W from the slit discharge port 149.

The developer/rinse discharge nozzle 110 further continuously moves in the scanning direction −A, continuously supplies the pure water through the slit discharge port 149 while sucking and recovering the developer from the surface of the substrate W through the slit suction port 152 and sucks and recovers the pure water supplied to the surface of the substrate W from the slit suction port 151. When reaching the developer supply end position on the second end of the substrate W, the developer/rinse discharge nozzle 110 completes suction/recovery of the developer from the slit suction port 152 as well as supply of the rinse to the overall surface of the substrate W from the slit discharge port 149, temporarily replaces the developer with the pure water on the surface of the substrate W and completely recovers the pure water supplied to the surface of the substrate W through the slit suction port 151.

After passing through the substrate W, the developer/rinse discharge nozzle 110 stops discharging the pure water from the slit discharge port 149 on the position P2 out of the substrate W while stopping suction through the slit suction ports 152 and 151. When reaching the scanning stop position P1 in the outer cup 50, the developer/rinse discharge nozzle 110 stops scanning. Thereafter the developer/rinse discharge nozzle 110 rises on the scanning stop position P1, moves to the position P0 of the standby pot 121, and lowers in the standby pot 121.

The substrate developing apparatus according to this embodiment completes a series of development including supply of the developer to the substrate W, supply of the rinse and removal of the rinse. The substrate developing apparatus can repetitively perform the aforementioned operations at need.

Thus, the substrate developing apparatus according to this embodiment can supply the developer to the substrate W, supply the rinse to and recover the rinse from the substrate W while keeping the substrate W in the stationary state, whereby neither the developer nor the rinse is drained by centrifugal force to splash back from the periphery, re-adheres to the surface or the back surface of the substrate W and contaminates the substrate W dissimilarly to the case of rotating the substrate W at a high speed but the series of development on the substrate W can be cleanly performed without contaminating the substrate W. Further, the substrate developing apparatus according to this embodiment can supply the developer to the substrate W, supply the rinse to and recover the rinse from the substrate W while keeping the substrate W in the stationary state, whereby no pattern collapse is caused dissimilarly to the case of rotating the substrate W at a high speed.

In the substrate developing apparatus according to this embodiment, the slit discharge port 149 discharging the pure water as the rinse and the slit suction port 151 sucking and recovering the pure water are provided on the single developer/rinse discharge nozzle 110, whereby the rinse can be supplied to and recovered from the substrate W with slight time difference, for improving the throughput of the series of development.

According to the third embodiment, the developer heaped on the substrate W is also recovered so that the pure water is supplied as the rinse in a state leaving no developer, whereby the pure water can be prevented from being mixed with the developer and causing uneven development in the surface of the substrate W.

According to the third embodiment, further, the developer/rinse discharge nozzle 110 is formed with all of the slit discharge port 115 supplying the developer, the slit discharge port 149 supplying the rinse and the slit suction port 151 sucking and recovering the rinse, whereby no standby spaces are required for a developer discharge nozzle and a rinse discharge nozzle respectively but the apparatus can be miniaturized, for reducing the footprint.

The developer/rinse discharge nozzle 110 according to this embodiment corresponds to the solution supply element in claim 3.

<Fourth Embodiment>

Figure 20:
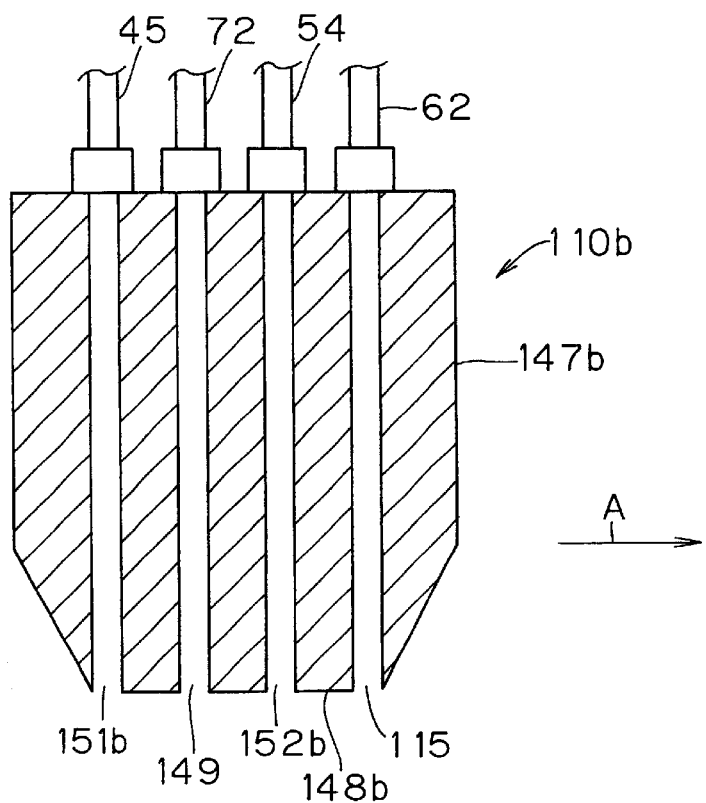
FIG. 20 is a sectional view of a developer/rinse discharge nozzle according to a fourth embodiment of the present invention.
Figure 21:
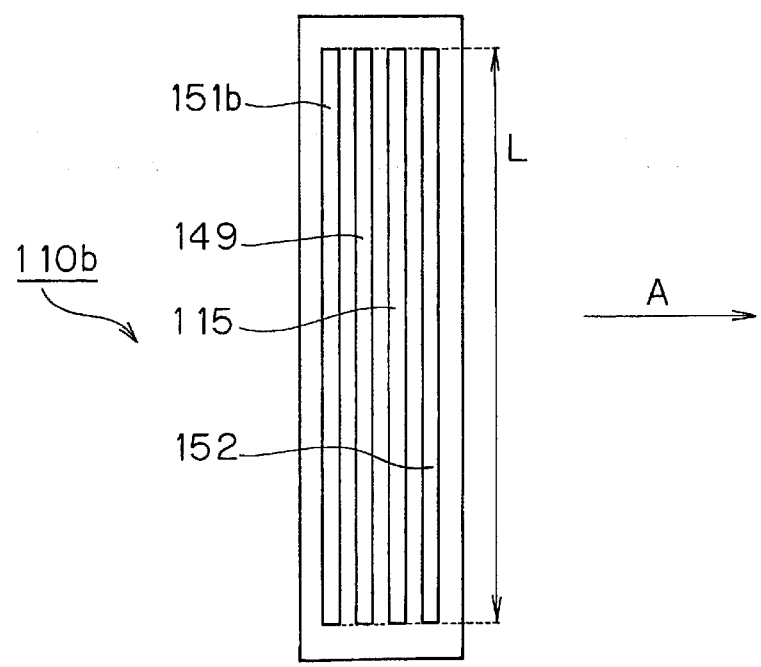
FIG. 21 is a bottom plan view of the developer/rinse discharge nozzle according to the fourth embodiment of the present invention.

A substrate developing apparatus according to a fourth embodiment of the present invention is now described. The substrate developing apparatus according to the fourth embodiment is different from that according to the aforementioned third embodiment in a point that slit suction ports 152b for sucking and recovering a developer and slit suction ports 151b for sucking and recovering a rinse formed on a bottom surface 148b of a nozzle body part 147b of a developer/rinse discharge nozzle 110b and a rinse respectively are in different positional relation and in a point that the developer/rinse discharge nozzle 110b repeats forward movement a plurality of times for supplying the developer or the rinse to a substrate W only when moving in a scanning direction A corresponding to the forward movement, as shown in FIGS. 20 an 21. In the forward movement of the developer/rinse discharge nozzle 110b, the slit suction port 152b corresponding to a developer suction port sucking and recovering the developer is arranged in front of a slit discharge port 149 corresponding to a rinse discharge port supplying the rinse along the direction of movement (the direction A) while the slit discharge port 149 is located in front of the slit suction port 151b corresponding to a rinse suction port sucking and recovering the rinse in the direction of movement (the direction A). The remaining structure of this embodiment is identical to that of the aforementioned third embodiment, and hence redundant description is omitted.

In the substrate developing apparatus according to the fourth embodiment having the aforementioned structure, the developer/rinse discharge nozzle 110b performs first forward movement along the scanning direction A and heaps the developer on a substrate W by an operation (see FIG. 18) similar to that of the aforementioned third embodiment. The developer/rinse discharge nozzle 110b temporarily moves from a standby pot 121 to a standby pot 122 before completely heaping the developer.

When the developer is completely heaped on the substrate W, development is performed while keeping this state for a while, and hence the developer/rinse discharge nozzle 110b moves to a vertical position not influencing the substrate W and backwardly moves in a direction −A opposite to the scanning direction A (the direction of forward movement) to return to the standby pot 121. After a lapse of a prescribed time required for development, the developer/rinse discharge nozzle 110b performs second forward movement along the scanning direction A by an operation similar to that shown in FIG. 18.

At this time, the developer/rinse discharge nozzle 110 moves from a developer supply start position on a first end of the substrate W to a developer supply end position on a second end, for continuously sucking and recovering the developer through the slit suction port 152b, continuously supplying the rinse to the substrate W through the slit discharge port 149 and continuously sucking and recovering the rinse through the slit suction port 151b, thereby completing a series of development including supply of the developer to the substrate W, recovery of the developer, supply of the rinse and recovery of the rinse. The developer/rinse discharge nozzle 110b can repetitively perform such operations at need.

In the substrate developing apparatus according to the fourth embodiment, effects similar to those of the apparatus according to the third embodiment can be attained, while the developer/rinse discharge nozzle 110b supplies the developer and the rinse from the slit discharge ports 115 and 149 having the discharge widths at least equivalent to the diameter of the substrate W while moving in the same direction of movement (the scanning direction A), whereby the time (developing time) bringing respective portions in the surface of the substrate W into contact with the developer is so uniformalized that the overall surface of the substrate W can be uniformly developed and pattern line width uniformity can be improved.

<Fifth Embodiment>

Figure 22:
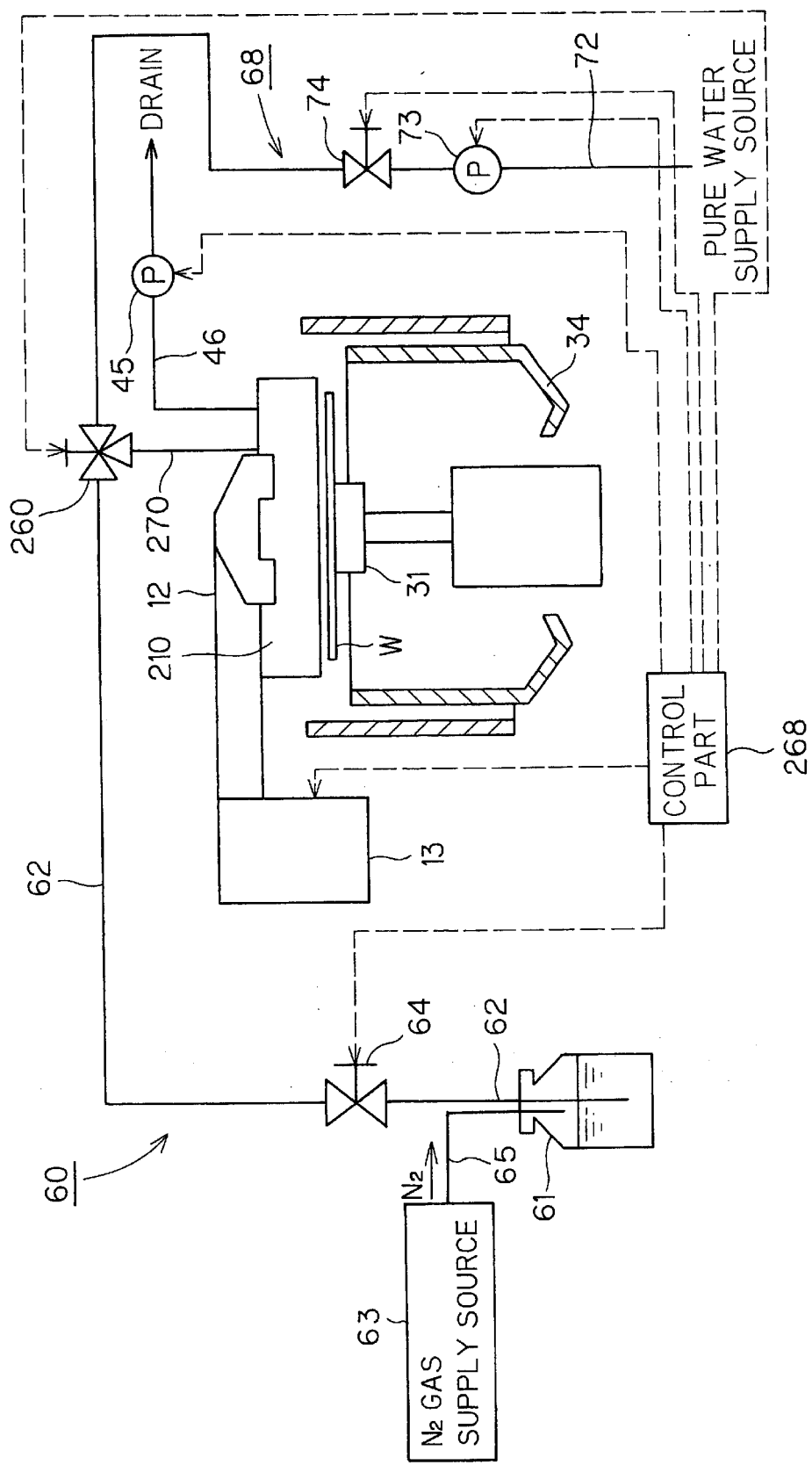
FIG. 22 is a sectional view of a principal part of a substrate developing apparatus according to a fifth embodiment of the present invention.
Figure 23:
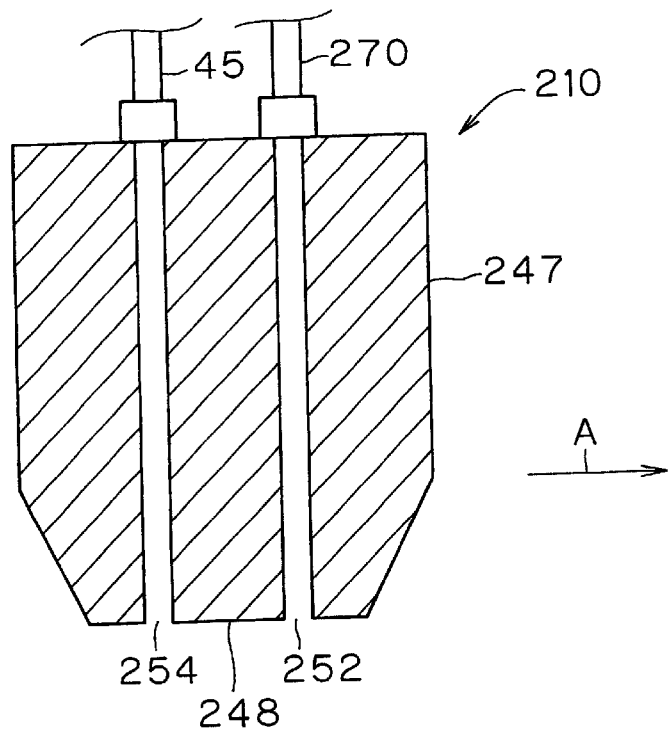
FIG. 23 is a sectional view of a developer/rinse discharge nozzle according to the fifth embodiment of the present invention.
Figure 24:
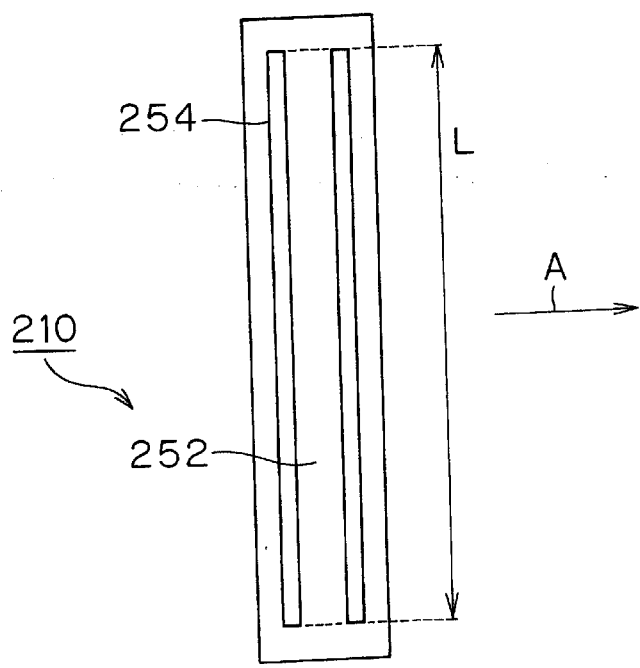
FIG. 24 is a bottom plan view of the developer/rinse discharge nozzle according to the fifth embodiment of the present invention.

A substrate developing apparatus according to a fifth embodiment of the present invention is now described with reference to FIGS. 22, 23 and 24. As shown in FIGS. 22, 23 and 24, the substrate developing apparatus according to the fifth embodiment is different from that according to the aforementioned third embodiment in a point that a bottom surface 248 of a nozzle body 247 of a developer/rinse discharge nozzle 210 is formed with only a slit discharge port 252 serving as a solution discharge port and a slit suction port 254 serving as a solution suction port having a discharge width and a suction width at least equivalent to the diameter of a substrate W respectively, in a point that pipes 62 and 72 guiding a developer and pure water serving as a rinse respectively are connected to a three-way valve 260 so that either the developer or the pure water is guided to the slit discharge port 252 of the developer/rinse discharge nozzle 210 through a pipe 270 by switching control by a control part 268 and in a point that the developer/rinse discharge nozzle 210 repeats forward movement a plurality of times for supplying the developer or the rinse to the substrate W only when moving along a scanning direction A corresponding to the direction of the forward movement. In the forward movement of the developer/rinse discharge nozzle 210, the slit discharge port 252 supplying the rinse is located in front of the slit suction port 254 sucking and recovering the rinse in the direction of movement (the scanning direction A). The remaining structure of the fifth embodiment is identical to that of the aforementioned third embodiment, and hence redundant description is omitted.

In the substrate developing apparatus according to the fifth embodiment having the aforementioned structure, the developer/rinse discharge nozzle 210 performs first forward movement along the scanning direction A by an operation (see FIG. 18) similar to that in the aforementioned third embodiment. At this time, the control part 268 switch-controls the three-way valve 260 so that the pipes 62 and 270 communicate with each other for supplying the developer from the slit discharge port 252 to the substrate W. The developer/rinse discharge nozzle 210 moves from a solution supply start position on a first end of the substrate W to a solution supply end position on a second end, thereby heaping the developer on the substrate W. The developer/rinse discharge nozzle 210 temporarily moves from a standby pot 121 to a standby pot 122 when completely heaping the developer.

When the developer is completely heaped on the substrate W, development is performed while keeping this state for a while, and hence the developer/rinse discharge nozzle 210 moves to a vertical position not influencing the substrate W and backwardly moves in a direction −A opposite to the scanning direction A (the direction of forward movement) to return to the standby pot 121. After a lapse of a prescribed time required for development, the developer/rinse discharge nozzle 210 performs second forward movement along the scanning direction A by an operation similar to that shown in FIG. 18.

At this time, the control part 268 switch-controls the three-way valve 260 so that the pipes 72 and 270 communicate with each other, for discharging the pure water serving as the rinse from the slit discharge port 252 of the developer/rinse discharge nozzle 210. The developer/rinse discharge nozzle 210 moves from the solution supply start position on the first end of the substrate W to the solution supply end position on the second end thereby continuously supplying the rinse to the substrate W from the slit discharge port 252 and sucking and recovering the rinse from the slit suction pot 254, for completing a series of development including supply of the developer to the substrate W, supply of the rinse and recovery of the rinse. The developer/rinse discharge nozzle 210 can repetitively perform these operations at need.

In the substrate developing apparatus according to the fifth embodiment, effects similar to those of the apparatus according to the third embodiment can be attained, while the developer/rinse discharge nozzle 210 supplies the developer and the rinse from the slit discharge port 252 having the discharge width at least equivalent to the diameter of the substrate W while moving in the same direction of movement (the scanning direction A), whereby the time (developing time) bringing respective portions in the surface of the substrate W into contact with the developer is so uniformalized that the overall surface of the substrate W can be uniformly developed and pattern line width uniformity can be improved.

According to the fifth embodiment, a pipeline can be simplified.

In the fifth embodiment, the developer/rinse discharge nozzle 210 corresponds to the solution supplying moving element in claim 7, and the three-way valve 260 and the control part 268 correspond to the switching control part.

<Sixth Embodiment>

Figure 25:
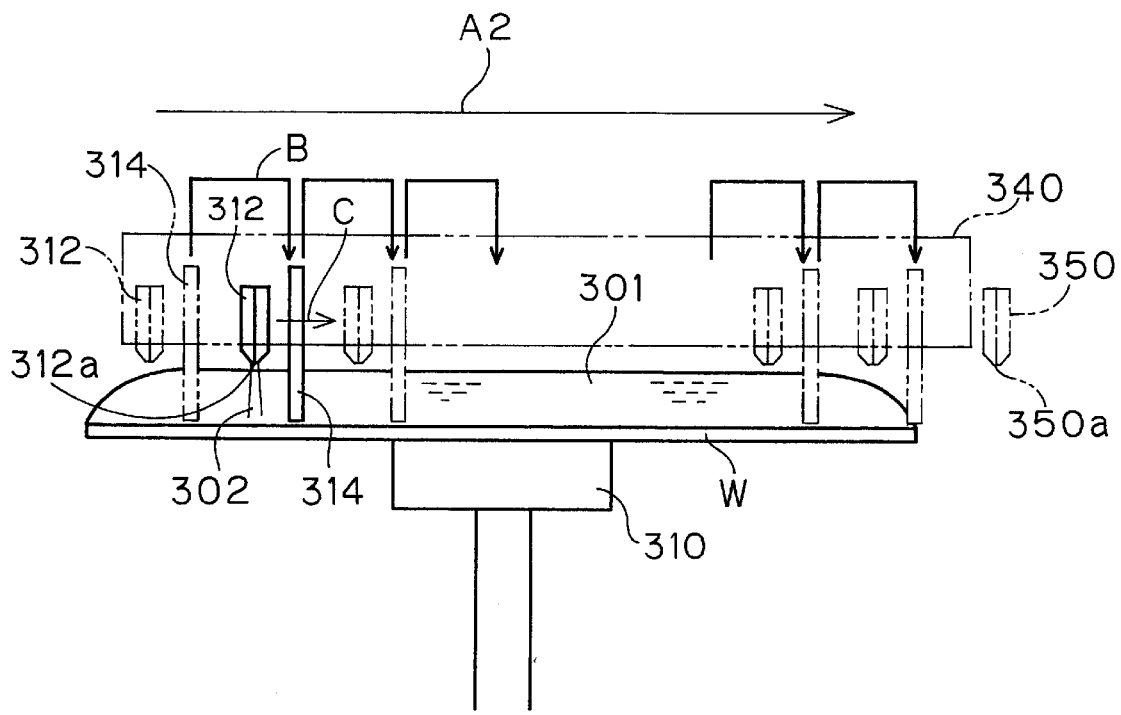
FIG. 25 is a schematic front elevational view showing the structure of a principal part of processing equipment for a substrate according to a sixth embodiment of the present invention.

FIG. 25 is a schematic front elevational view showing the structure of a principal part of processing equipment for a substrate according to a sixth embodiment of the present invention. Referring to FIG. 25 (this also applies to FIGS. 26 and 28 to 30), illustration of a rotation mechanism for a substrate and a developing cup and the like is omitted and detailed description thereof is also omitted.

Referring to FIG. 25, a developer discharge nozzle 350 having a slit discharge port 350a equivalent to or longer by several mm than the diameter of a substrate W on its lower end horizontally linearly moves from a first end to a second end of the substrate W such as a semiconductor wafer horizontally held by a substrate holding part 310 and discharges a developer 301 to the substrate W from the slit discharge port 350a for heaping the developer 301 on the overall upper surface of the substrate W. Arrow A2 in FIG. 25 denotes the scanning direction of the developer discharge nozzle 350.

This processing equipment comprises a rinse discharge nozzle 312 having a slit discharge port 312a equivalent to or longer by several mm than the diameter of the substrate W on its lower end. The rinse discharge nozzle 312 is arranged in the same direction as the developer discharge nozzle 350, and supported by a supporting/moving mechanism 340 to move from the first end to the second end o the substrate W in a direction (the same direction as the scanning direction A2 of the developer discharge nozzle 350) perpendicular to the slit discharge port 312a. The rinse discharge nozzle 312 discharges a rinse 302 such as pure water to the substrate W from the slit discharge port 312a, for stopping development with the developer 301 heaped on the substrate W.

The equipment shown in FIG. 25 also comprises a partition plate 314 and a supporting/moving mechanism 340 therefor. The partition plate 314 is arranged to be perpendicular to the direction of movement of the rinse discharge nozzle 312, i.e., in parallel with the rinse discharge nozzle 312. The partition plate 314 has a small width and a large length, so that the longitudinal dimension thereof is equivalent to or larger than the diameter of the substrate W and the vertical width is sufficiently larger than the thickness of the developer 301 heaped on the substrate W. The supporting/moving mechanism 340 supports and moves the partition plate 314 to vertically move between a lower position where the lower end thereof approaches the upper surface of the substrate W until the interval between the same and the substrate W (more correctly, a photoresist film formed on the substrate W) is 0.1 to 0.5 mm and an upper position where the lower end is pulled up from the developer 301 heaped on the substrate W and to horizontally move in the same direction as the direction of movement of the rinse discharge nozzle 312 by a distance smaller than the diameter of the substrate W. The partition plate 314 moves downward so that the lower end thereof is introduced into the developer 301 heaped on the substrate W from above, thereby keeping back the developer 301. The rinse discharge nozzle 312 intermittently horizontally moves following the horizontal movement of the partition plate 314 due to the supporting/moving mechanism 340 therefor.

In order to perform rinsing after the developer discharge nozzle 350 heaps the developer 301 on the overall upper surface of the substrate W in the processing equipment having the aforementioned structure, the rinse discharge nozzle 312 and the partition plate 314 are located on a starting point side in the scanning direction A2 of the developer discharge nozzle 350 so that the partition plate 314 moves downward until the lower end thereof approaches the upper surface of the substrate W on a position slightly moving from the first end of the substrate W in the scanning direction A2 as shown by two-dot chain lines, for introducing the lower end of the partition plate 314 into the developer 301 heaped on the substrate W. In this state, the rinse discharge nozzle 312 discharges the rinse 302 from the slit discharge port 312a. At this time, the partition plate 314 keeps back the front side of the developer 301 heaped on the substrate W, thereby preventing the rinse 302 discharged from the slit discharge port 312a of the rinse discharge nozzle 312 from flowing frontward or washing away the developer 301 heaped on the substrate W frontward.

The rinse discharge nozzle 312 stops discharging the rinse 302 after a prescribed time, then the partition plate 314 moves up along arrow B from the developer 301 heaped on the substrate W, horizontally moves by a small distance in the same direction as the scanning direction A2 of the developer discharge nozzle 350 and thereafter moves downward again until the lower end thereof approaches the upper surface of the substrate W, for introducing the lower end of the partition plate 314 into the developer 301 heaped on the substrate W. Further, the rinse discharge nozzle 312 intermittently horizontally moves by a small distance in the same direction as the scanning direction A2 of the developer discharge nozzle 350 following the horizontal movement of the partition plate 314, as shown by arrow C. In this state, the rinse discharge nozzle 312 discharges the rinse 302 again from the slit discharge port 312a. Also at this time, the partition plate 314 keeps back the front side of the developer 301 heaped on the substrate W, thereby preventing the rinse 302 discharged from the slit discharge port 312a of the rinse discharge nozzle 312 from flowing frontward or washing away the developer 301 heaped on the substrate W frontward.

The rinse discharge nozzle 312 stops discharging the rinse 302 after a prescribed time, and then the partition plate 314 moves up along arrow B from the developer 301 heaped on the substrate W for repeating the aforementioned operations. When the rinse discharge nozzle 312 and the partition plate 314 move to an end point side in the scanning direction A2 of the developer discharge nozzle 350 to stop all development with the developer 301 heaped on the substrate W, the processing equipment ends the series of rinsing.

In the aforementioned series of operations, the repetitive step numbers of the movement of the partition plate 314 along arrow B, movement of the rinse discharge nozzle 312 along arrow C and discharge of the rinse 302 are decided by the distance of single horizontal movement of the partition plate 314 and the distance thereof is so decided that work dimension difference resulting from developing time difference caused in a range corresponding to the distance is within an allowable range, while the same is preferably minimized. The average speed of the horizontal movement of the rinse discharge nozzle 312 is set substantially identical to the speed of the horizontal movement of the developer discharge nozzle 350.

<Seventh Embodiment>

Figure 26:
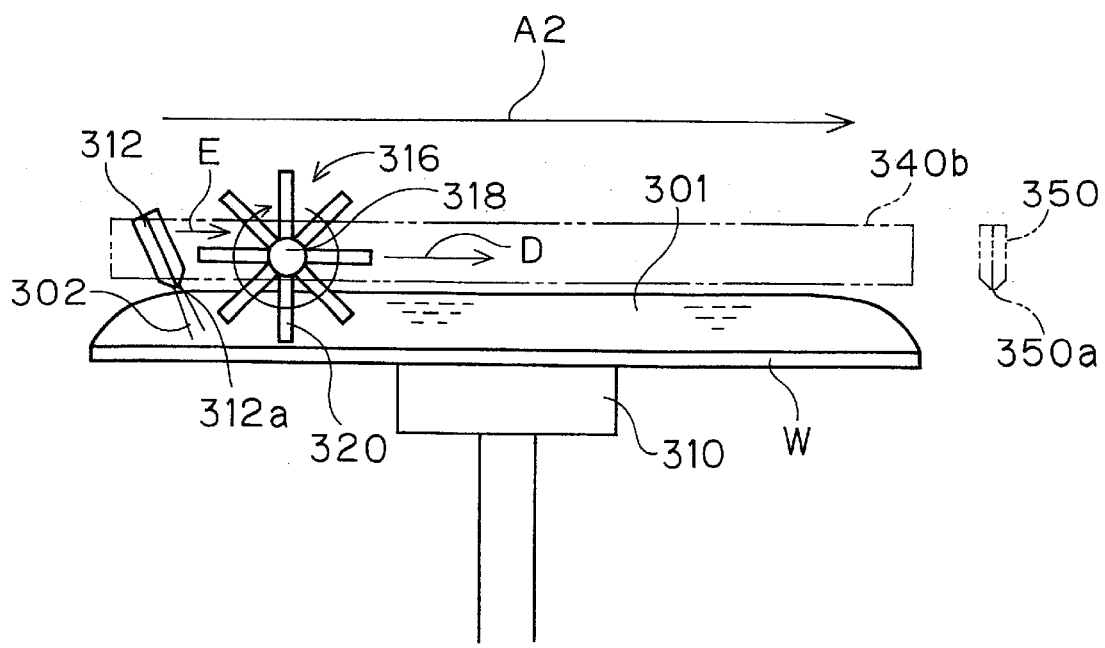
FIG. 26 is a schematic front elevational view of a principal part of processing equipment for a substrate according to a seventh embodiment of the present invention.

FIG. 26 is a schematic front elevational view showing a principal part of processing equipment for a substrate according to a seventh embodiment of the present invention. This processing equipment comprises a partition roller 316 arranged above a substrate W held by a substrate holding part 310. The partition roller 316 is formed by radially fixing a plurality of partition plate parts 320 having a longitudinal dimension rendered equivalent to or larger than the diameter of the substrate W to a rotary shaft 318. The distance (the radius of the partition roller 316) between the center of the rotary shaft 318 of the partition roller 316 and the outer peripheral end of each partition plate part 320 is rendered slightly smaller than the minimum distance between the center of the rotary shaft 318 of the partition roller 316 and the upper surface of the substrate W, e.g., 0.1 mm to 0.5 mm. This partition roller 316 is arranged to be parallel to the substrate W and perpendicular to the direction (the scanning direction A2 of a developer discharge nozzle 350) of horizontal movement of the rinse discharge nozzle 312. A supporting/rotating/moving mechanism 340b supports, rotates and moves the partition roller 316 to rotate so that the outer peripheral ends of the partition plate parts 320 successively approach the upper surface of the substrate W while horizontally moving in the same direction as the direction of movement of the rinse discharge nozzle 312.

In order to perform rinsing in the processing equipment having the structure shown in FIG. 26, the rinse discharge nozzle 312 and the partition roller 316 are located on a starting point side in the scanning direction A2 of the developer discharge nozzle 350, the partition roller 316 rotates so that the outer peripheral ends of the partition plate parts 320 successively approach the upper surface of the substrate while horizontally moving along arrow D and the rinse discharge nozzle 312 horizontally moves along arrow E following the horizontal movement of the partition roller 316. The speeds of movement of the partition roller 316 and the rinse discharge nozzle 312 are set substantially identical to that of the developer discharge nozzle 350. The rinse discharge nozzle 312 located at the back of the partition roller 316 continuously discharges a rinse 302 onto the substrate W from a slit discharge port 312a. At this time, any partition plate part 320 of the partition roller 316 keeps back the front side of the developer 301 heaped on the substrate W, thereby preventing the rinse 302 discharged from the slit discharge port 312a of the rinse discharge nozzle 312 from flowing frontward or washing away the developer 301 heaped on the substrate W frontward. When the rinse discharge nozzle 312 and the partition roller 316 move to an end point side in the scanning direction A2 of the developer discharge nozzle 350 to stop all development with the developer 301 heaped on the substrate W, the processing equipment ends the series of rinsing.

Assuming that r represents the radius of the partition roller 316 in this equipment, the partition roller 316 horizontally moves by a distance $2\pi r$ every rotation, for example. The radius r and the number n of the partition plate parts 320 are so decided that work dimension difference resulting from developing time difference caused in a range corresponding to a distance of horizontal movement of the partition roller 316 after the outer peripheral end of one partition plate part 320 most approaches the upper surface of the substrate W and before the outer peripheral end of the next partition plate part 320 most approaches the upper surface of the substrate W, i.e., a distance $2\pi r/n$ assuming that the partition roller 316 horizontally moves by the distance $2\pi r$ every rotation, is within an allowable range, while the distance $2\pi r/n$ is preferably minimized.

Figure 27:
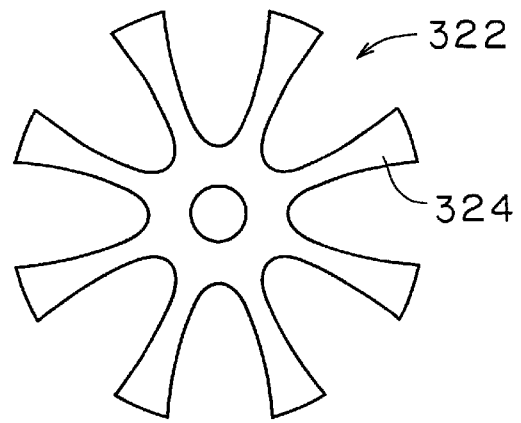
FIG. 27 is a front elevational view showing another exemplary structure of a partition roller in the embodiment shown in FIG. 26.

The shape of the partition roller 316 is not particularly restricted so far as the same is radially provided with the plurality of partition plate parts 320. For example, a plurality of partition plate parts 324 may be integrally formed in a partition roller 322, as shown in FIG. 27.

<Eighth Embodiment>

Figure 28:
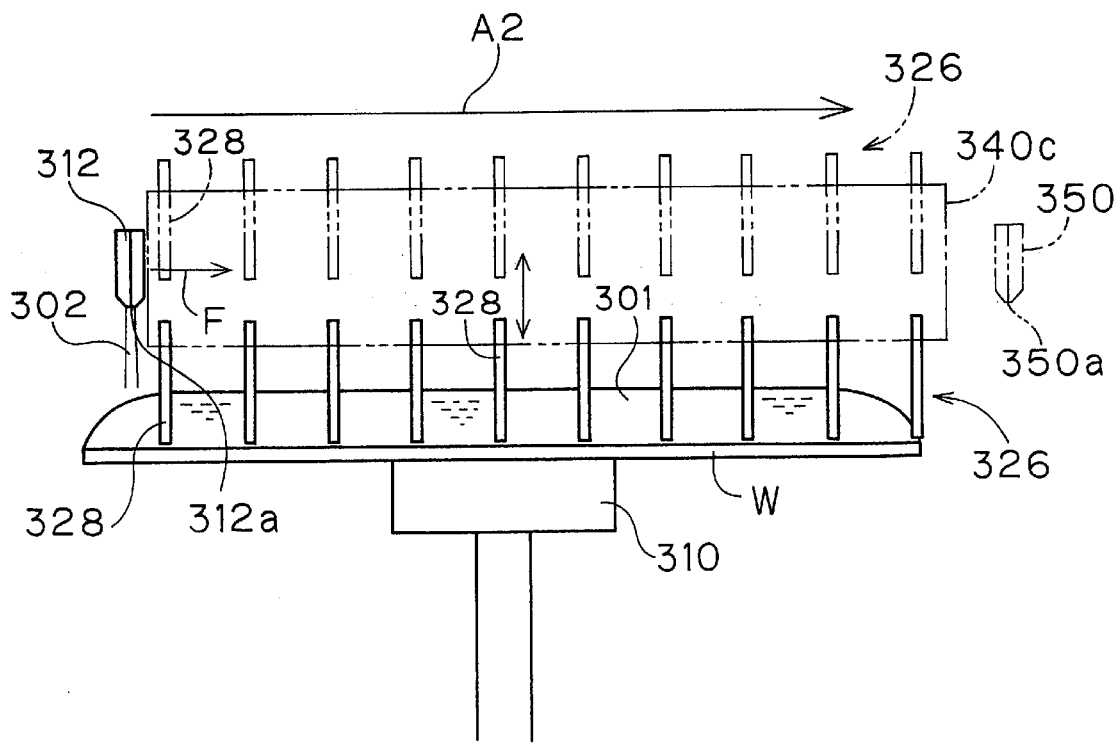
FIG. 28 is a schematic front elevational view of a principal part of processing equipment for a substrate according to an eighth embodiment of the present invention.
Figure 29:
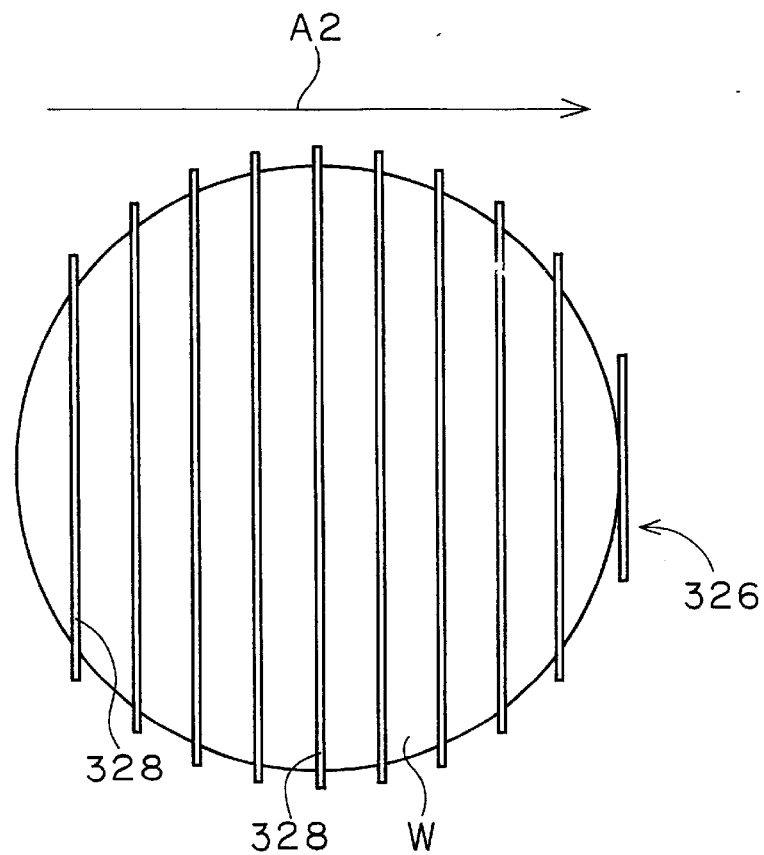
FIG. 29 is a schematic plan view of a principal part of the equipment shown in FIG. 28.

FIG. 28 is a schematic front elevational view showing a principal part of processing equipment for a substrate according to an eighth embodiment of the present invention. This processing equipment comprises a partition member 326 arranged above a substrate W held by a substrate holding part 310. The partition member 326 is formed by arranging a plurality of partition plates 328 at small intervals in the same direction as the direction of movement (the scanning direction A2 of a developer discharge nozzle 350) of a rinse discharge nozzle 312 to be perpendicular to the direction of movement of the rinse discharge nozzle 312 and parallel with each other. As shown in a plan view of FIG. 29, each partition plate 328 has a small width and a large length so that the longitudinal dimension thereof is equivalent to or larger than the dimension on each position of the substrate W in this direction. The vertical width of each partition plate 328 is rendered sufficiently larger than the thickness of a developer 301 heaped on the substrate W. A supporting/moving mechanism 340c supports and moves the partition member 326 to vertically move between a lower position where the lower end of each partition plate 328 approaches the upper surface of the substrate W until the distance therebetween is 0.1 mm to 0.5 mm, for example, and an upper position pulled up from the developer 301 heaped on the substrate W. When the partition member 326 moves downward for introducing the lower end of each partition plate 328 into the developer 301 heaped on the substrate W from above, each partition plate 328 keeps back the developer 301 in a small section.

In order to perform rinsing in the processing equipment having the structure shown in FIG. 28, the partition member 326 moves from the upper position shown by two-dot chain lines to the lower position shown by solid lines for introducing the lower ends of the partition plates 314 in the developer 301 heaped on the substrate W so that the lower ends of the partition plates 328 approach the upper surface of the substrate W respectively. In this state, the rinse discharge nozzle 312 horizontally moves from a first end to a second end of the substrate W along arrow F above the partition plates 328 while discharging a rinse 302 onto the substrate W from a slit discharge port thereof. The speed of movement of the rinse discharge nozzle 312 is set substantially identical to that of the developer discharge nozzle. At this time, each partition plate 328 of the partition member 326 keeps back the developer 301 heaped on the substrate W in a small section, thereby preventing the rinse 302 discharged from the slit discharge port 312a of the rinse discharge nozzle 312 into each small section from flowing frontward beyond the small section or washing away the developer 301 heaped on the substrate W frontward beyond the small section. When the rinsing is terminated, the partition member 326 moves from the lower position to the upper position for pulling up the partition plates 328 from the developer 301 as shown by the two-dot chain lines.

In the equipment having the aforementioned structure, the number of the partition plates 328 of the partition member 328 is decided by the interval between the partition plates 328 and this interval is so decided that work dimension difference resulting from developing time difference caused in a range corresponding to the distance is within an allowable range, while the interval is preferably minimized.

<Ninth Embodiment>

Figure 30:
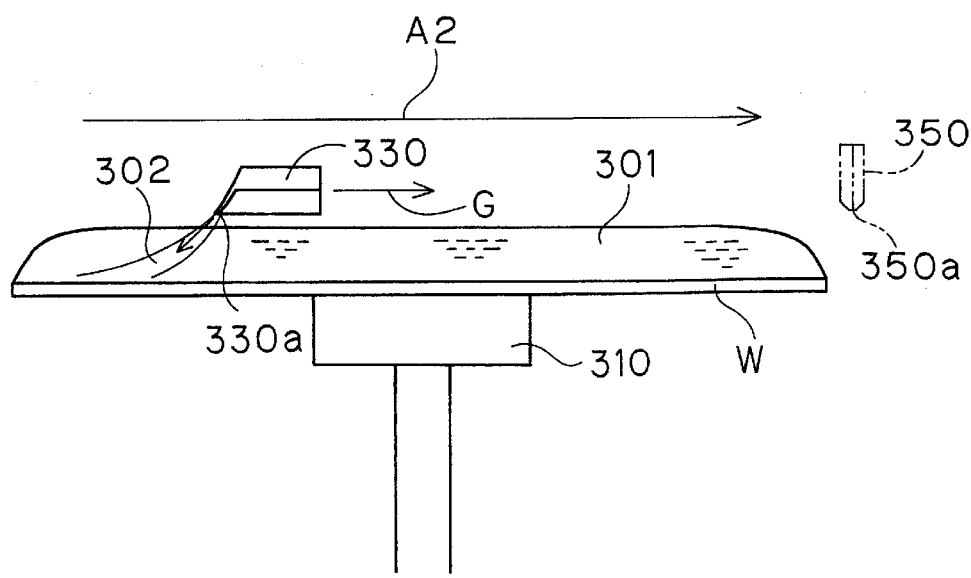
FIG. 30 is a schematic front elevational view of a principal part of processing equipment for a substrate according to a ninth embodiment of the present invention.
Figure 31A:
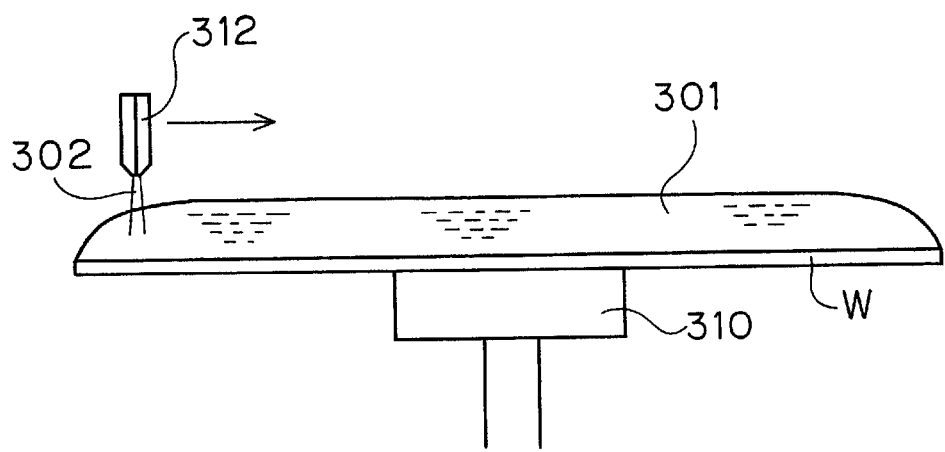
FIGS. 31A and 31B are diagrams for illustrating problems in conventional processing equipment.
Figure 31B:
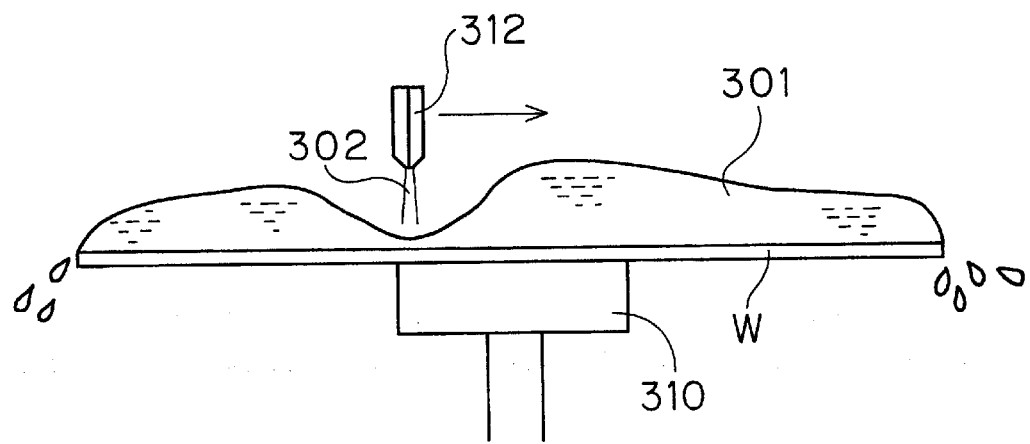

FIG. 30 is a schematic front elevational view showing a principal part of processing equipment for a substrate according to a ninth embodiment of the present invention, which is different from the aforementioned embodiments. This processing equipment comprises a rinse discharge nozzle 330 having a slit discharge port 330a formed to discharge a rinse 302 to a direction opposite to the direction of movement. The processing equipment is further provided with an element (not shown) supplying a flow velocity of 1 m/sec. to 3 m/sec. or more, for example, to the rinse 302 discharged from the slit discharge port 330a of the rinse discharge nozzle 330 such as a pressure pump pressurizing the rinse 302 supplied to the rinse discharge nozzle 330 or a gas feeder mixing a pressurized gas to the rinse 302 supplied to the rinse discharge nozzle 330, for example. The speed of movement of the rinse discharge nozzle 330, which is preferably rendered substantially identical to the speed of movement (e.g., 50 mm/sec.) of a developer discharge nozzle 350, is not particularly restricted. The position of the rinse discharge nozzle 330, which is preferably arranged on a position not coming into contact with a developer 301 heaped on the substrate W, is not restricted either. Further, the rinse discharge nozzle 330, preferably discharging a single fluid such as pure water, may be of a two-fluid type mixing pure water with a gas and discharging the mixture in order to reduce the quantity of the pure water or ensure the flow velocity of the rinse 302.

In order to perform rinsing in the processing equipment having the structure shown in FIG. 30, the rinse discharge nozzle 330 moves along arrow G in the same direction as the scanning direction A2 of the developer discharge nozzle 350 and discharges the rinse 302 onto a substrate W through the slit discharge port upon a lapse of a prescribed time after the developer discharge nozzle 350 heaps the developer 302, similarly to the apparatuses according to the aforementioned embodiments. In this equipment, the rinse discharge nozzle 330 discharges the rinse 302 from the slit discharge port 330a with a flow velocity in a direction opposite to the direction of movement thereof. Even if a vertical linear velocity acts on the developer 301 heaped on the substrate W from the discharged rinse 302, therefore, influence of this vertical linear velocity on the developer 301 is reduced by a horizontal linear velocity opposite to the direction of movement of the rinse discharge nozzle 330. Consequently, the rinse 302 is prevented from flowing frontward beyond the rinse discharge nozzle 330 or washing away the developer 301 heaped on the substrate W frontward beyond the rinse discharge nozzle 330.

While the apparatuses according to the aforementioned sixth to ninth embodiments horizontally move the rinse discharge nozzle 312 and the partition plate 314 (FIG. 25), the rinse discharge nozzle 312 and the partition roller 316 (FIG. 26) and the rinse discharge nozzle 312 (FIG. 28) and the rinse discharge nozzle 330 (FIG. 30) respectively, these may alternatively be fixed for horizontally moving the substrates W. While the apparatuses according to the aforementioned sixth to ninth embodiments arrange the rinse discharge nozzles 312 and 330, the partition plate 314, the partition roller 316 and the partition plates 328 of the partition member 326 perpendicularly to the directions of movement of the rinse discharge nozzles 312 and 330 respectively, these may alternatively be arranged to obliquely intersect with the directions of movement of the rinse discharge nozzles 312 and 330. In addition, the present invention is also applicable to a structure providing only a single solution discharge nozzle along with pipelines for a developer and a rinse capable of selectively feeding the developer and the rinse to the solution discharge nozzle thereby applying the single solution discharge nozzle to discharge of the developer and the rinse in common.

<Tenth Embodiment>

Figure 32:
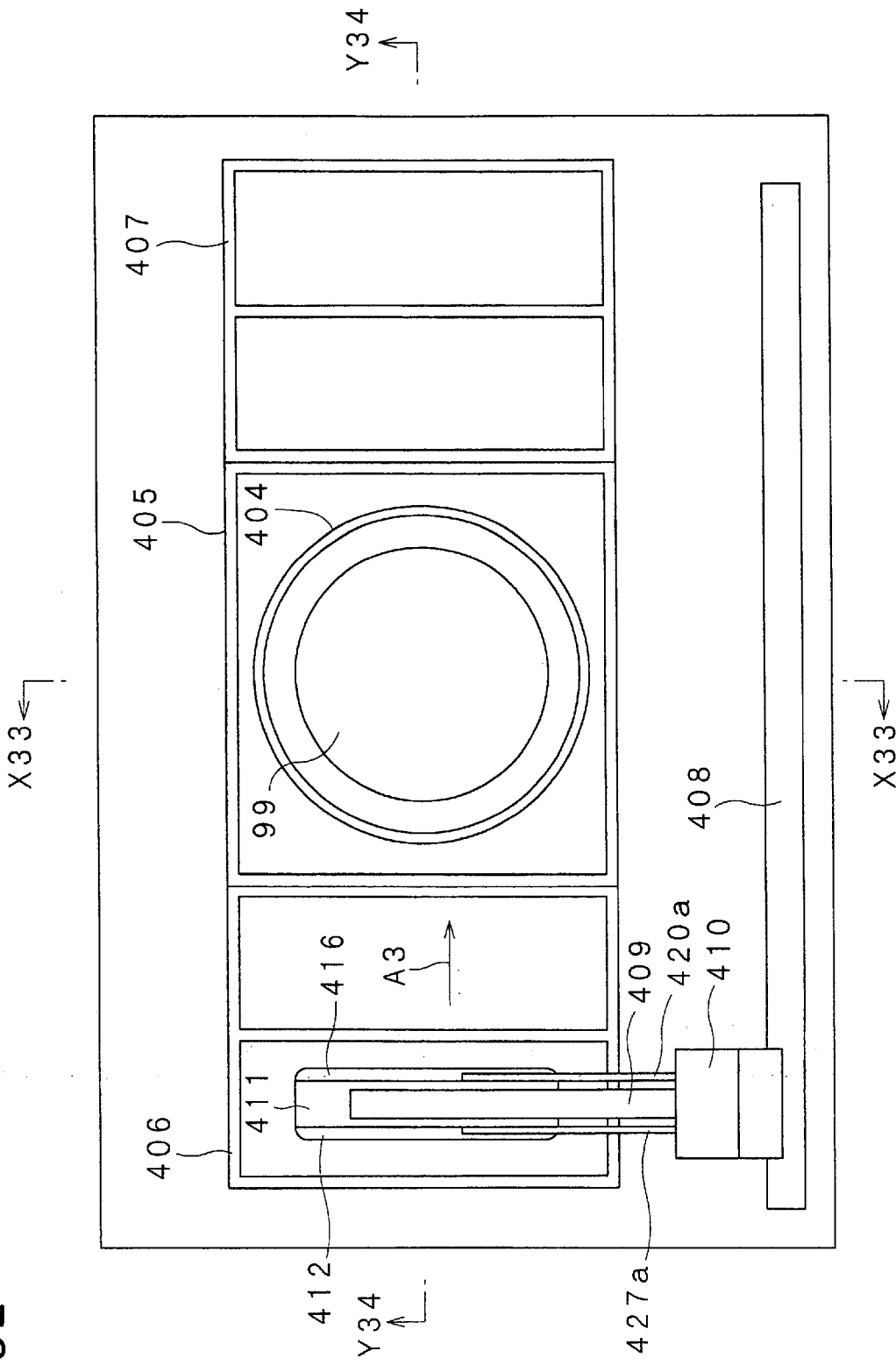
FIG. 32 is a plan view of a developing apparatus according to a tenth embodiment of the present invention.
Figure 33:
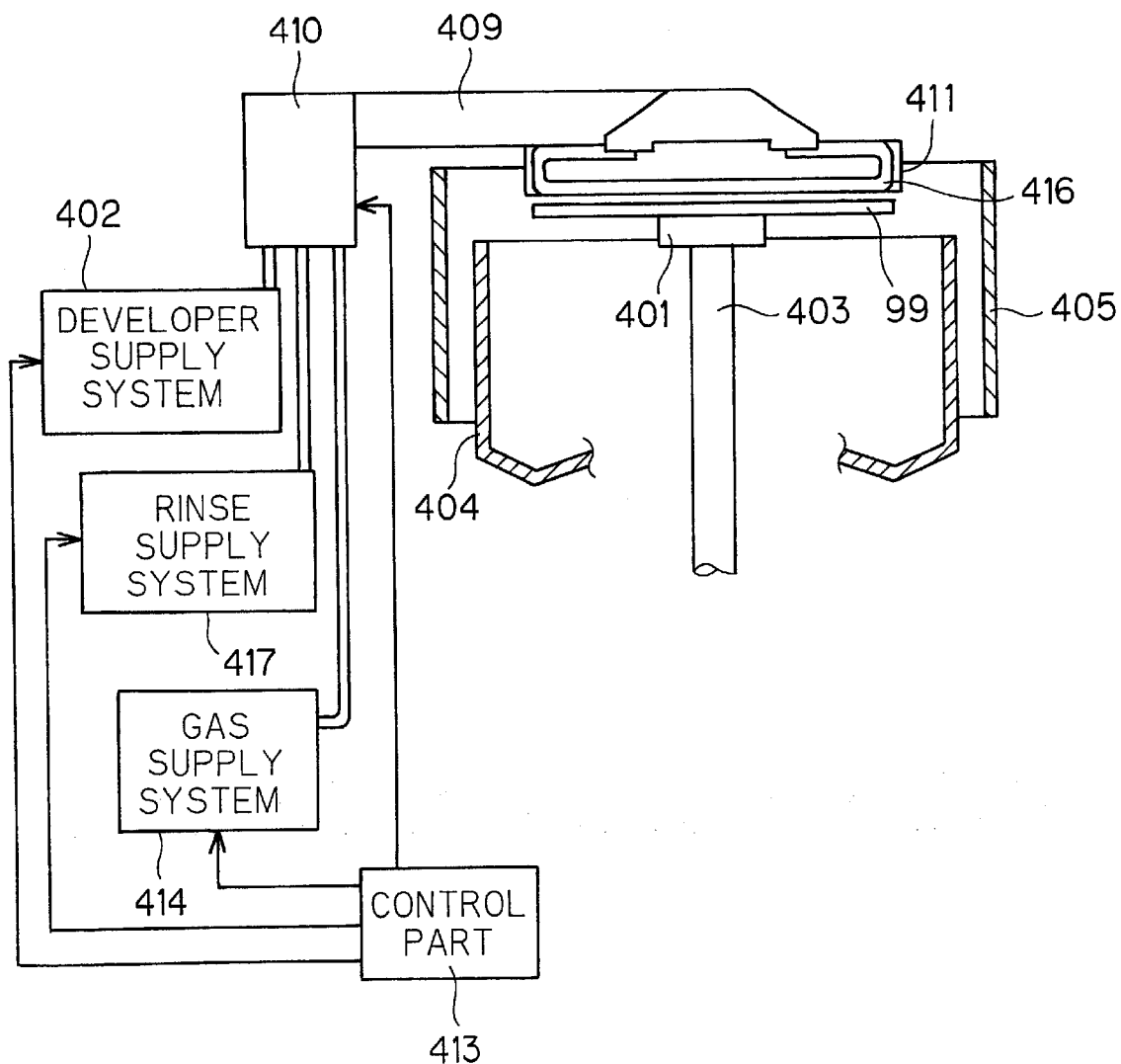
FIG. 33 is a sectional view of a principal part of the developing apparatus taken along the line X33—X33 in FIG. 32.
Figure 34:
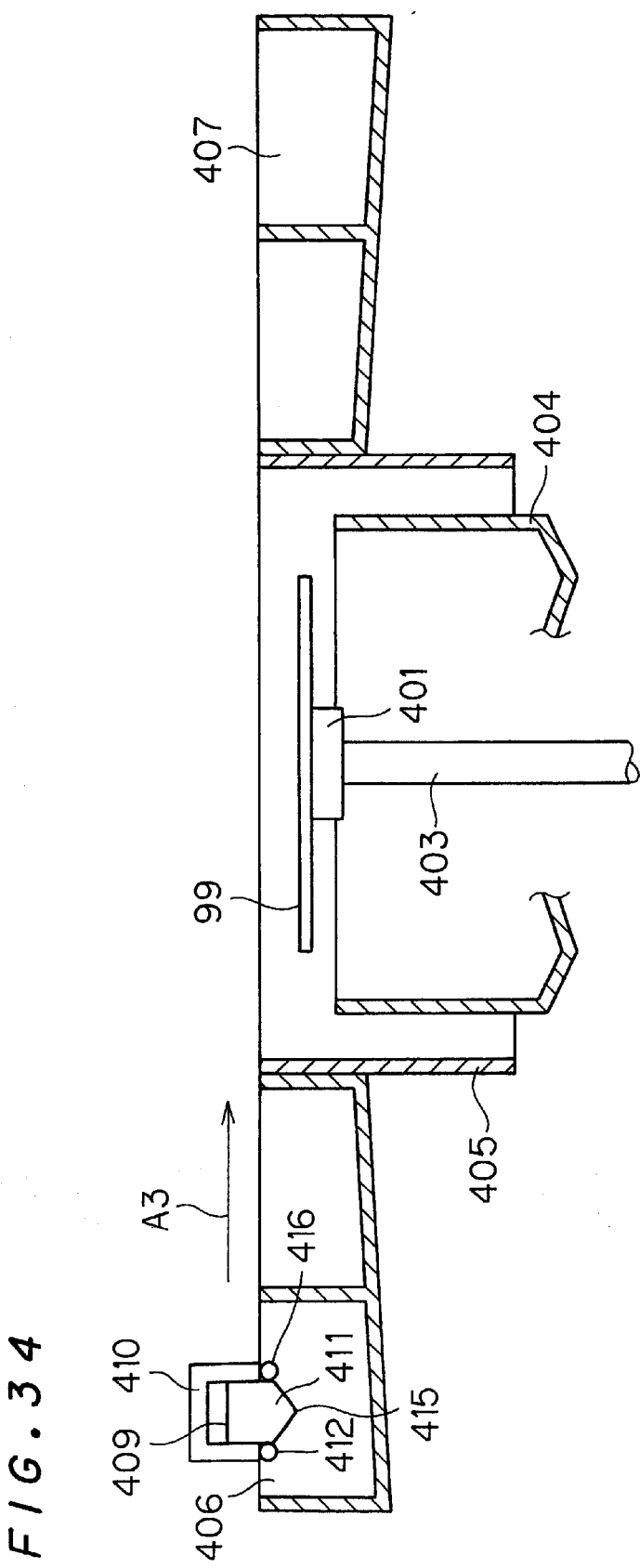
FIG. 34 is a sectional view of a principal part of the developing apparatus taken along the line X34—X34 in FIG. 32.

FIG. 32 is a plan view of a developing apparatus according to a tenth embodiment of the present invention, FIG. 33 is a sectional view of a principal part of the developing apparatus taken along the line X33—X33 in FIG. 32, and FIG. 34 is a sectional view of the principal part of the developing apparatus taken along the line Y34—Y34 in FIG. 32.

As shown in FIGS. 33 and 34, the developing apparatus comprises a substrate holding part 401 horizontally sucking and holding a substrate 499. The substrate holding part 401 is fixed to the forward end of a holding member 403. A circular inner cup 404 is vertically movably provided around the substrate holding part 401 to enclose the substrate 499. A square outer cup 405 is provided around the inner cup 404.

As shown in FIG. 32, standby pots 406 and 407 are arranged on both sides of the outer cup 405 respectively, while a guide rail 408 is arranged on one side portion of the outer cup 405. A developer nozzle arm 409 and tubular members 420a and 427a are provided to be movable in a scanning direction A3 and an opposite direction along the guide rail 408 by an arm driving part 410.

A developer discharge nozzle 411 having a slit discharge port 415 (see FIG. 34) on its lower end is mounted on the developer nozzle arm 409 perpendicularly to the guide rail 408. A rinse discharge nozzle 416 for stopping development and a gas injection nozzle 412 are mounted on front and rear sides of the developer discharge nozzle 411 along the scanning direction A3 respectively. Thus, the developer discharge nozzle 411 is linearly translatable from the position of the standby pot 406 to the position of the standby pot 407 through the substrate 499 with the rinse discharge nozzle 416 and the gas injection nozzle 412 along the scanning direction A3.

As shown in FIG. 33, a developer supply source system 402 supplies a developer to the developer discharge nozzle 411. A rinse supply source system 417 supplies a rinse for stopping development to the rinse discharge nozzle 416, while a gas supply source system 414 supplies a gas for drying the surface of the substrate 499 to the gas injection nozzle 412. According to this embodiment, pure water is employed as the rinse for stopping development, and nitrogen ($N_2$) is employed as the drying gas.

A control part 413 controls scanning of the developer discharge nozzle 411, the rinse discharge nozzle 416 and the gas injection nozzle 412 by the arm driving part 410, discharge of the developer from the developer discharge nozzle 411, discharge of the rinse from the rinse discharge nozzle 416 and injection of the gas from the gas injection nozzle 412.

According to this embodiment, the substrate holding part 401 corresponds to the substrate holding element, the developer discharge nozzle 411 corresponds to the developer discharge nozzle, the rinse discharge nozzle 416 corresponds to the processing solution discharge nozzle, the gas injection nozzle 412 corresponds to the gas injection nozzle, and the arm driving part 410 corresponds to the moving element.

Figure 35:
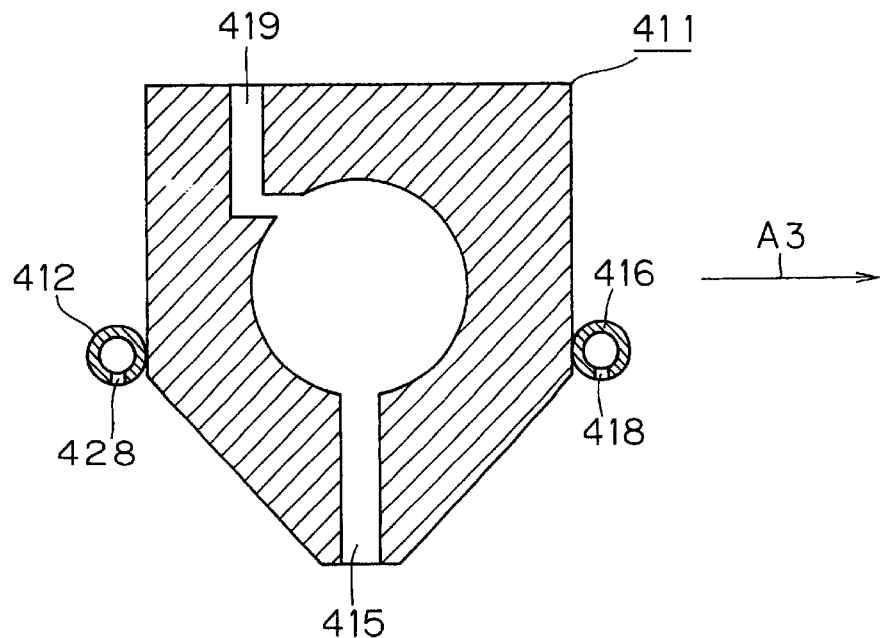
FIG. 35 is a schematic sectional view of a developer discharge nozzle, a rinse discharge nozzle and a gas injection nozzle.
Figure 36:
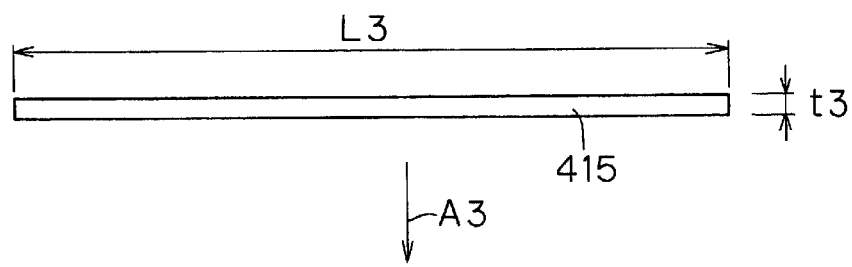
FIG. 36 illustrates a slit discharge port of the developer discharge nozzle.

FIG. 35 is a schematic sectional view showing the developer discharge nozzle 411, the rinse discharge nozzle 416 and the gas injection nozzle 412. FIG. 36 illustrates the slit discharge port 415 of the developer discharge nozzle 411, FIG. 37 is a front elevational view of the rinse discharge nozzle 416, and FIG. 38 is a front elevational view of the gas injection nozzle 412.

As shown in FIG. 35, the developer discharge nozzle 411 has a developer supply port 419 and the slit discharge port 415. The rinse discharge nozzle 416 and the gas injection nozzle 412 are arranged on front and rear end surfaces of the developer discharge nozzle 411 along the scanning direction A3 respectively.

As shown in FIG. 36, the slit width t3 of the slit discharge port 415 of the developer discharge nozzle 411 is 0.05 to 0.5 mm, and set to 0.1 mm according to this embodiment. The discharge width L3 of the slit discharge port 415 is set identical to or larger than the diameter of the substrate 499 to be processed. The slit discharge port 415 is arranged perpendicularly to the scanning direction A3 of the developer discharge nozzle 411.

Figure 37:
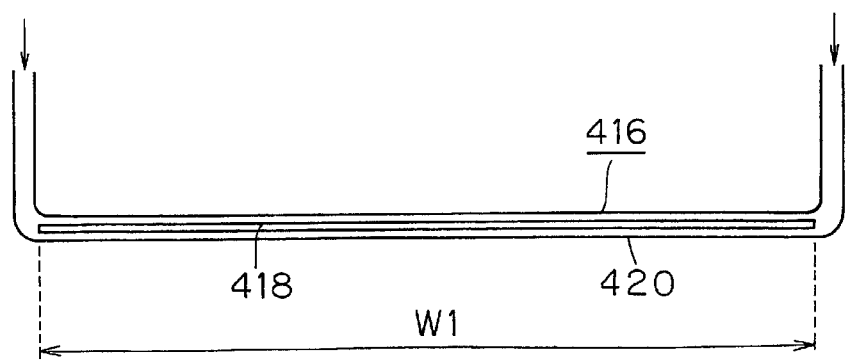
FIG. 37 is a front elevational view of the rinse discharge nozzle.
Figure 38:
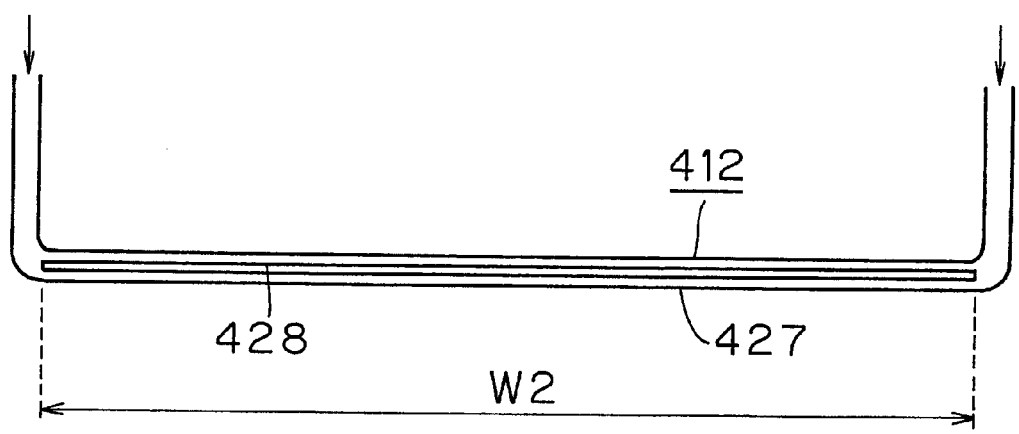
FIG. 38 is a front elevational view of the gas injection nozzle.

As shown in FIG. 37, the rinse discharge nozzle 416 consists of a tubular member 420, and a slit discharge port 418 is provided on the peripheral wall thereof. The tubular member 420 is integrally coupled with the tubular member 420a shown in FIG. 32. The rinse discharge nozzle 416 is arranged to direct the slit discharge port 418 downward. The rise is supplied from both ends of the tubular member 420, as shown by arrows. The discharge width W1 of the slit discharge port 418 is set identical to or larger than the diameter of the substrate 499 to be processed. The slit discharge port 418 is arranged perpendicularly to the scanning direction A3 of the developer discharge nozzle 411.

As shown in FIG. 38, the gas injection nozzle 412 consists of a tubular member 427, and a slit discharge port 428 is provided on the peripheral wall thereof. The tubular member 427 is integrally coupled with the tubular member 427a shown in FIG. 32. The gas injection nozzle 412 is arranged to direct the slit discharge port 428 downward. The gas is supplied from both ends of the tubular member 427, as shown by arrows. The discharge width W2 of the slit discharge port 428 is set identical to or larger than the diameter of the substrate 499 to be processed or the discharge width W1 of the slit discharge port 418 of the rinse discharge nozzle 416. The slit discharge port 428 is arranged perpendicularly to the scanning direction A3 of the developer discharge nozzle 411.

The developer discharge nozzle 411, the rinse discharge nozzle 416 and the gas injection nozzle 412 scan to keep an interval of 0.2 to 5.0 mm, more preferably 0.2 to 1.0 mm between the slit discharge port 415 and the upper surface of the substrate 499 when supplying the developer, the rinse and the gas.

According to this embodiment, the interval between the developer discharge nozzle 411 and the slit discharge port 415 and the upper surface of the substrate 499 is set to 0.3±0.1 mm.

Exemplary operations of the developing apparatus shown in FIG. 32 are now described with reference to FIGS. 39A to 39C, 40A and 40B.

Figure 39A:
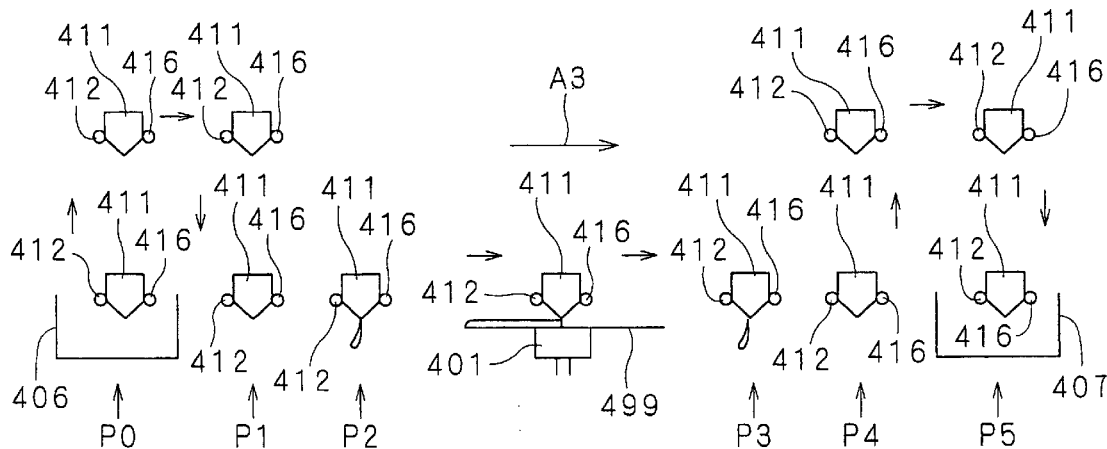
FIGS. 39A to 39C are typical process diagrams showing operations of the developing apparatus shown in FIG. 32.
Figure 39B:
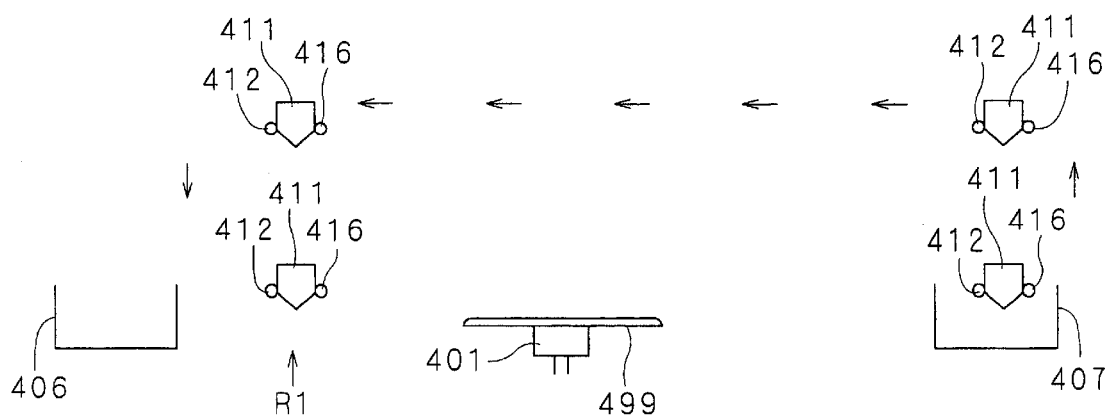
Figure 39C:
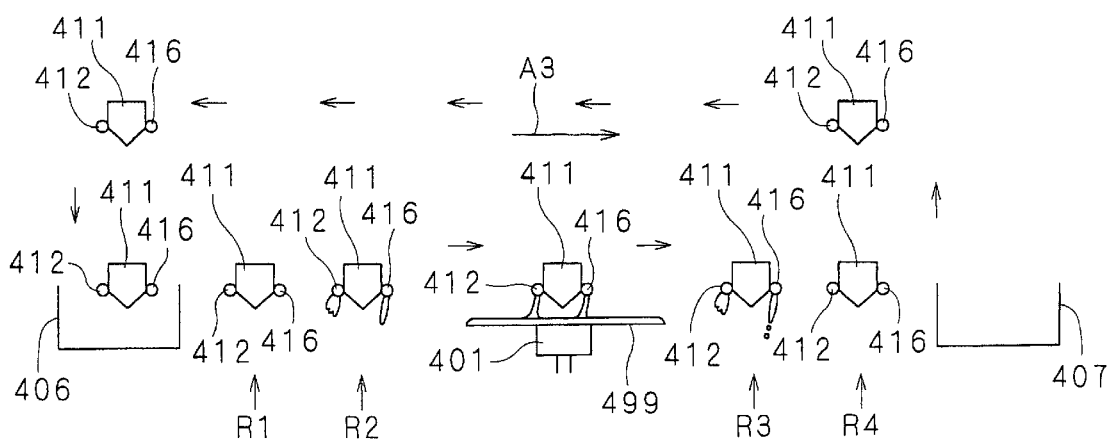
Figure 40A:
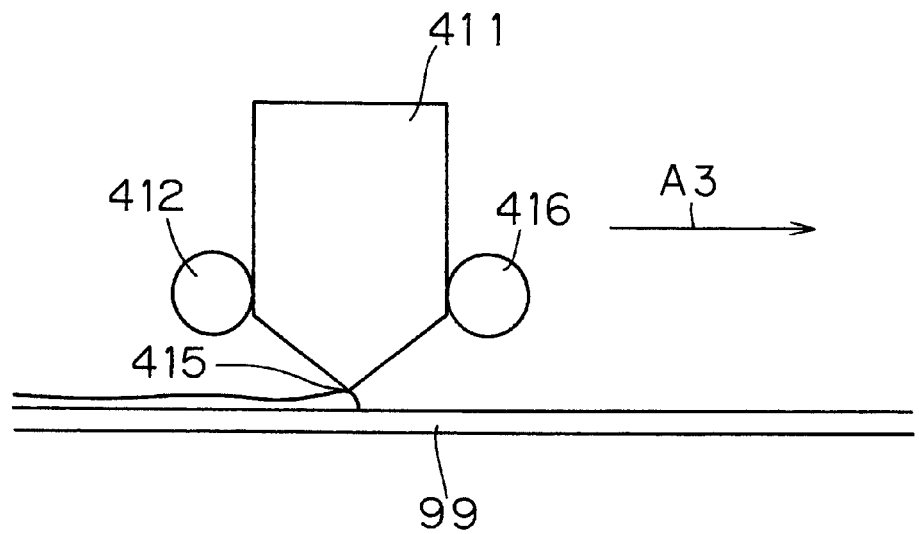
FIG. 40A is a model diagram showing action of the developer discharge nozzle on a substrate.

FIGS. 39A to 39C are typical process diagrams showing the operations of the developing apparatus shown in FIG. 32. FIG. 40A is a model diagram showing action of the developer discharge nozzle 411 on the substrate 499 shown in FIGS. 39A to 39C, and FIG. 40B is a model diagram showing action of the rinse discharge nozzle 416 and the gas injection nozzle 412 on the substrate 499 in FIGS. 39A to 39C.

In development, the substrate holding part 401 holds the substrate 499 in a stationary state. In a standby state, the developer discharge nozzle 411, the rinse discharge nozzle 416 and the gas injection nozzle 412 stand by on a position P0 in the standby pot 406, as shown in FIG. 39A. In order to supply the developer, the developer discharge nozzle 411, the rinse discharge nozzle 416 and the gas injection nozzle 412 rise, thereafter move in the scanning direction A3, and lower on a scanning start position P1 in the outer cup 405.

Thereafter the developer discharge nozzle 411, the rinse discharge nozzle 416 and the gas injection nozzle 412 start scanning from the scanning start position P1 at a prescribed scanning rate. At this point of time, the developer discharge nozzle 411 discharges no developer. According to this embodiment, the scanning rate is set to 10 to 500 mm/sec.

After the developer discharge nozzle 411, the rinse discharge nozzle 416 and the gas injection nozzle 412 start scanning, the developer discharge nozzle 411 starts discharging the developer on a discharge start position P2 at a prescribed flow rate before the slit discharge port 415 of the developer discharge nozzle 411 reaches the substrate 499. According to this embodiment, the flow rate for discharging the developer is set to 1.5 L/min.

The developer discharge nozzle 411, the rinse discharge nozzle 416 and the gas injection nozzle 412 linearly move on the substrate 499 from the discharge start position P2 in the scanning direction A3 while discharging the developer. Thus, the developer is continuously supplied to the overall surface of the substrate 499, as shown in FIG. 40A. The supplied developer is held on the substrate 499 by surface tension.

After the developer discharge nozzle 411, the rinse discharge nozzle 416 and the gas injection nozzle 412 pass through the substrate 499, the developer discharge nozzle 411 stops discharging the developer on a discharge stop position P3 out of the substrate 499, as shown in FIG. 39A. The developer discharge nozzle 411, the rinse discharge nozzle 416 and the gas injection nozzle 412 stop scanning when reaching a scanning stop position P4 in the outer cup 405.

Thereafter the developer discharge nozzle 411, the rinse discharge nozzle 416 and the gas injection nozzle 412 rise on the scanning stop position P4, thereafter move to a position P5 of the other standby pot 407, and lower in the standby pot 407.

The standby pot 407 washes away the developer adhering to the forward end of the developer discharge nozzle 411 with a wash nozzle (not shown), and sucks and removes remaining water droplets with a suction nozzle (not shown). The standby pots 406 and 407 are enclosed with side walls so that water droplets resulting from this processing are not scattered to the processed substrate 499 (see FIG. 34).

Then, the developer is held on the substrate 499 for a prescribed time (e.g., about 60 seconds), for progressing development of a photosensitive film such as a photoresist film formed on the substrate 499, as shown in FIG. 39B.

Within the prescribed time, the developer discharge nozzle 411, the rinse discharge nozzle 416 and the gas injection nozzle 412 rise from the standby pot 407, thereafter move oppositely to the scanning direction A3, and lower on a subsequent scanning start position R1 in the outer cup 405. In this case, the developer discharge nozzle 411, the rinse discharge nozzle 416 and the gas injection nozzle 412 preferably move in a state separating the lower end of the developer discharge nozzle 411 by at least about 3 mm from the surface of the substrate 499, not to come into contact with the developer held on the substrate 499.

As shown in FIG. 39C, the developer discharge nozzle 411 starts scanning from the scanning start position R1 at a prescribed scanning rate in the scanning direction A3 along with the rinse discharge nozzle 416 and the gas injection nozzle 412. At this point of time, the rinse discharge nozzle 416 discharges no rinse and the gas injection nozzle 412 injects no gas. The rinse discharge nozzle 416 starts discharging the rinse at a prescribed flow rate and the gas injection nozzle 412 starts injecting the gas at a prescribed injection rate on a discharge start position R2 before the slit discharge port 418 of the rinse discharge nozzle 416 and the gas injection port 428 of the gas injection nozzle 412 reach the substrate 499.

The flow rate for discharging the rinse is set identical to or slightly larger than the flow rate for discharging the developer, while the flow rate for injecting the gas is set to a level capable of removing the developer and the rinse from the surface of the substrate 499. According to this embodiment, the flow rate for discharging the rinse is set to 3.0 L/min., and the flow rate for injecting the gas is set identical to or larger than the flow rate for discharging the developer and the rinse.

Figure 40B:
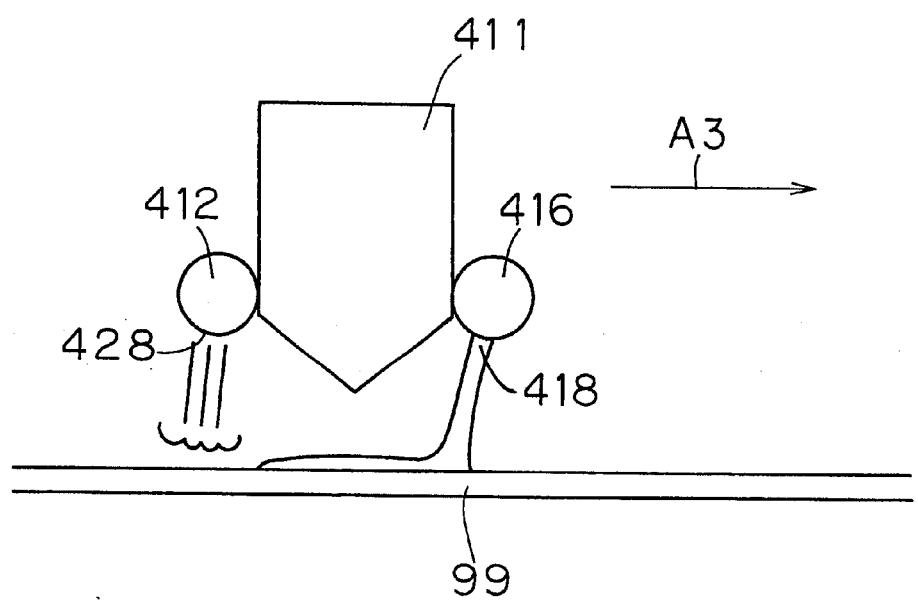
FIG. 40B is a model diagram showing action of the rinse discharge nozzle and the gas injection nozzle on the substrate.

The developer discharge nozzle 411, the rinse discharge nozzle 416 and the gas injection nozzle 412 linearly move on the substrate 499 from the discharge start position R2 in the scanning direction A3 while discharging the rinse from the rinse discharge nozzle 416 and injecting the gas from the gas injection nozzle 412. Thus, the rinse is continuously supplied to the overall surface of the substrate 499 thereby stopping development, and the gas is subsequently supplied to the overall surface of the substrate 499 thereby performing drying, as shown in FIG. 40B.

The normality of the developer diluted with the rinse supplied to the overall surface of the substrate 499 is quickly reduced. When the rinse is supplied to the developer held on the substrate 499, therefore, development of the photosensitive film such as a photoresist film sensitive to concentration change immediately stops and a resist component or the like dissolved in the developer is cleaned.

While the distance between the developer discharge nozzle 411, the rinse discharge nozzle 416 and the gas injection nozzle 412 and the surface of the substrate 499 is not particularly restricted in this case, the lower end of the developer discharge nozzle 411 is preferably separated by at least 3 mm from the substrate 499, so that the developer discharge nozzle 411, the rinse discharge nozzle 416 and the gas injection nozzle 412 and the surface of the substrate 499 do not come into contact with the developer held on the substrate 499. Thus, the developer held on the substrate 499 is prevented from contamination.

After the developer discharge nozzle 411, the rinse discharge nozzle 416 and the gas injection nozzle 412 pass through the substrate 499, the rinse discharge nozzle 416 stops discharging the rinse and the gas injection nozzle 412 stops injecting the gas on a discharge stop position R3 out of the substrate 499, as shown in FIG. 39C. The developer discharge nozzle 411 stops scanning when reaching a scanning stop position R4 in the outer cup 405.

Thereafter the developer discharge nozzle 411, the rinse discharge nozzle 416 and the gas injection nozzle 412 rise on the scanning stop position R4, thereafter move in the direction opposite to the scanning direction A3, and lower in the standby pot 406.

In order to uniformalize the developing time on the overall surface of the substrate 499, the rinse discharge nozzle 416 preferably scans at the same speed as that for supplying the developer as shown in FIG. 39A when supplying the rinse as shown in FIG. 39C. However, the scanning rate of the rinse discharge nozzle 416 shown in FIG. 39C may not be strictly identical to the scanning rate of the developer discharge nozzle 411 shown in FIG. 39A, but the scanning rate of the rinse discharge nozzle 416 may be adjusted in response to the result of development.

The scanning start position R1, the discharge start position R2, the discharge stop position R3 and the scanning stop position R4 in the rinse supply processing shown in FIG. 39C may not match with the scanning start position P1, the discharge start position P2, the discharge stop position P3 and the scanning stop position P4 in the developer supply processing shown in FIG. 39A respectively, but these positions R1 to R4 and P1 to P4 may be adjusted at need in consideration of the positions of the developer and the rinse discharged from the developer discharge nozzle 411 and the rinse discharge nozzle 416 respectively.

The scanning start position P1 and the discharge start position P2, the discharge stop position P3 and the scanning stop position P4, the scanning start position R1 and the discharge start position R2 and the discharge stop position R3 and the scanning stop position R4 are not restricted to the above examples but may alternatively be identical to each other respectively. In other words, the developer discharge nozzle 411 may discharge the developer on the scanning start position P1 simultaneously with or before starting scanning from the scanning start position P1. Similarly, the rinse discharge nozzle 416 and the gas injection nozzle 412 may start discharging and injecting the rinse and the gas respectively on the scanning start position R1 simultaneously with or before starting scanning from the scanning start position R1. While the rinse discharge nozzle 416 and the gas injection nozzle 412 simultaneously start and stop discharging and injecting the rinse and the gas respectively in this embodiment, the present invention is not restricted to this but the nozzles 416 and 412 may start and stop discharging and injecting the rinse and the gas at different timings.

While the gas injected from the gas injection port 428 of the gas injection nozzle 412 is prepared from nitrogen ($N_2$) in this embodiment, the present invention is not restricted to this but any gas such as compressed air, for example, is employable so far as the same can dry the surface of the substrate 499.

While the rinse discharge nozzle 416 and the gas injection nozzle 412 are arranged in front and at the back of the developer discharge nozzle 411 in the scanning direction A3 respectively in this embodiment, the present invention is not restricted to this but the rinse discharge nozzle 416 may be relatively arranged in front of the gas injection nozzle 412 in the scanning direction A3 such that the gas injection nozzle 412 may be arranged in front of the developer discharge nozzle 411 in the scanning direction A3 while arranging the rinse discharge nozzle 416 in front of the gas injection nozzle 412.

While the developer is vertically discharged with respect to the surface of the substrate 499, the present invention is not restricted to this but the direction for discharging the developer may be inclined oppositely to the scanning direction A3. In this case, the developer is inhibited from flowing in the scanning direction A3 on the surface of the substrate 499 and induced to flow oppositely to the scanning direction A3, whereby uniformity of development is improved and development defects are prevented.

While the rinse is vertically discharged with respect to the surface of the substrate 499, the present invention is not restricted to this but the direction for discharging the rinse may be inclined oppositely to the scanning direction A3. In this case, the rinse is inhibited from flowing in the scanning direction A3 on the surface of the substrate 499 and induced to flow oppositely to the scanning direction A3, whereby uniformity of development stop processing as well as the rinsing effect are improved.

Thus, according to this embodiment, no motor (rotating/driving apparatus) is required for drying the substrate 499 by rotation, and the developing apparatus can be miniaturized or the space therefor can be saved. Further, the substrate 499 is simultaneously rinsed and dried so that no time is required for drying the substrate 499 by rotation, whereby production efficiency can be improved.

Figure 41A:
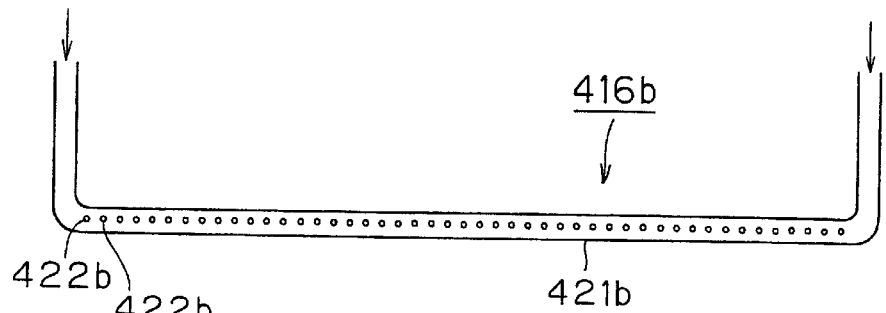
FIG. 41A is a front elevational view showing another exemplary rinse discharge nozzle.
Figure 41B:
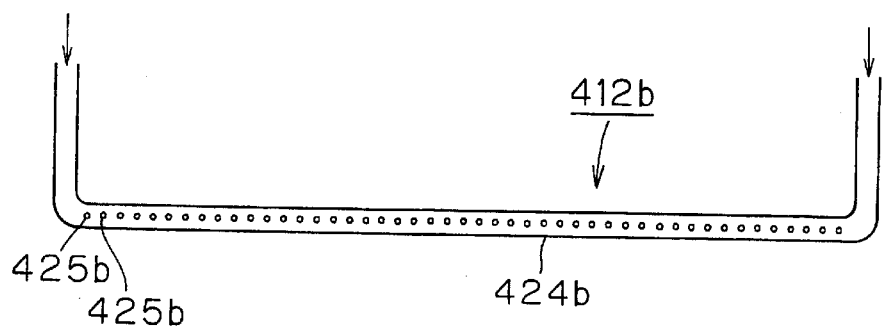
FIG. 41B is a front elevational view showing another exemplary gas injection nozzle.

FIGS. 41A and 41B are front elevational views showing another exemplary rinse discharge nozzle 416*b* and another exemplary gas injection nozzle 412*b* respectively.

The rinse discharge nozzle 416*b* shown in FIG. 41A consists of a tubular member 421*b* having a plurality of porous discharge ports 422*b* aligned on a side wall thereof. The plurality of discharge ports 422*b* are arranged in a direction perpendicular to a scanning direction A3. The rinse discharge nozzle 416*b* is arranged to direct the plurality of discharge ports 422*b* downward.

The gas injection nozzle 412*b* show in FIG. 41B consists of a tubular member 424*b* having a plurality of porous injection ports 425*b* aligned on a side wall thereof. The plurality of injection ports 425*b* are arranged in the direction perpendicular to the scanning direction A3. The gas injection nozzle 412*b* is arranged to direct the plurality of injection ports 425*b* downward.

Figure 42A:
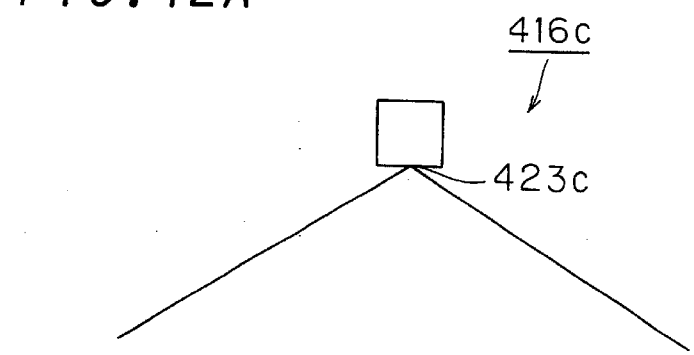
FIG. 42A illustrates still another exemplary rinse discharge nozzle.
Figure 42B:
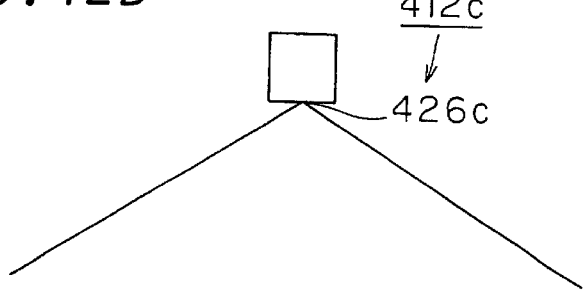
FIG. 42B illustrates still another exemplary gas injection nozzle.

FIGS. 42A and 42B illustrate showing still another exemplary rinse discharge nozzle 416*c* and still another exemplary gas injection nozzle 412*c* respectively.

Referring to FIG. 42A, the rinse discharge nozzle 416*c* has a discharge port 423*c* sectorially discharging a rinse. Referring to FIG. 42B, the gas injection nozzle 412*c* has an injection port 426*c* sectorially injecting a gas.

Thus, the rinse discharge nozzle 416, 416*b* or 416*c* and the gas injection nozzle 412, 412*b* or 412*c*, which may not be so uniform in discharge as the developer discharge nozzle 411 with no requirement for temperature control, may linearly discharge and inject the rinse and the gas in a width exceeding the diameter of the substrate 499.

FIG. 43 is a schematic sectional view of a common nozzle 430 formed by integrating a rinse discharge nozzle and a gas injection nozzle with each other.

In the common nozzle 430 shown in FIG. 43, a nozzle body 431 is provided with a gas supply port 432, a slit gas injection port 433, a rinse supply port 434 and a slit rinse discharge port 435. The gas supply port 432 is connected to the gas supply source system 414 shown in FIG. 33 through a pipe 438. The rinse supply port 434 is connected to the rinse supply source system 417 shown in FIG. 33 through a pipe 439. The developer discharge nozzle 411 may be provided either in front of or at the back of the common nozzle 430 in the scanning direction A3.

According to the common nozzle 430 formed by integrating a rinse discharge nozzle and a gas injection nozzle with each other, the space can be saved.

<Eleventh Embodiment>

FIG. 44 is a plan view of a developing apparatus according to an eleventh embodiment of the present invention. This developing apparatus is different from that according to the tenth embodiment shown in FIG. 32 in the following points:

As shown in FIG. 44, standby pots 406 and 407 are arranged on both ends of an outer cup 405 respectively, and a guide rail 408 is arranged on one side portion of the outer cup 405. A developer nozzle arm 409*d* and a tubular member 420*d* (corresponding to the aforementioned tubular member 420*a*) are provided to be movable m a scanning direction A3 and an opposite direction along the guide rail 408 by an arm driving part 410*d*, and a tubular member 427*d* (corresponding to the tubular member 427*a*) is provided to be movable in the scanning direction A3 and the opposite direction along the guide rail 408 by a driving part 440*d*.

Thus, a developer discharge nozzle 411*d* and a rinse discharge nozzle 416*d* are linearly translatable from the position of the standby pot 406 to the position of the standby pot 407 through a substrate 499 along the scanning direction A3 due to the arm driving part 410*d*, while a gas injection nozzle 412*d* is linearly translatable from the position of the standby pot 406 to the position of the standby pot 407 through the substrate 499 along the scanning direction A3 due to the driving part 440*d*. The developer discharge nozzle 411*d* corresponds to the developer discharge nozzle 411, and the rinse discharge nozzle 416*d* corresponds to the rinse discharge nozzle 416.

According to this embodiment, the arm driving part 410*d* corresponds to a moving element.

Exemplary operations of the developing apparatus shown in FIG. 44 are now described with reference to FIGS. 45A to 45E. FIGS. 45A to 45E are typical process diagrams showing the operations of the developing apparatus shown in FIG. 44.

Figure 45A:
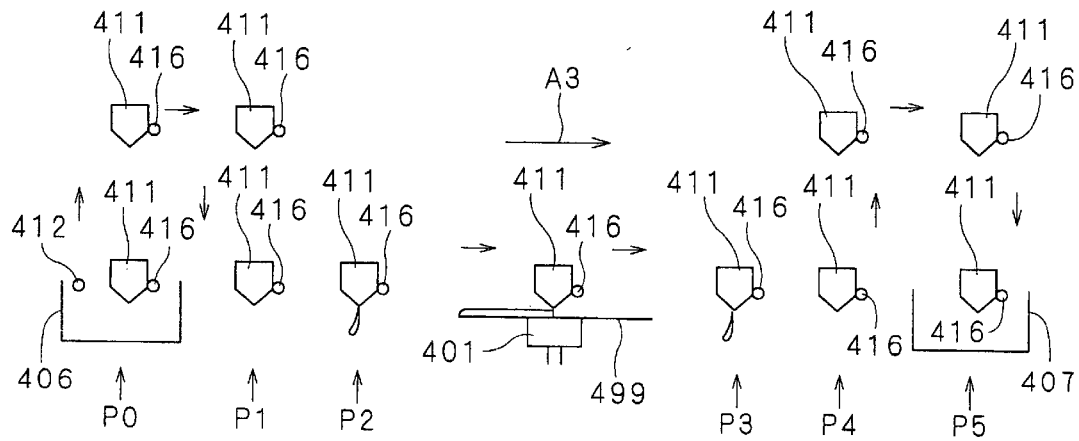
FIGS. 45A to 45E are typical process diagrams showing operations of the developing apparatus shown in FIG. 44.

In development, a substrate holding part 401 holds the substrate 499 in a stationary state. In a standby state, the developer discharge nozzle 411*d* and the rinse discharge nozzle 416*d* stand by on a position P0 in the standby pot 406, as shown in FIG. 45A. In order to supply a developer, the developer discharge nozzle 411d and the rinse discharge nozzle 416d rise, thereafter move in the scanning direction A3 and lower on a scanning start position P1 in the outer cup 405.

Thereafter the developer discharge nozzle 411d and the rinse discharge nozzle 416d start scanning from the scanning start position P1 at a prescribed scanning rate. After the developer discharge nozzle 411d and the rinse discharge nozzle 416d start scanning, the developer discharge nozzle 411d starts discharging the developer on a discharge start position P2 at a prescribed flow rate before a slit discharge port (refer to the discharge port 15 in the aforementioned embodiment) of the developer discharge nozzle 41 id reaches the substrate 499.

The developer discharge nozzle 411d and the rinse discharge nozzle 416d linearly move from the discharge start position P2 on the substrate 499 in the scanning direction A3 while discharging the developer from the developer discharge nozzle 411d. Thus, the developer is continuously supplied to the overall surface of the substrate 499. The supplied developer is held on the substrate 499 by surface tension.

After the developer discharge nozzle 411d and the rinse discharge nozzle 416d pass through the substrate 499, the developer discharge nozzle 411d stops discharging the developer on a discharge stop position P3 out of the substrate 499. The developer discharge nozzle 411d stops scanning when the developer discharge nozzle 411d and the rinse discharge nozzle 416d reach a scanning stop position P4 in the outer cup 405.

Thereafter the developer discharge nozzle 411d and the rinse discharge nozzle 416d rise on the scanning start position P4, thereafter move to a position P5 of the other standby pot 407 and lower in the standby pot 407.

The standby pot 407 washes away the developer adhering to the forward end of the developer discharge nozzle 411d through a detergent nozzle (not shown), and sucks and removes remaining water droplets by a suction nozzle (not shown).

Figure 45B:
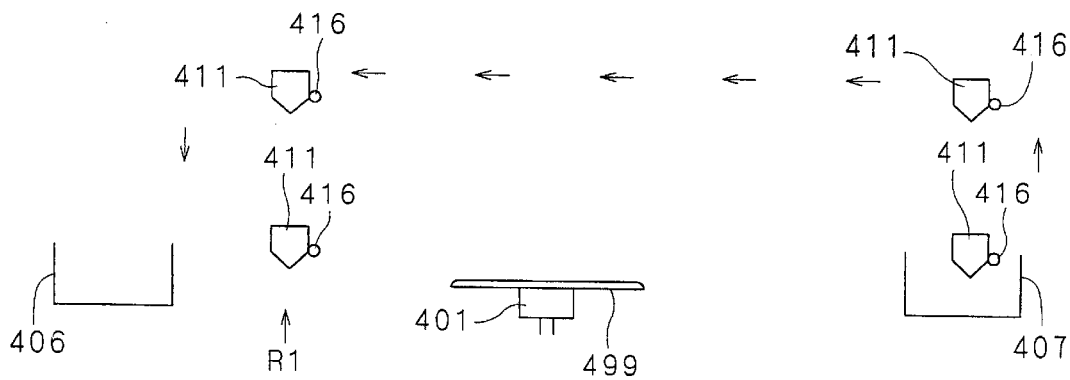

Then, the developer is held on the substrate 499 for a prescribed time (e.g., about 60 seconds), for progressing development of a photosensitive film such as a photoresist film formed on the substrate 499, as shown in FIG. 45B.

The developer discharge nozzle 411d and the rinse discharge nozzle 416b rise from the standby pot 407, move oppositely to the scanning direction A3 and lower on a subsequent scanning start position R1 in the outer cup 405. In this case, the developer discharge nozzle 411d and the rinse discharge nozzle 416b preferably move in a state separating the lower end of the developer discharge nozzle 411d by at least about 3 mm from the surface of the substrate 499, not to come into contact with the developer held on the substrate 499.

Figure 45C:
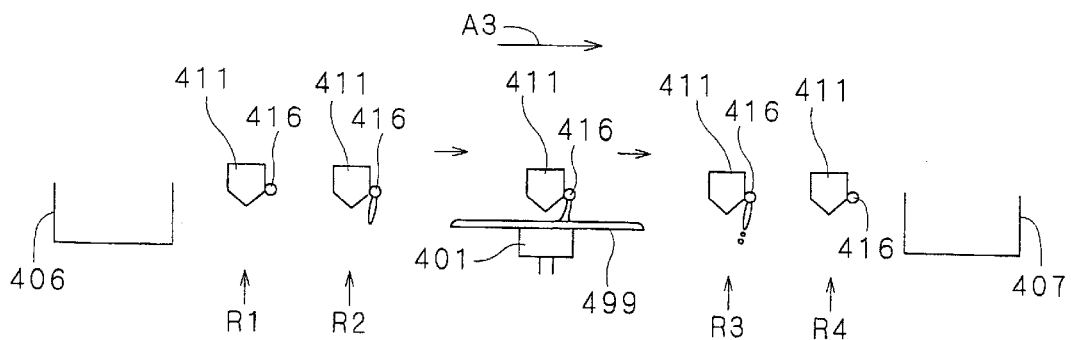

As shown in FIG. 45C, the developer discharge nozzle 411d and the rinse discharge nozzle 416b start scanning from the scanning start position R1 in the scanning direction A3 at a prescribed scanning rate. At this point of time, the rinse discharge nozzle 416d discharges no rinse. The rinse discharge nozzle 416d starts discharging the rinse on a discharge start position R2 at a prescribed flow rate before a slit discharge port (refer to the discharge port 418 in the aforementioned embodiment) of the rinse discharge nozzle 416d reaches the substrate 499. The developer discharge nozzle 411d and the rinse discharge nozzle 416b linearly move on the substrate 499 in the scanning direction A3 from the discharge start position R2 while discharging the rinse from the rinse discharge nozzle 416d. Thus, the rinse is continuously supplied to the overall surface of the substrate 499, thereby stopping development. After the developer discharge nozzle 411d and the rinse discharge nozzle 416b pass through the substrate 499, the rinse discharge nozzle 416b stops discharging the rinse on a discharge stop position R3 out of the substrate 499.

Figure 45D:
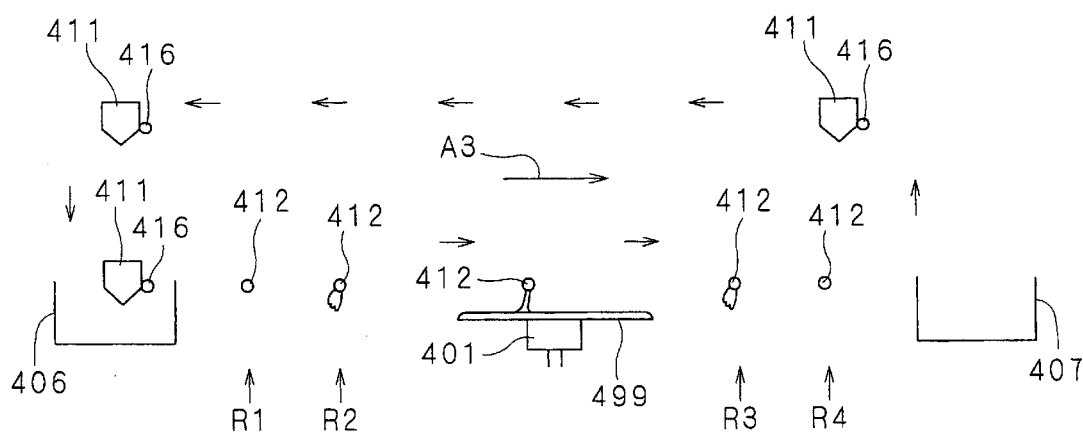

As shown in FIG. 45D, the gas injection nozzle 412d starts scanning from the scanning start position R1 in the scanning direction A3 at a prescribed scanning rate by the driving part 440d to follow the developer discharge nozzle 411d and the rinse discharge nozzle 416b. At this point of time, the gas injection nozzle 412d injects no gas. On the other hand, the developer discharge nozzle 411d and the rinse discharge nozzle 416b rise on a scanning stop position R4, thereafter move oppositely to the scanning direction A3, and lower in the standby pot 406.

The gas injection nozzle 412d starts injecting the gas on the discharge start position R2 at a prescribed flow rate before a slit injection port (refer to the injection port 28 in the aforementioned embodiment) reaches the substrate 499. The gas injection nozzle 412d linearly moves on the substrate 499 in the scanning direction A3 from the discharge start position R2 while injecting the gas from the gas injection port. Thus, the gas is supplied to the overall surface of the substrate 499 for drying the substrate 499.

Figure 45E:
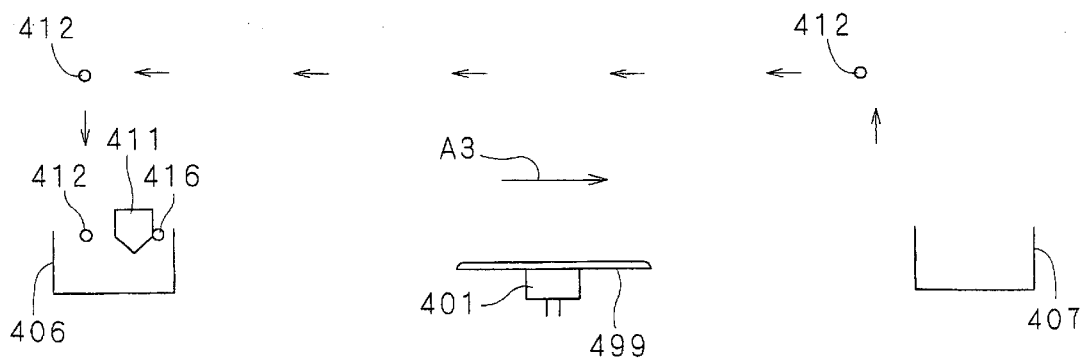

As shown in FIG. 45E, the gas injection nozzle 412d rises on the scanning stop position R4, thereafter moves oppositely to the scanning direction A3, and lowers in the standby pot 406.

Thus, the rinse discharged from the rinse discharge nozzle 416d cleans the surface of the substrate 499, which in turn can be dried through the gas injection nozzle 412d after a lapse of an arbitrary time. The driving part 440d drives the gas injection nozzle 412d, so that the scanning rate of the gas injection nozzle 412d can be controlled independently of the scanning rates of the developer discharge nozzle 411d and the rinse discharge nozzle 416d. In other words, the rinse discharge nozzle 416d preferably scans at the same rate as that for supplying the developer in order to uniformalize the developing time on the overall surface of the substrate 499, and hence the substrate 499 is dried by adjusting the injection rate for the gas when the gas injection nozzle 412d integrally scans with the developer discharge nozzle 411d and the rinse discharge nozzle 416d. According to this embodiment, however, the surface of the substrate 499 can be reliably dried by adjusting the scanning rate of the gas injection nozzle 412d. Consequently, the gas can be efficiently supplied to the substrate 499, whereby production efficiency can be improved.

The scanning start position P1 and the discharge start position P2, the discharge stop position P3 and the scanning stop position P4, the scanning start position R1 and the discharge start position R2 and the discharge stop position R3 and the scanning stop position R4 are not restricted to the above examples but may alternatively be identical to each other respectively. In other words, the developer discharge nozzle 411d may discharge the developer on the scanning start position P1 simultaneously with or before starting scanning from the scanning start position P1. Similarly, the rinse discharge nozzle 416d and the gas injection nozzle 412d may start discharging and injecting the rinse and the gas respectively on the scanning start position R1 simultaneously with or before starting scanning from the scanning start position R1.

While the gas injected from the gas injection port of the gas injection nozzle 412*d* is prepared from nitrogen (N$_2$) in this embodiment, the present invention is not restricted to this but any gas such as compressed air, for example, is employable so far as the same can dry the surface of the substrate 499.

<Twelfth Embodiment>

Figure 46:
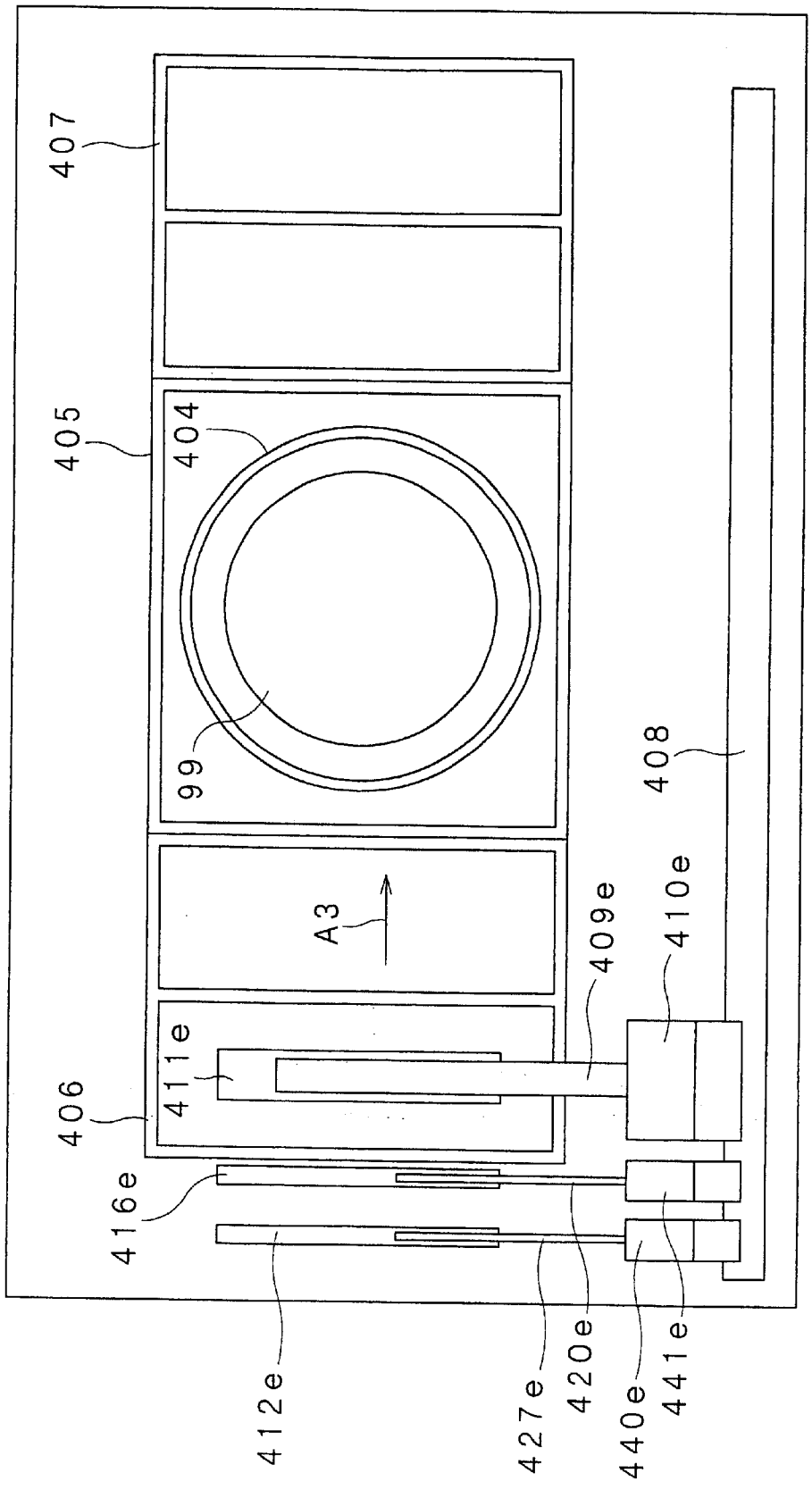
FIG. 46 is a plan view of a developing apparatus according to a twelfth embodiment of the present invention.

FIG. 46 is a plan view of a developing apparatus according to a twelfth embodiment of the present invention. This developing apparatus is different from that according to the tenth embodiment shown in FIG. 32 in the following points:

As shown in FIG. 46, standby pots 406 and 407 are arranged on both ends of an outer cup 405 respectively, and a guide rail 408 is arranged on one side portion of the outer cup 405. A developer nozzle arm 409*e* is provided to be movable in a scanning direction A3 and an opposite direction along the guide rail 408 by an arm driving part 410*e*, a tubular member 420*e* (corresponding to the aforementioned tubular member 420*a*) is provided to be movable in the scanning direction A3 and the opposite direction along the guide rail 408 by a driving part 441*e*, and a tubular member 427*e* (corresponding to the aforementioned tubular member 427*a*) is provided to be movable in the scanning direction A3 and the opposite direction along the guide rail 408 by a driving part 440*e*.

Thus, a developer discharge nozzle 411*e* (corresponding to the developer discharge nozzle 411) is linearly translatable from the position of the standby pot 406 to the position of the standby pot 407 through a substrate 499 along the scanning direction A3 due to the arm driving part 410*e*, a rinse discharge nozzle 416*e* (corresponding to the rinse discharge nozzle 416*a*) is linearly translatable from the position of the standby pot 406 to the position of the standby pot 407 through the substrate 499 along the scanning direction A3 due to the driving part 441*e*, and a gas injection nozzle 412*e* (corresponding to the gas injection nozzle 412*a*) is linearly translatable from the position of the standby pot 406 to the position of the standby pot 407 through the substrate 499 along the scanning direction A3 due to the driving part 440*e*.

According to this embodiment, the arm driving part 410*e* corresponds to a first moving element, the driving part 441*e* corresponds to a second moving element, and the driving part 440*e* corresponds to a third moving element.

Exemplary operations of the developing apparatus shown in FIG. 46 are now described with reference to FIGS. 47A to 47D. FIGS. 47A to 47D are typical process diagrams showing the operations of the developing apparatus shown in FIG. 46.

Figure 47A:
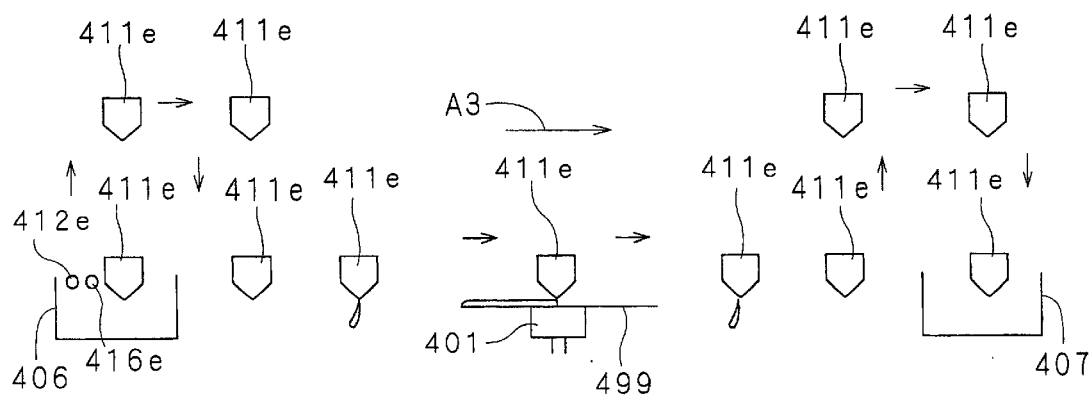
FIGS. 47A to 47D are typical process diagrams showing operations of the developing apparatus shown in FIG. 46.

In development, a substrate holding part 401 holds the substrate 499 in a stationary state. In a standby state, the developer discharge nozzle 411*e*, the rinse discharge nozzle 416*e* and the gas injection nozzle 412*e* stand by on a position P0 in the standby pot 406, as shown in FIG. 47A. In order to supply a developer, the developer discharge nozzle 411*e* rises, thereafter moves in the scanning direction A3 and lowers on a scanning start position P1 in the outer cup 405.

Thereafter the developer discharge nozzle 411*e* starts scanning from the scanning start position P1 at a prescribed scanning rate. After starting scanning, the developer discharge nozzle 411*e* starts discharging the developer on a discharge start position P2 at a prescribed flow rate before a slit discharge port (refer to the aforementioned slit discharge port 415) of the developer discharge nozzle 411*e* reaches the substrate 499.

The developer discharge nozzle 411*e* linearly moves on the substrate 499 in the scanning direction A3 from the discharge start position P2 while discharging the developer. Thus, the developer is continuously supplied to the overall surface of the substrate 499. The supplied developer is held on the substrate 499 by surface tension.

After passing through the substrate 499, the developer discharge nozzle 411*e* stops discharging the developer on a discharge stop position P3 out of the substrate 499. The developer discharge nozzle 411*e* stops scanning when reaching a scanning stop position P4 in the outer cup 405.

Thereafter the developer discharge nozzle 411*e* rises on the scanning start position P4, thereafter moves to a position P5 of the other standby pot 407 and lowers in the standby pot 407.

The standby pot 407 washes away the developer adhering to the forward end of the developer discharge nozzle 411*e* through a detergent nozzle (not shown) and sucks and removes remaining water droplets by a suction nozzle (not shown).

Figure 47B:
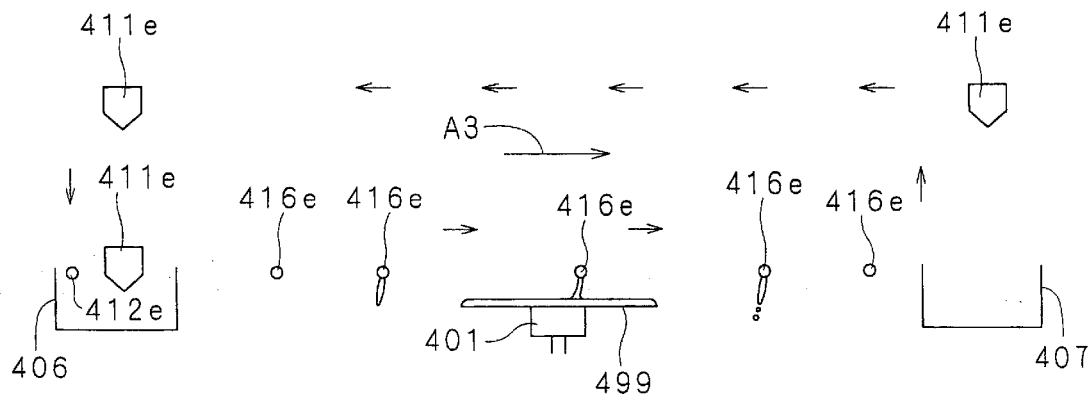

Then, the developer is held on the substrate 499 for a prescribed time (e.g., about 60 seconds), for progressing development of a photosensitive film such as a photoresist film formed on the substrate 499, as shown in FIG. 47B.

In order to supply a rinse, the rinse discharge nozzle 416*e* rises, thereafter moves in the scanning direction A3, and lowers on the scanning start position R1 in the outer cup 405.

Thereafter the rinse discharge nozzle 416*e* starts scanning from the scanning start position R1 at a prescribed scanning rate. After starting scanning, the rinse discharge nozzle 416*e* starts discharging the rinse on a discharge start position R2 at a prescribed flow rate before a slit discharge port (refer to the aforementioned slit discharge port 418) thereof reaches the substrate 499.

The rinse discharge nozzle 416*e* linearly moves on the substrate 499 in the scanning direction A3 from the discharge start position R2 while discharging the rinse. Thus, the rinse is continuously supplied to the overall surface of the substrate 499. The supplied rinse stops development of the substrate 499 with the developer. After passing through the substrate 499, the rinse discharge nozzle 416*e* stops discharging the rinse on a discharge stop position R3 out of the substrate 499.

On the other hand, the developer discharge nozzle 411*e* rises from the standby pot 407, thereafter moves oppositely to the scanning direction A3, and lowers on a position P0 in the outer cup 406. In this case, the developer discharge nozzle 411*e* preferably moves while separating the lower end thereof by at least about 3 mm from the surface of the substrate 499, not to come into contact with the developer held on the substrate 499.

Figure 47C:
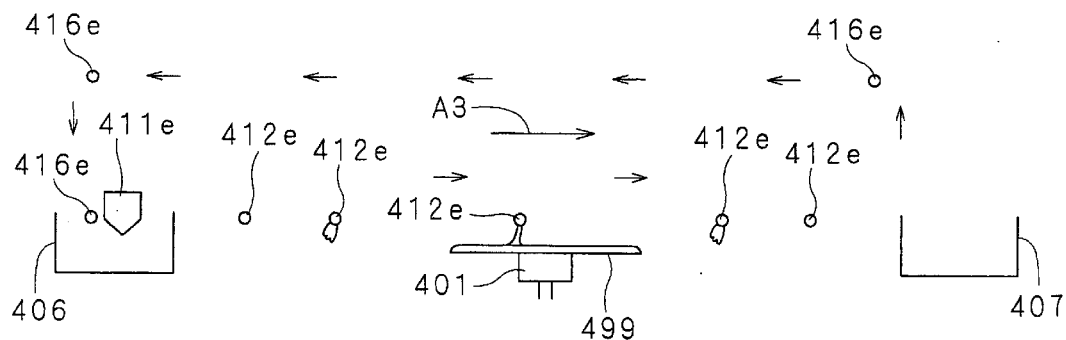

As shown in FIG. 47C, the gas injection nozzle 412*e* starts scanning from the scanning start position R1 in the scanning direction A3 at a prescribed scanning rate by the driving part 440*e* to follow the developer discharge nozzle 411*e* and the rinse discharge nozzle 416*e*. At this point of time, the gas injection nozzle 412*e* injects no gas.

On the other hand, the rinse discharge nozzle 416*e* rises on a scanning stop position R4, thereafter moves oppositely to the scanning direction A3, and lowers in the standby pot 406.

The gas injection nozzle 412*e* starts injecting the gas on the discharge start position R2 at a prescribed flow rate before a slit injection port reaches the substrate 499. The gas injection nozzle 412*e* linearly moves on the substrate 499 in the scanning direction A3 from the discharge start position R2 while injecting the gas from the gas injection port. Thus, the gas is supplied to the overall surface of the substrate 499 for drying the substrate 499.

Figure 47D:
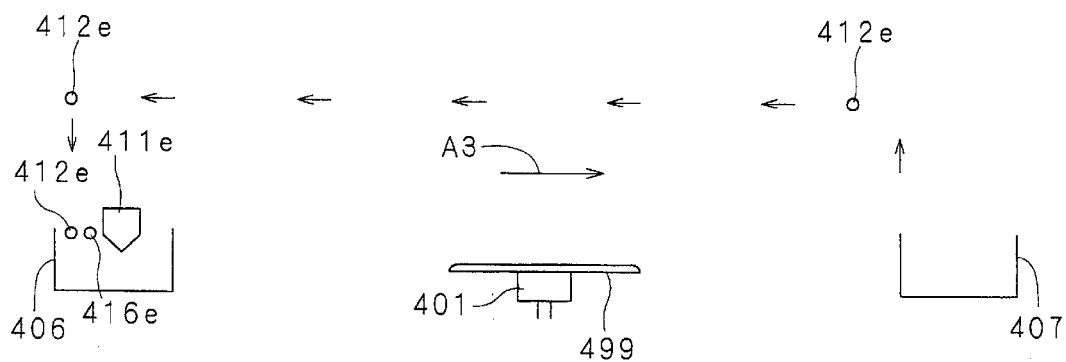
Figure 48A:
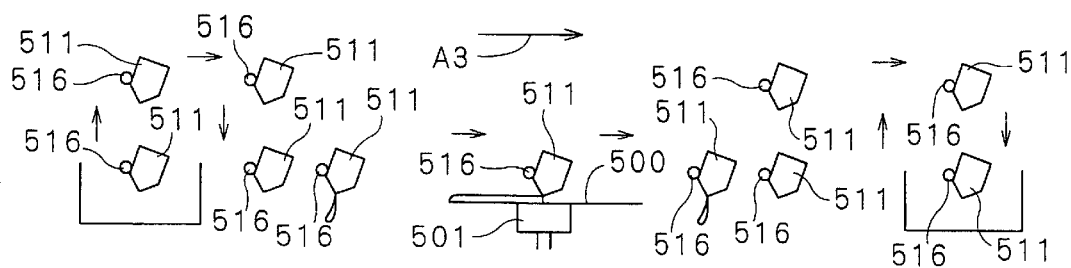
FIGS. 48A to 48E are model diagrams showing exemplary developing steps employing a conventional developing apparatus.
Figure 48B:
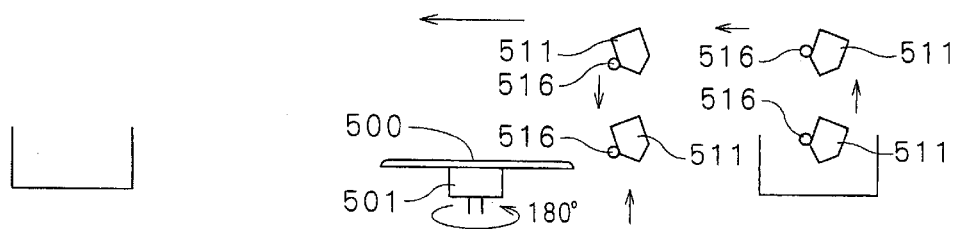
Figure 48C:
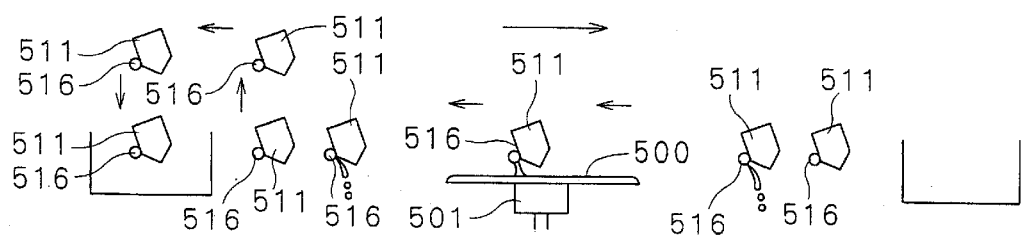
Figure 48D:
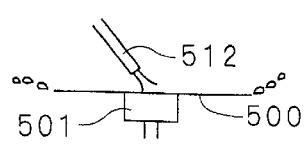
Figure 48E:

As shown in FIG. 47D, the gas injection nozzle 412e rises on the scanning stop position R4, thereafter moves oppositely to the scanning direction A3, and lowers in the standby pot 406.

Thus, the developer discharge nozzle 411e supplies the developer to the surface of the substrate 499, and the rinse discharged from the rinse discharge nozzle 416e after a lapse of a prescribed time cleans the surface of the substrate 499, which in turn can be dried through the gas injection nozzle 412e after a lapse of an arbitrary time.

The driving part 440e drives the gas injection nozzle 412e, so that the scanning rate of the gas injection nozzle 412e can be controlled independently of the scanning rates of the developer discharge nozzle 411e and the rinse discharge nozzle 416e. In other words, the rinse discharge nozzle 416e preferably scans at the same rate as that for supplying the developer in order to uniformalize the developing time on the overall surface of the substrate 499, and hence the scanning rates of the developer discharge nozzle 412e and the rinse discharge nozzle 416e can be identically adjusted. Further, the surface of the substrate 499 can be dried by controlling the scanning rate or the gas injection rate of the gas injection nozzle 412e. Consequently, the gas can be efficiently supplied to the substrate 499, whereby production efficiency can be improved.

The scanning start position P1 and the discharge start position P2, the discharge stop position P3 and the scanning stop position P4, the scanning start position R1 and the discharge start position R2 and the discharge stop position R3 and the scanning stop position R4 are not restricted to the above examples but may alternatively be identical to each other respectively. In other words, the developer discharge nozzle 411e may discharge the developer on the scanning start position P1 simultaneously with or before starting scanning from the scanning start position P1. Similarly, the rinse discharge nozzle 416e and the gas injection nozzle 412e may start discharging and injecting the rinse and the gas respectively on the scanning start position R1 simultaneously with or before starting scanning from the scanning start position R1.

While the gas injected from the gas injection port of the gas injection nozzle 412e is prepared from nitrogen ($N_2$) in this embodiment, the present invention is not restricted to this but any gas such as compressed air, for example, is employable so far as the same can dry the surface of the substrate 499. Further, while the arm driving part 410e and the driving parts 440e and 441e share the guide rail 408 in this embodiment, the present invention is not restricted to this but guide rails may be provided for the driving parts 410e, 440e and 441e respectively.

<Thirteenth Embodiment>

Figure 49:
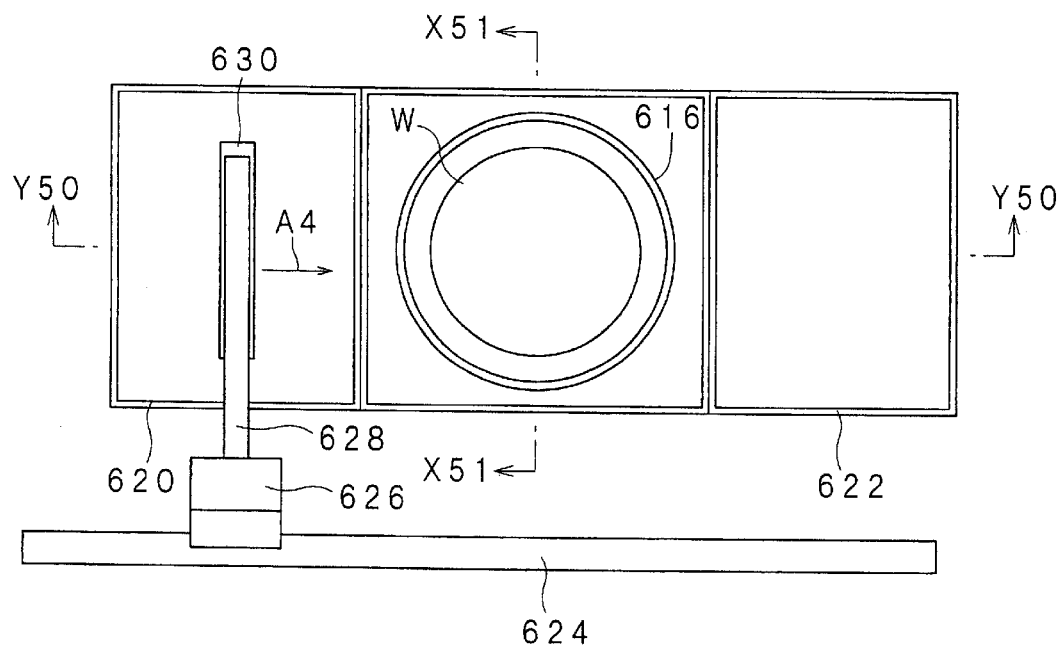
FIG. 49 is a plan view schematically showing the structure of exemplary processing equipment for a substrate according to a thirteenth embodiment of the present invention.
Figure 50:
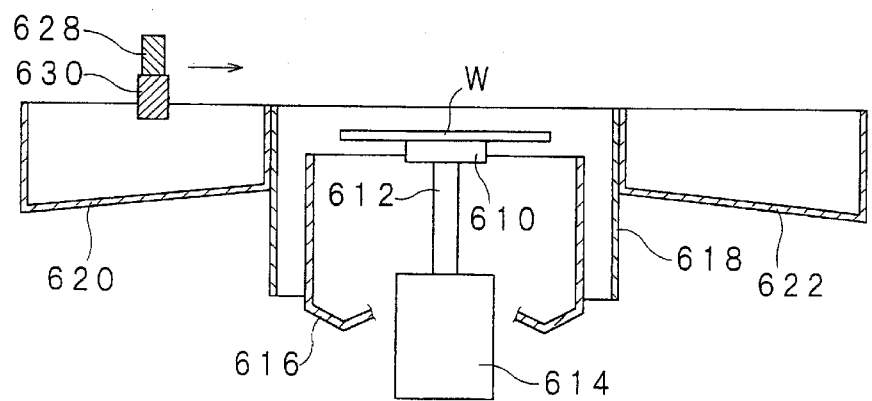
FIG. 50 is a sectional view taken along the line Y50—Y50 in FIG. 49.
Figure 51:
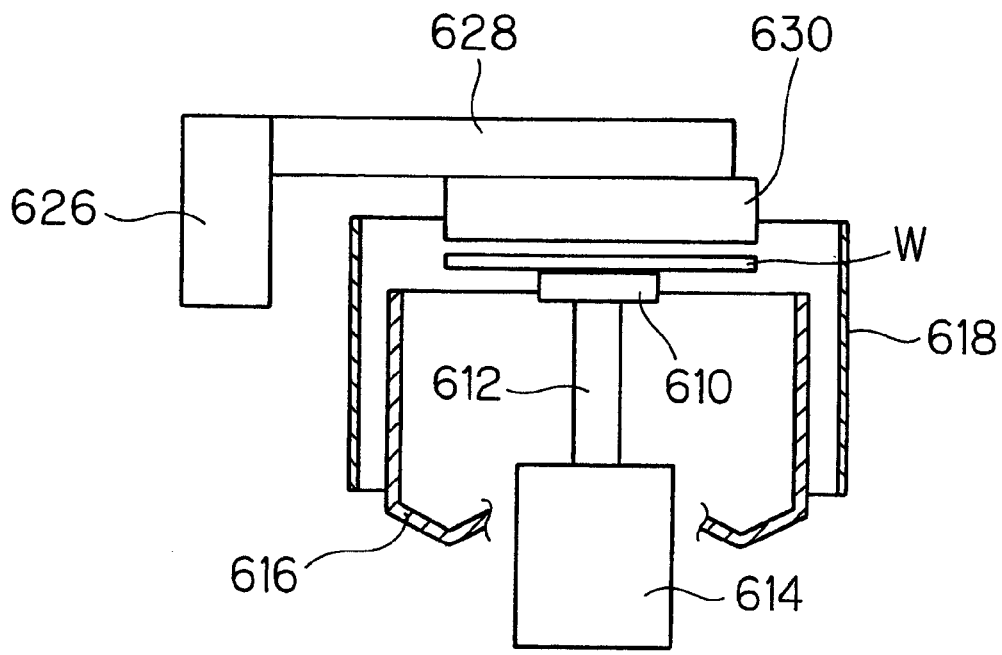
FIG. 51 is a sectional view taken along the line X51—X51 in FIG. 49.
Figure 52:
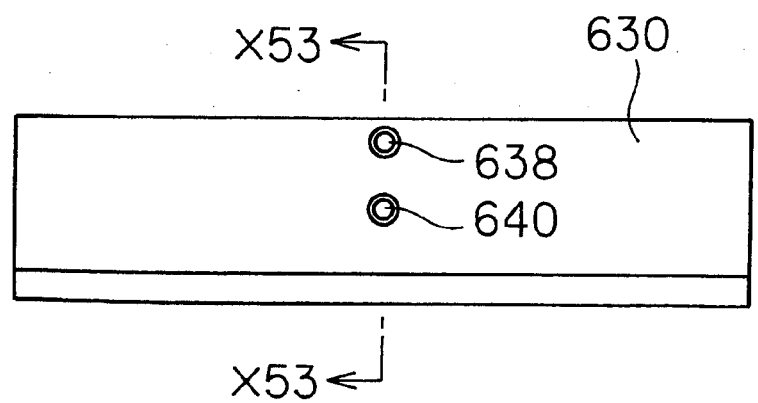
FIG. 52 is a front elevational view showing a solution discharge nozzle forming the processing equipment shown in FIG. 49.

FIG. 49 is a plan view schematically showing the structure of processing equipment for a substrate according to a thirteenth embodiment of the present invention, FIG. 50 is a sectional view taken along the line Y50—Y50 in FIG. 49, and FIG. 51 is a sectional view taken along the line X51—X51 in FIG. 49. FIG. 52 is a front elevational view of a solution discharge nozzle 630 forming the processing equipment, and FIG. 53 is a sectional view of the solution discharge nozzle 630 taken along the line X53—X53 in FIG. 52.

In this processing equipment, a substrate holding part 610 horizontally sucking and holding a substrate W, a vertically supported rotary pivot 612 having an upper end to which the substrate holding part 610 is fixed and a rotary motor 614 having a rotary shaft coupled to the rotary pivot 612 for vertically rotating the substrate holding part 610 and the rotary pivot 612 are arranged at a central portion of the equipment for developing the substrate W. A circular inner cup 616 is arranged around the substrate holding part 610 to enclose the substrate W supported on the substrate holding part 610, to be vertically reciprocative. A rectangular outer cup 618 is arranged around the inner cup 616.

Standby pots 620 and 622 are arranged on both horizontal sides of the outer cup 618 respectively. A guide rail 624 is arranged on single sides of the outer cup 618 and the standby pots 620 and 622 in parallel therewith. An arm driving part 626 holding a nozzle arm 628 is slidably engaged with the guide rail 624. The solution discharge nozzle 630, the detailed structure of which is not shown in FIG. 50, is horizontally suspended on the nozzle arm 628 and arranged in a direction perpendicular to the guide rail 624. The arm driving part 626 horizontally linearly reciprocates the nozzle arm 628 along the guide rail 624 so that the solution discharge nozzle 630 can scan along arrow A4 and oppositely return.

Figure 53:
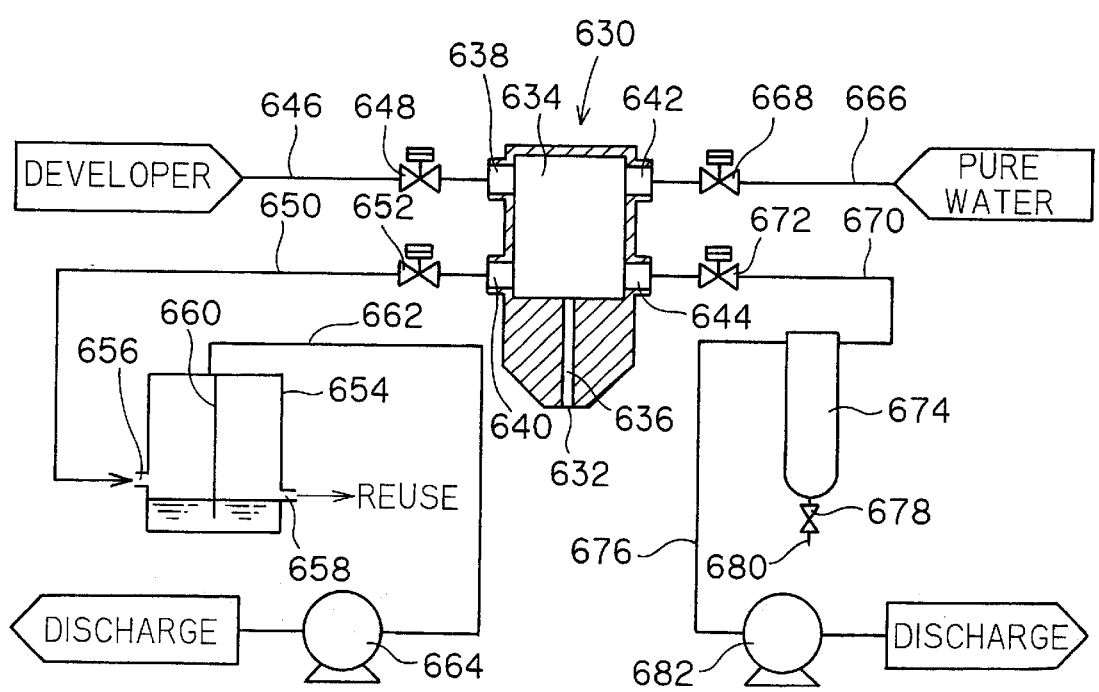
FIG. 53 is a sectional view taken along the line X53—X53 in FIG. 52 for illustrating the solution discharge nozzle along with a pipeline.

As shown in FIGS. 52 and 53, the solution discharge nozzle 630 has a longitudinally extending slit discharge port 632 provided on the lower end surface thereof, a solution reservoir 634 formed on the upper half thereof and a solution passage 636 formed on the lower half with upper and lower ends communicating with the solution reservoir 634 and the slit discharge port 632 respectively. A developer supply port 638 and a developer outlet 640 are formed on an upper end and a central portion on a longitudinal central position of one side surface of the solution discharge nozzle 630. A pure water supply port 642 and a pure water outlet 644 are formed on a longitudinal central position of another side surface of the solution discharge nozzle 630 oppositely to the developer supply port 638 and the developer outlet 640 respectively.

A developer supply pipe 646 connected to a developer supply source is communicatively connected to the developer supply port 638 of the solution discharge nozzle 630, and a switch control valve 648 is interposed in the developer supply pipe 646. A developer recovery pipe 650 is communicatively connected to the developer outlet 640, and a switch control valve 652 is interposed in the developer recovery pipe 650. The developer recovery pipe 650 is communicatively connected to an inlet port 656 of a recovery tank 654. The recovery tank 654 having a closed structure is provided with a developer outlet port 658 downward beyond the inlet port 656. A partition wall 660 hanging from the upper surface of the recovery tank 654 toward a portion close to the inner bottom surface divides the recovery tank 654 into two chambers closer to the inlet port 656 and the developer outlet port 658 respectively. A discharge pipe 662 is connected to the upper portion of the recovery tank 654 to communicate with the chamber closer to the inlet port 656, and a vacuum pump 664 is connected to the discharge pipe 662.

A pure water supply pipe 666 connected to a pure water supply source is communicatively connected to the pure water supply port 642 of the solution discharge nozzle 630, and a switching control valve 668 is interposed in the pure water supply pipe 666. A discharge pipe 670 is communicatively connected to the pure water outlet port 644, and a switching control valve 672 is interposed in the discharge pipe 670. The discharge pipe 670 is connected to an inlet side of a trap 674, while a discharge pipe 676 is connected to an outlet side of the trap 674. A drain discharge pipe 680 having a drain discharge valve 678 interposed therein communicates with the bottom portion of the trap 674. A vacuum pump 682 is connected to the discharge pipe 676. The discharge pipes 662 and the 676 connected to the recovery tank 654 and the trap 674 respectively may be connected to a common vacuum pump, to share this vacuum pump.

A controller (not shown) is provided for controlling operations of the rotary motor 614, the arm driving part 626, the switching control valves 648, 652, 668 and 672 and the vacuum pumps 664 and 682.

Exemplary processing operations of the processing equipment having the aforementioned structure are now described.

When the substrate W formed with an exposed photoresist film on its surface is introduced into the equipment and the substrate holding part 610 holds the substrate W, the switching control valve 648 interposed in the developer supply pipe 646 is opened and the remaining switching control valves 652, 668 and 672 are closed for supplying the developer into the solution reservoir 634 of the solution discharge nozzle 630 from the developer supply source through the developer supply pipe 646, and the solid discharge nozzle 630 scans along arrow A4 by the arm driving part 626 while discharging the developer filling up the solution reservoir 634 onto the substrate W from the slit discharge port 632 through the solution passage 636. Thus, the developer is supplied and heaped on the substrate W. When reaching the position of the right standby pot 622, the solution discharge nozzle 630 moves oppositely to arrow A4 by the arm driving part 626 and returns to the position of the left standby pot 620. The substrate W is held in a stationary state up to a lapse of a prescribed time after the developer is heaped thereon, for developing the photoresist film formed on the surface of the substrate W.

When the solution discharge nozzle 630 reaches the position of the right standby pot 622, the switching control valve 652 interposed in the developer recovery pipe 650 is opened and the remaining switching control valve 648, 668 and 672 are closed while the vacuum pump 664 is driven to suck the unused developer remaining in the solution discharge nozzle 630 thereby egesting the developer. The unused developer egested from the discharge nozzle 630 is introduced into the recovery tank 654 through the developer recovery pipe 650 and stored in the inner bottom portion of the recovery tank 654. The developer stored in the inner bottom portion of the recovery tank 654 is taken out from the developer outlet 658 to be reused.

When the developer remaining in the solution discharge nozzle 630 is recovered, the switching control valve 652 interposed in the developer recovery pipe 650 is closed. Upon a lapse of a prescribed time after heaping the developer on the substrate W, the switching control valve 668 interposed in the pure water supply pipe 666 is opened and the remaining switching control valves 648, 652 and 672 are closed for supplying the pure water (rinse) from the pure water supply source to the solution reservoir 634 of the solution discharge nozzle 630 through the pure water supply pipe 666 and discharging the pure water filling up the solution reservoir 634 onto the substrate W from the slit discharge port 632 through the solution passage 636 while the solution discharge nozzle 630 scans along arrow A4 by the arm driving part 626. Thus, development of the photoresist film formed on the surface of the substrate W is stopped. When reaching the position of the right standby pot 622, the solution discharge nozzle 630 moves oppositely to the direction A4 by the arm driving part 626 again, to return to the position of the left standby pot 620.

When the solution discharge nozzle 630 reaches the position of the right standby pot 622, the switching control valve 672 interposed in the discharge pipe 670 is opened and the remaining switching control valves 648, 652 and 668 are closed while the vacuum pump 682 is driven to suck the pure water remaining in the solution discharge nozzle 630, thereby egesting the pure water from the solution discharge nozzle 630. The pure water egested from the discharge nozzle 630 flows into the trap 674 through the discharge pipe 670, to be stored in the bottom portion of the trap 674. The drain discharge valve 678 is properly opened to egest the pure water stored in the trap 674 through the drain discharge pipe 680.

When the solution discharge nozzle 630 reaches the position of the right standby pot 622, further, the rotary motor 614 is driven to vertically rotate the substrate W held by the substrate holding part 610 in a horizontal plane, thereby drying the substrate W. At this time, the inner cup 616 is moved upward.

When the pure water remaining in the solution discharge nozzle 630 is egested, the switching control valve 672 interposed in the discharge pipe 670 is closed. The switching control valve 648 interposed in the developer supply pipe 646 is opened and the remaining switching control valves 652, 668 and 672 are closed for supplying the developer into the solution reservoir 634 of the solution discharge nozzle 630 from the developer supply source through the developer supply pipe 646 for filling up the solution reservoir 634 with the developer. When the substrate W is completely dried, the rotary motor 614 is stopped for discharging the substrate W from the equipment.

This processing equipment recovers and reuses the unused developer remaining in the solution discharge nozzle 630 as hereinabove described, whereby the consumption of the developer can be reduced. The pure water is supplied to the vacated solution discharge nozzle 630 for filling up the solution discharge nozzle 630 after the developer remaining therein is egested while the developer is supplied to the vacated solution discharge nozzle 630 for filling up the solution discharge nozzle 630 after the pure water remaining in the solution discharge nozzle 630 is egested, whereby neither the pure water nor the developer is wastefully consumed in a considerable quantity for replacement.

<Fourteenth Embodiment>

Figure 54:
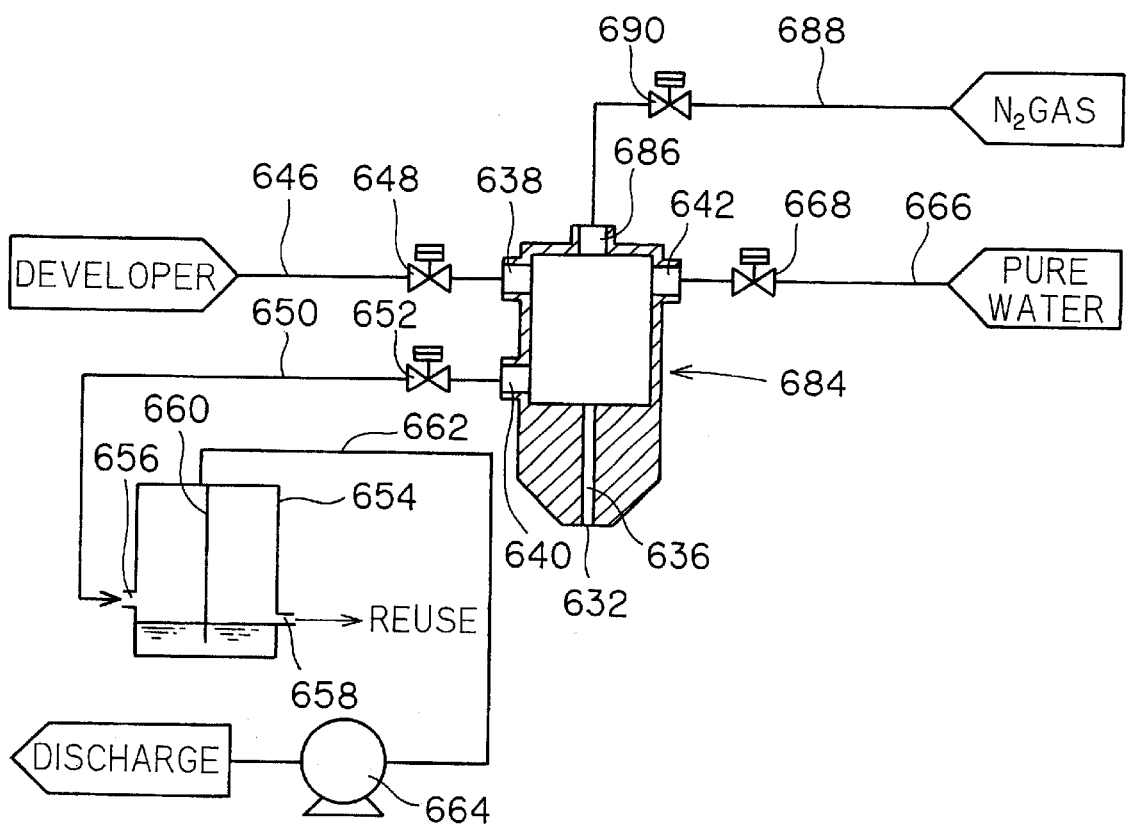
FIG. 54 is a sectional view of a solution discharge nozzle forming processing equipment according to a fourteenth embodiment of the present invention along with a pipeline.

FIG. 54 shows processing equipment according to a fourteenth embodiment of the present invention comprising a pipeline purging a solution discharge nozzle 684 with inert gas such as nitrogen gas, for example, in place of a pipeline vacuum-sucking and egesting pure water from a solution discharge nozzle. Referring to FIG. 54, elements identical to those shown in FIG. 53 are denoted by the same reference numerals, to omit redundant description.

The solution discharge nozzle 684 shown in FIG. 54 is provided with no pure water inlet but a gas inlet 686 is formed on its upper end surface. A purge gas pipe 688 connected to a nitrogen gas supply source is communicatively connected to the gas inlet 686 of the solution discharge nozzle 684, and a switching control valve 690 is interposed in the purge gas pipe 688. A controller (not shown) controls switching operations of the switching control valve 690.

In the processing equipment having the structure shown in FIG. 54, the solution discharge nozzle 684 scans while discharging pure water onto a substrate W from a slit discharge port 632 after heaping a developer on the substrate W, thereby stopping development of a photoresist film formed on the surface of the substrate W. When the solution discharge nozzle 684 reaches the position of a right standby pot 622, the switching control valve 690 interposed in the purge gas pipe 688 is opened and remaining switching control valves 648, 652 and 668 are closed for supplying nitrogen gas into a solution reservoir 634 of the solution discharge nozzle 684 from a nitrogen gas supply source through the purge gas pipe 688 and purging the solution discharge nozzle 684 with the nitrogen gas. Thus, the pure water remaining in the solution discharge nozzle 684 is expelled through the slit discharge port 632. When the pure water remaining in the solution discharge nozzle 684 is egested, the switching control valve 690 interposed in the purge gas pipe 688 is closed. Processing operations other than this process of egesting the pure water are identical to those of the equipment shown in FIG. 53.

While the equipment shown in FIG. 54 is provided with a developer outlet 640 on the solution discharge nozzle 684 so that a developer recovery pipe 650 is connected to the developer outlet 640 for recovering the developer in a recovery tank 654, the developer outlet 640 may not be provided on the solution discharge nozzle 684 but the solution discharge nozzle 684 may be purged with nitrogen gas for egesting the developer remaining in the solution discharge nozzle 684 if the developer may not be recovered in particular.

While the above embodiment has been described with reference to the structure of sucking the developer and the pure water remaining in the solution discharge nozzle 630 with vacuum pumps 664 and 682, the present invention is not restricted to this but the developer and the pure water remaining in the solution discharge nozzle 630 may alternatively be vacuum-sucked through a utility supply vacuum line on a factory side, for example. Vacuum suction may not necessarily be performed but the equipment may comprise a decompressing suction element decompressing the solution discharge nozzle 630 for sucking the developer and the pure water remaining therein.

While the processing equipment comprising the solution discharge nozzle 630 having the slit discharge port 632 on its lower end surface and capable of performing slit scan development and scan rinsing has been described with reference to the above embodiment, the present invention is widely applicable to processing equipment discharging a developer and pure water onto a substrate through a single solution discharge nozzle.

<Comprehensive Description of Fifteenth to Seventeenth Embodiments>

Describing schematic structures of fifteenth to seventeenth embodiments of the present invention, a substrate processing apparatus according to each of the fifteenth to seventeenth embodiments supplies a developer to the main surface of a substrate from a first end to a second end thereof, thereafter supplies a stop bath from the first end to the second end of the main surface of the substrate so that the developing time is substantially identical on the overall main surface of the substrate, and thereafter supplies a detergent to the substrate.

<Fifteenth Embodiment>

The fifteenth embodiment of the present invention is described with reference to a substrate processing apparatus having an element supplying a developer, an element supplying a stop bath and an element supplying a detergent independently of each other.

Figure 55:
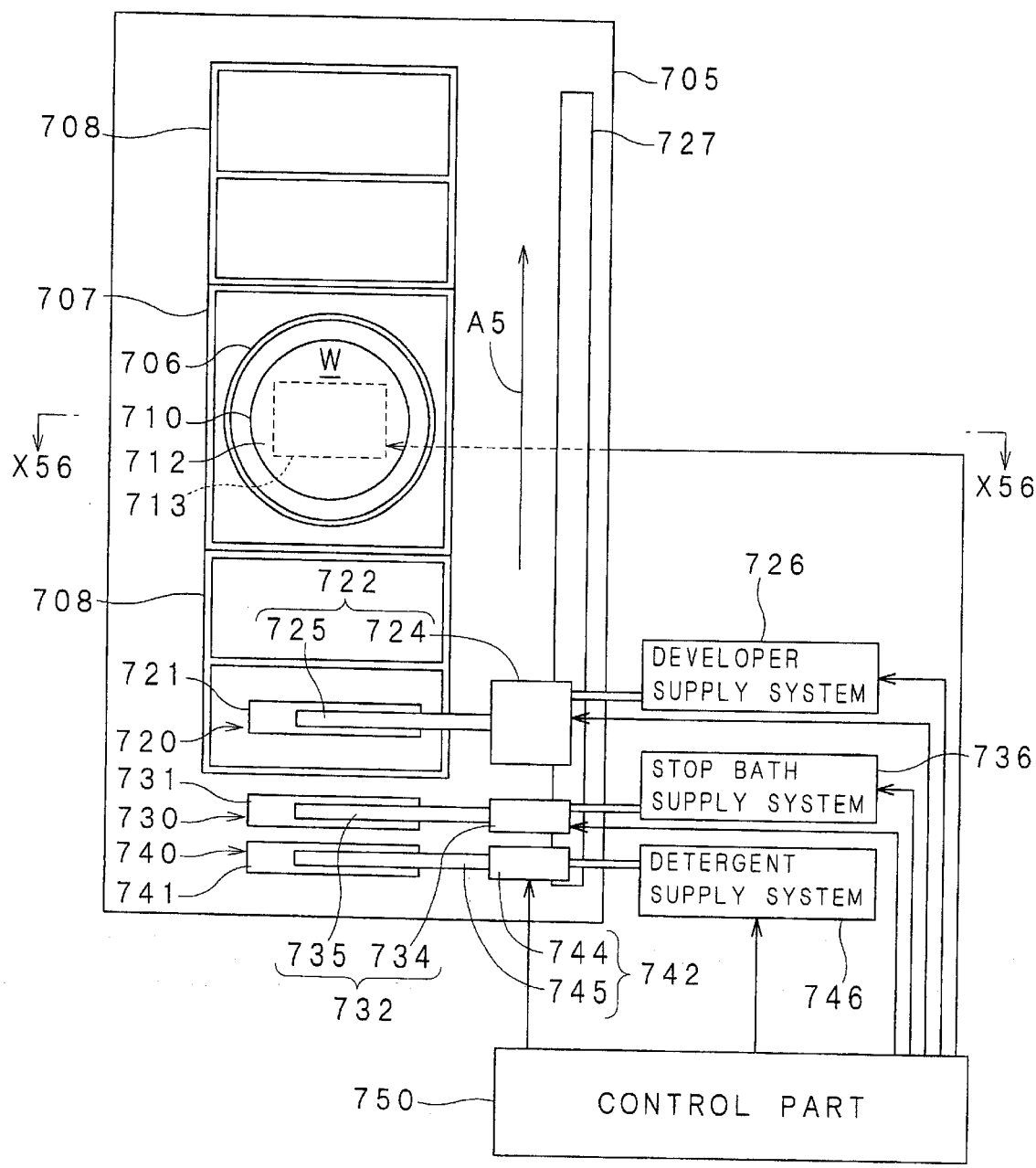
FIG. 55 is a plan view schematically showing the structure of a substrate processing apparatus according to a fifteenth embodiment of the present invention.
Figure 56:
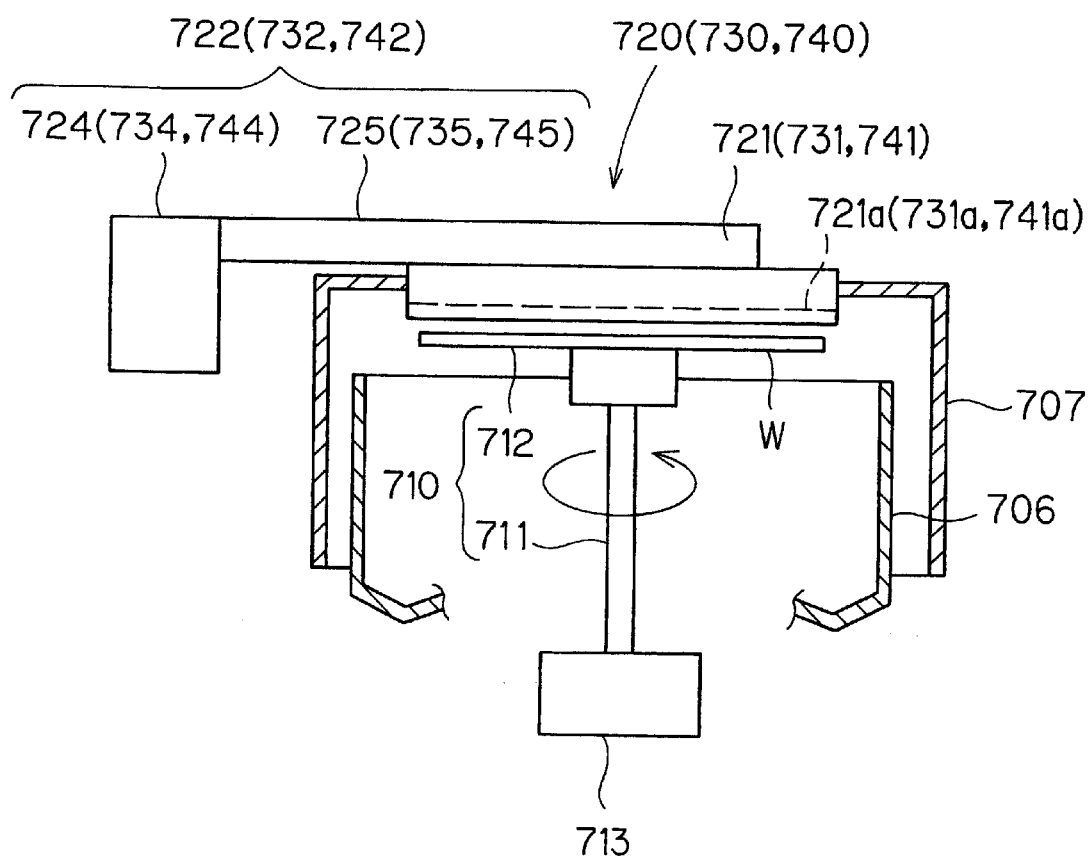
FIG. 56 is a sectional view taken along the line X56—X56 in FIG. 55.

FIG. 55 is a plan view schematically showing the structure of the substrate processing apparatus according to the fifteenth embodiment of the present invention, and FIG. 56 is a sectional view taken along the line X56—X56 in FIG. 55.

This substrate processing apparatus for supplying a developer to an exposed substrate W and developing the same comprises a substrate holding part 710 holding the substrate W, a developer supply element 720 supplying the developer to the main surface of the substrate W, a stop bath supply element 730 supplying a stop bath to the main surface of the substrate W, a detergent supply element 740 supplying a detergent to the main surface of the substrate W, and a control part 750 controlling operations of the overall substrate processing apparatus.

The substrate holding part 710 substantially horizontally holds the substrate W. More specifically, the substrate holding part 710 comprises a rotary shaft 711 substantially vertically arranged at a substantially central portion of a processing apparatus body 705 and a turntable 712 fixed to the upper end of the rotary shaft 711. The turntable 712 is capable of substantially sucking and holding the substrate W. The lower end of the rotary shaft 711 is coupled to a spin motor 713 serving as a rotary element, for transmitting rotation of the spin motor 713 to the turntable 712 therethrough. Thus, the substrate W is rotatable about a vertical axis in a horizontal plane. The turntable 712 is not restricted to the structure of sucking and holding the substrate W, but may alternately grasp the peripheral edge of the substrate W.

A circular inner cup 706 is provided around the substrate holding part 710 to enclose the substrate W, while a substantially square outer cup 707 is provided around the outer periphery of the inner cup 706. Standby pots 708 are provided on both sides of the outer cup 707.

The developer supply element 720 supplies the developer from a first end to a second end of the main surface of the substrate W. More specifically, the developer supply element 720 comprises a developer supply nozzle 721, a developer supply nozzle moving mechanism 722 and a developer supply source system mechanism 726.

The developer supply source system mechanism 726 comprises a developer supply source (not shown) and an on-off valve (not shown), for supplying the developer from the developer supply source to the developer supply nozzle 721 at a prescribed timing described later in response to the on/off timing of the on/off valve.

The developer supply nozzle 721 has a slit discharge port 721a having a width substantially identical to the diameter of the substrate W (see FIG. 56). The developer supply nozzle 721 discharges the developer supplied from the developer supply source system 726 through the full width of the discharge port 721a. The width of the discharge port 721a may be larger than that of the substrate W.

The developer supply nozzle moving mechanism 722 comprises a guide rail 723, a horizontal driving part 724 and a support arm part 725. The guide rail 723 is horizontally provided on the upper surface of the processing apparatus body 705 on a side portion of the substrate holding part 710. The horizontal driving part 724 is horizontally slidable in a prescribed scanning direction A5 and an opposite direction along the guide rail 723. The horizontal driving part 724 supports the support arm part 725 in a cantilever manner to extend toward the substrate holding part 710, for substantially horizontally supporting the developer supply nozzle 721 in a direction perpendicular to the scanning direction A5 on its free end.

The horizontal driving part 724 renders the developer supply nozzle 721 movable from the first end toward the second end above the main surface of the substrate W. When moving above the substrate W, the developer supply nozzle 721 discharges the developer for supplying the developer to the overall main surface of the substrate W.

The stop bath supply element 730 supplies the stop bath from the first end to the second end of the main surface of the substrate W.

More specifically, the stop bath supply element 730 comprises a stop bath supply nozzle 731, a stop bath supply nozzle moving mechanism 732 and a stop bath supply source system mechanism 736, and supplies the stop bath by a structure and operations similar to those of the aforementioned developer supply element 720.

The stop bath supply system source mechanism 736 supplies the stop bath at a prescribed timing described later by a structure similar to that of the developer supply source system mechanism 726. The stop bath supply source system mechanism 736 supplies a solution stopping development with the developer on the substrate W. In general, the stop bath supply source system mechanism 736 supplies a rinse (pure water) by a quantity capable of diluting the developer on the substrate W and stopping development, thereby stopping the development.

The stop bath supply nozzle 731 has a slit discharge port 731a having a width substantially identical to the diameter of the substrate W. The width of the discharge port 731a may be lager than the diameter of the substrate W.

The stop bath supply nozzle moving mechanism 732, similar in structure to the aforementioned developer supply nozzle moving mechanism 722, comprises a horizontal driving part 734 corresponding to the aforementioned horizontal driving part 724 and a support arm part 735 corresponding to the aforementioned support arm part 725.

When driven by the horizontal driving part 734 to move above the substrate W, the stop bath supply nozzle 731 discharges the stop bath, thereby supplying the stop bath to the overall main surface of the substrate W.

The detergent supply element 740 supplies the detergent to the main surface of the substrate W.

More specifically, the detergent supply element 740 comprises a detergent supply nozzle 741, a detergent supply nozzle moving mechanism 742 and a detergent supply source system mechanism 746, and supplies the detergent by a structure and operations similar to those of the aforementioned developer supply element 720.

The detergent supply source system mechanism 746 supplies the detergent at a prescribed timing described later by a structure similar to that of the developer supply source system mechanism 726. The detergent supply source system mechanism 746 supplies a solution capable of washing away particles or the like from the substrate W and sufficiently cleaning the substrate W. In general, the detergent supply source system mechanism 746 supplies a rinse (pure water) for performing cleaning. This rinse is preferably supplied in a larger quantity than that supplied for stopping development, in order to improve the cleaning effect.

The detergent supply nozzle 741 has a slit discharge port 741a having a width substantially identical to the diameter of the substrate W. The width of the discharge port 741a may be larger than the diameter of the substrate W.

The detergent supply nozzle moving mechanism 742, similar in structure to the aforementioned developer supply nozzle moving mechanism 722, comprises a horizontal driving part 744 corresponding to the aforementioned horizontal driving part 724 and a support arm part 745 corresponding to the aforementioned support arm part 725.

When driven by the horizontal driving part 744 to move above the substrate W, the detergent supply nozzle 741 discharges the detergent for supplying the detergent to the overall main surface of the substrate W.

In an initial standby state of the substrate processing apparatus, the developer supply nozzle 721, the stop bath supply nozzle 731 and the detergent supply nozzle 741 are arranged in this order in a prescribed scanning direction A5. The developer supply nozzle 721, the stop bath supply nozzle 731 and the detergent supply nozzle 741 can pass above the substrate W in this order.

While the developer supply nozzle moving mechanism 722, the stop bath supply nozzle moving mechanism 732 and the detergent supply nozzle moving mechanism 742 move along the common guide rail 723 in this embodiment, the developer supply nozzle moving mechanism 722, the stop bath supply nozzle moving mechanism 732 and the detergent supply nozzle moving mechanism 742 may alternatively move along different guide members, and are not restricted to the above ones.

The control part 750 controlling the overall substrate processing apparatus comprises a CPU, a ROM, a RAM and the like, and is formed by a general microcomputer performing prescribed arithmetic operations by a previously stored software program.

The control part 750 controlling a series of operations described later at least performs operation control of making the detergent supply element 740 supply the detergent to the main surface of the substrate W after supplying the stop bath to the substrate W.

The operations of the substrate processing apparatus are now described with reference to FIGS. 57A to 57E.

Figure 57A:
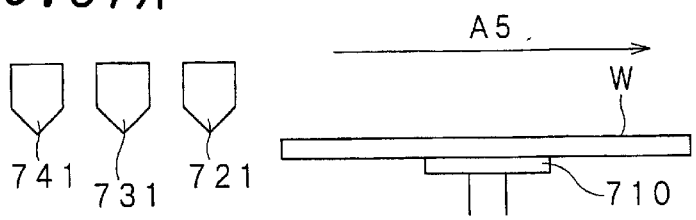
FIGS. 57A to 57E are schematic process diagrams showing operations of the substrate processing apparatus according to the fifteenth embodiment of the present invention.

In the initial standby state, the substrate holding part 710 horizontally supports the substrate W in a stationary state, as shown in FIG. 57A. The developer supply nozzle 721, the stop bath supply nozzle 731 and the detergent supply nozzle 741 are located on the first end of the substrate W (upstream the scanning direction A5).

Figure 57B:
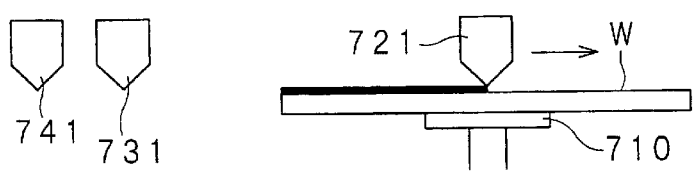

After starting processing, the developer supply nozzle 721 moves in the scanning direction A5 from the first end toward the second end of the substrate W above the main surface of the substrate W, as shown in FIG. 57B. When moving above the main surface of the substrate W, the developer supply nozzle 721 discharges the developer and supplies the same to the overall main surface of the substrate W. Thus, the main surface of the substrate W is developed.

Figure 57C:
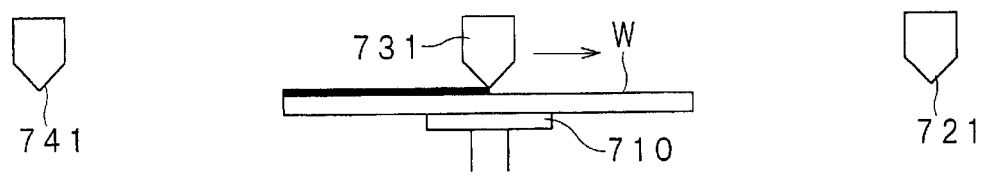

After the developer supply nozzle 721 passes through the main surface of the substrate W, the stop bath supply nozzle 731 moves in the scanning direction A5 from the first end toward the second end of the substrate W above the main surface of the substrate W in response to a timing when a prescribed time necessary for development of the substrate W elapses, as shown in FIG. 57C. The speed of movement of the stop bath supply nozzle 731 is rendered substantially identical to that of the developer supply nozzle 721. When passing through the main surface of the substrate W, the stop bath supply nozzle 731 discharges the stop bath for supplying the stop bath to the overall main surface of the substrate W and stopping development of the substrate W.

Thus, the stop bath is supplied to the main surface of the substrate W in the same mode (direction and speed) as the developer so that the developing time can be rendered substantially identical on the overall main surface of the substrate W.

Figure 57D:
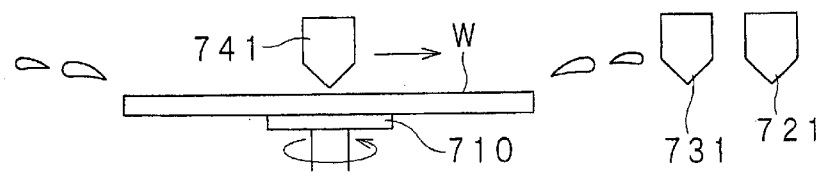

After the stop bath supply nozzle 731 passes through the main surface of the substrate W, the detergent supply nozzle 741 moves in the scanning direction A5 from the first end toward the second end of the substrate W above the main surface of the substrate W, as shown in FIG. 57D. When passing the main surface of the substrate W, the detergent supply nozzle 741 discharges the detergent while the substrate W is rotated. Thus, the detergent is supplied to the overall main surface of the rotated substrate W, for sufficiently removing particles.

Figure 57E:
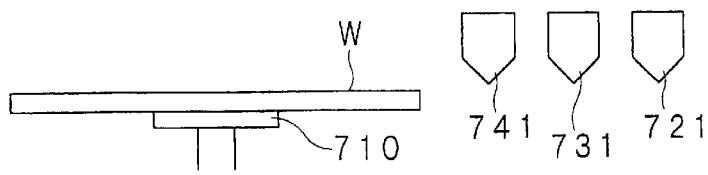

Finally, the developer supply nozzle 721, the stop bath supply nozzle 731 and the detergent supply nozzle 741 are located on the second end of the substrate W (downstream the scanning direction A5) as shown in FIG. 57E, to complete the series of processing.

The substrate processing apparatus having the aforementioned structure supplies the stop bath for stopping development of the substrate W and thereafter supplies the detergent to the substrate W, whereby the substrate W supplied with the stop bath can be sufficiently cleaned.

The detergent supply nozzle 741 having the discharge port 741a having the dimension substantially identical to the diameter of the substrate W moves from the first end toward the second end of the substrate W for supplying the detergent, whereby the detergent is not concentrically supplied to local positions of the substrate W and hence a large quantity of detergent can be supplied to the overall main surface of the substrate with low impact, for preventing collapse of a fine pattern or the like.

Further, the substrate W is rotated when supplied with the detergent, whereby the cleaning effect is further improved.

<Sixteenth Embodiment>

The sixteenth embodiment of the present invention is described with reference to a structure having elements supplying a stop bath and a detergent sharing a rinse supply element while the rinse supply element and a developer supply element are moved by different mechanisms. In description of the sixteenth embodiment, elements similar to those of the substrate processing apparatus according to the aforementioned fifteenth embodiment are denoted by the same reference numerals, to omit redundant description.

Figure 58:
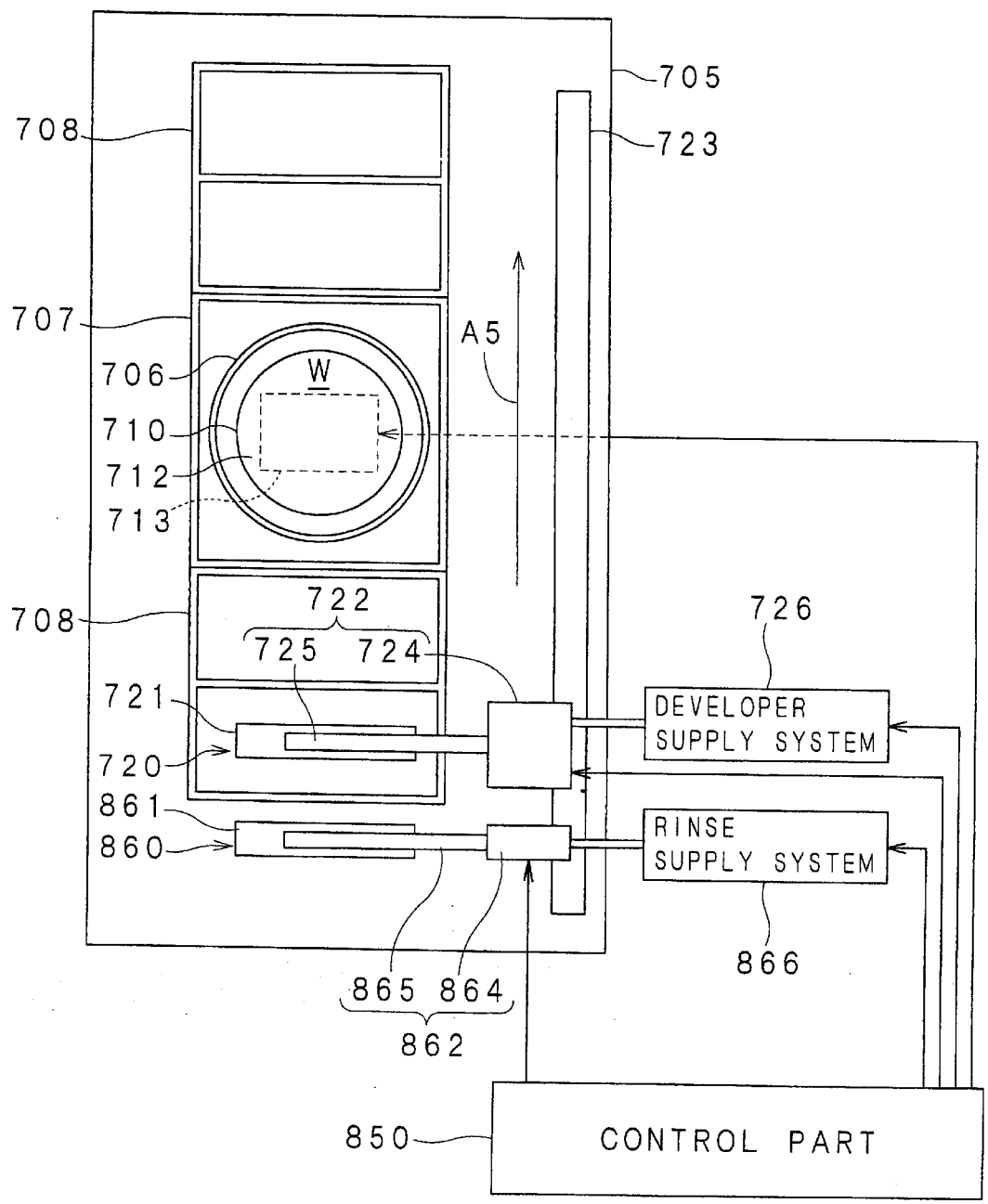
FIG. 58 is a plan view schematically showing the structure of a substrate processing apparatus according to a sixteenth embodiment of the present invention.

FIG. 58 is a plan view schematically showing the structure of a substrate processing apparatus according to the sixteenth embodiment of the present invention.

This substrate processing apparatus has a rinse supply element 860 in place of the stop bath supply element 730 and the detergent supply element 740 in the substrate processing apparatus according to the aforementioned fifteenth embodiment.

The rinse supply element 860 comprises a rinse supply nozzle 861, a rinse supply nozzle moving mechanism 862 and a rinse supply source system mechanism 866.

The rinse supply source system mechanism 866 supplies a rinse at a prescribed timing described later by a structure similar to that of the developer supply source system mechanism 726 described with reference to the fifteenth embodiment. The quantity of the rinse is adjusted by opening adjustment of a valve.

When serving as a stop bath supply element, the rinse supply element 860 generally supplies a rinse (pure water) by a quantity capable of diluting a developer on a substrate W and stopping development thereof. Also when serving as a detergent supply element, the rinse supply element 860 supplies the rinse (pure water) as a detergent. The quantity of the rinse for cleaning is preferably larger than that supplied for stopping the aforementioned development, in order to improve the cleaning effect.

The rinse supply nozzle 861 has a slit discharge port (not shown) having a width substantially identical to the diameter of the substrate W. The width of the discharge port may be larger than the diameter of the substrate W.

The rinse supply nozzle moving mechanism 862, similar in structure to the developer supply nozzle moving mechanism 722 described with reference to the fifteenth embodiment, comprises a horizontal driving part 864 corresponding to the aforementioned horizontal driving part 724 and a support arm part 865 corresponding to the aforementioned support arm pat 725.

When driven by the horizontal driving part 864 to move above the substrate W, the rinse supply nozzle 861 supplies the rinse to the overall main surface of the substrate W as the stop bath or the detergent.

While a developer supply nozzle moving mechanism 722 and the rinse supply nozzle moving mechanism 862 move along a common guide rail 723 in this embodiment, the developer supply nozzle moving mechanism 722 and the rinse supply nozzle moving mechanism 862 may alternatively move along different guide members, and are not restricted to the above ones.

In this substrate processing apparatus, a control part 850 controlling a series of operations described later at least performs operation control of making the rinse supply nozzle 861 supply the rinse to the substrate W as a stop bath after supplying the developer to the substrate W and thereafter supply the rinse to the substrate W as a detergent.

The operations of the substrate processing apparatus having the aforementioned structure are now described with reference to FIGS. 59A to 59E.

Figure 59A:
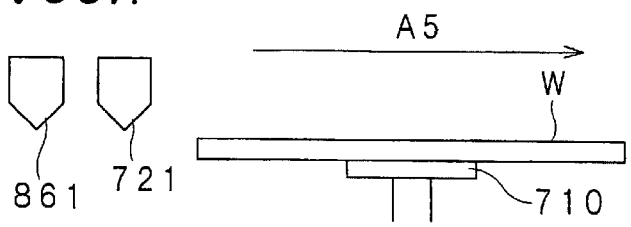
FIGS. 59A to 59E are schematic process diagrams showing operations of the substrate processing apparatus according to the sixteenth embodiment of the present invention.

In an initial standby state, a substrate holding part 710 horizontally supports the substrate W in a stationary state, as shown in FIG. 59A. The developer supply nozzle 721 and the rinse supply nozzle 861 are located on a first end of the substrate W (upstream a scanning direction A5).

Figure 59B:
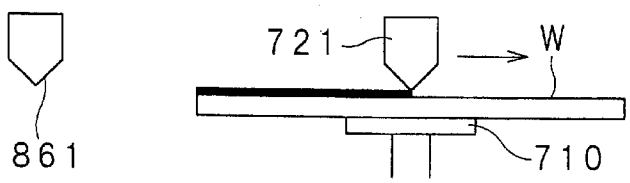

After starting processing, the developer supply nozzle 721 first supplies the developer to the overall main surface of the substrate W, as shown in FIG. 59B. This operation is similar to that shown in FIG. 57B.

Figure 59C:
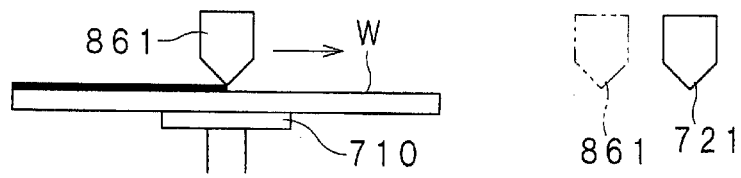

Upon a lapse of a prescribed time necessary for development of the substrate W after the developer supply nozzle 721 passes through the main surface of the substrate W, the rinse supply nozzle 861 moves in the scanning direction A5 from the first end toward a second end of the substrate W above the main surface of the substrate W, as shown in FIG. 59C. At this time, the speed of movement of the rinse supply nozzle 861 is set substantially identical to that of the developer supply nozzle 721. The rinse supply nozzle 861 supplies the rinse by a relatively small quantity sufficient for stopping development. Thus, development of the substrate W can be stopped while rendering the developing time substantially identical on the overall main surface of the substrate W. Thereafter the rinse supply nozzle 861 is temporarily located downstream the scanning direction A5 (refer to two-dot chain lines in FIG. 59C).

Figure 59D:
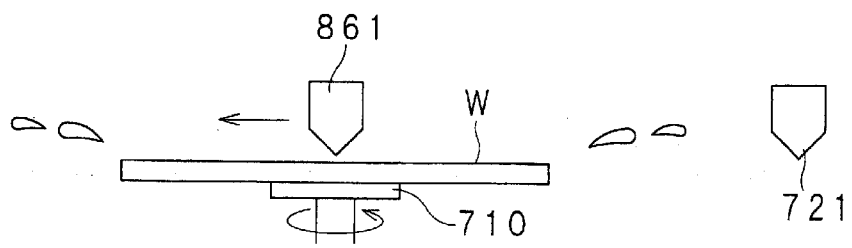

Thereafter the rinse supply nozzle 861 moves oppositely to the scanning direction A5 from the second end toward the first end of the substrate W above the main surface of the substrate W, as shown in FIG. 59D. When passing above the main surface of the substrate W, the rinse supply nozzle 861 discharges the rinse as a detergent while the substrate W is rotated. Thus, the detergent is supplied to the overall main surface of the rotated substrate W, for sufficiently removing particles.

Figure 59E:
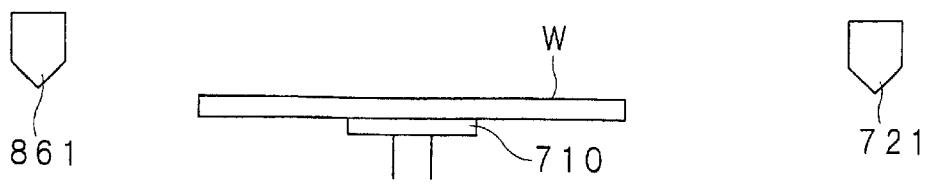

Finally, the developer supply nozzle 721 is located on the second end of the substrate W (downstream the scanning direction A5) and the rinse supply nozzle 861 is located on the first end of the substrate W (upstream the scanning direction A5) as shown in FIG. 59E, for completing the series of operations.

In the substrate processing apparatus having the aforementioned structure, effects similar to those in the aforementioned fifteenth embodiment are attained while the stop bath supply element and the detergent supply element share the rinse supply nozzle 861 and the rinse supply nozzle moving mechanism 862, and hence the structure is simplified.

<Seventeenth Embodiment>

The seventeenth embodiment is described with reference to such a structure that elements supplying a stop bath and a detergent respectively share a rinse supply element while the same mechanism moves a rinse supply nozzle related to the rinse supply element and a developer supply nozzle related to a developer supply element. In the seventeenth embodiment, elements similar to those of the substrate processing apparatus according to the aforementioned fifteenth embodiment are denoted by the same reference numerals, to omit redundant description.

Figure 60:
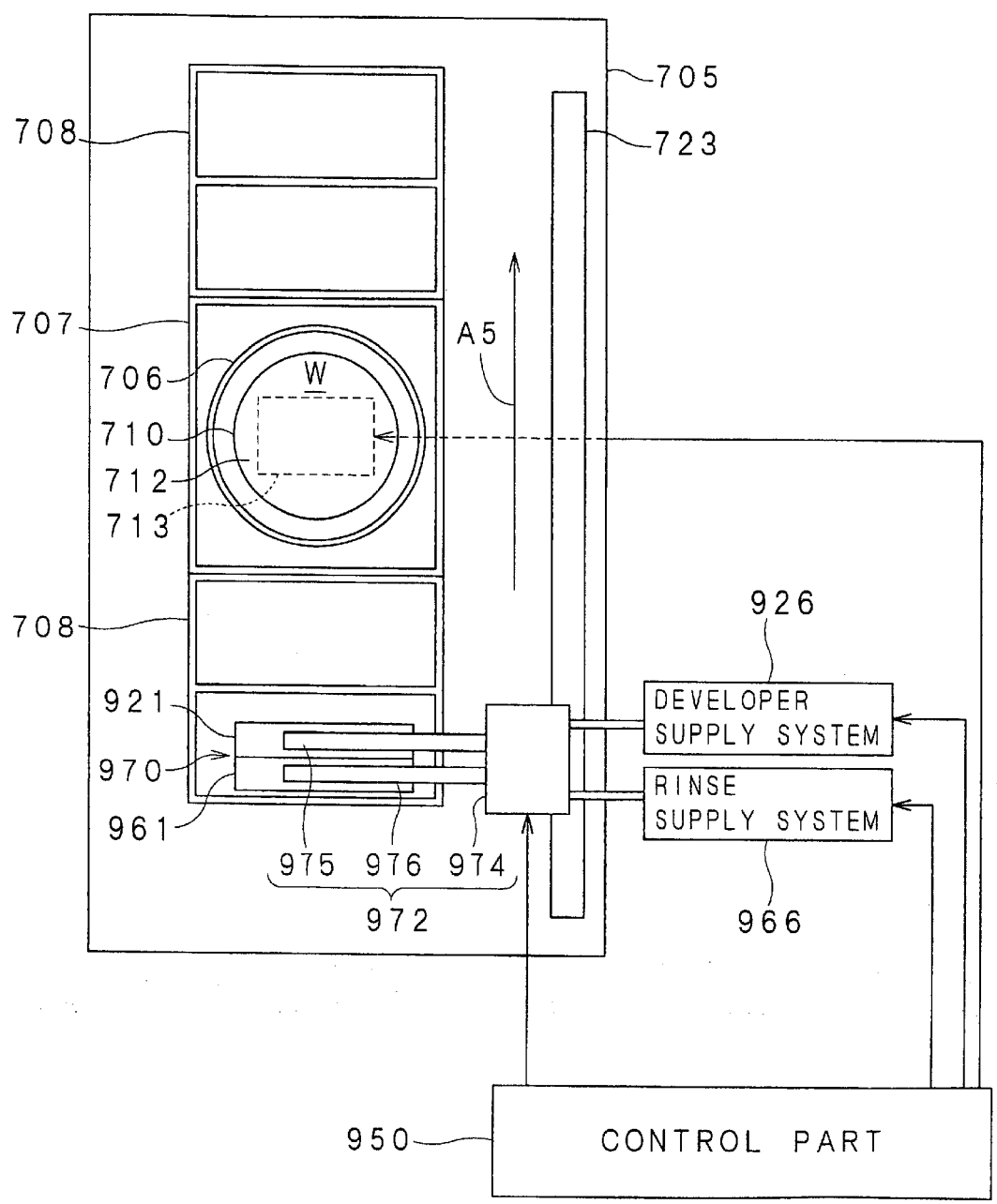
FIG. 60 is a plan view schematically showing the structure of a substrate processing apparatus according to a seventeenth embodiment of the present invention.

FIG. 60 is a plan view schematically showing the structure of a substrate processing apparatus according to the seventeenth embodiment of the present invention.

This substrate processing apparatus has a processing solution supply element 970 in place of the developer supply element 720 and the stop bath supply element 730 in the substrate processing apparatus according to the aforementioned fifteenth embodiment.

The processing solution supply element 970 comprises a developer supply nozzle 921 and a developer supply source system mechanism 926 as a mechanism related to supply of a developer as well as a rinse supply nozzle 961 and a rinse supply source system mechanism 966 as a mechanism related to supply of a rinse, while comprising a single nozzle moving mechanism 972.

The aforementioned developer supply nozzle 921 has a structure similar to that of the developer supply nozzle 721 described with reference to the fifteenth embodiment, while the developer supply source system mechanism 926 can supply the developer to the developer supply nozzle 921 at a prescribed timing due to a structure similar to that of the developer supply source system mechanism 726 described with reference to the fifteenth embodiment.

The rinse supply nozzle 961 has a structure similar to that of the rinse supply nozzle 861 described with reference to the sixteenth embodiment, while the rinse supply source system mechanism 966 can supply a prescribed quantity of the rinse as a stop bath or a detergent at a prescribed timing due to a structure similar to that of the rinse supply source system mechanism 866 described with reference to the sixteenth embodiment. The rinse for cleaning is preferably supplied in a lager quantity than that for stopping development, in order to improve the cleaning effect.

The nozzle moving mechanism 972, similar in structure to the developer supply nozzle moving mechanism 722, comprises a horizontal driving part 974 corresponding to the aforementioned horizontal driving part 724 and two support arm parts 975 and 976 each corresponding to the aforementioned support arm part 725. The support arm part 975 located downstream a scanning direction A5 substantially horizontally supports the developer supply nozzle 921 along a direction perpendicular to the scanning direction A5, while the support arm part 976 located upstream the scanning direction A5 substantially horizontally supports the rinse supply nozzle 961 along the direction perpendicular to the scanning direction A5.

The developer supply nozzle 921 supplies the developer to a substrate W when driven by the horizontal driving part 974 to move above the substrate W, or the rinse supply nozzle 961 supplies the rinse to the overall surface of the substrate W as the stop bath or the detergent when moving above the substrate W.

In this substrate processing apparatus, a control part 950 controlling a series of operations described later at least performs operation control of moving the developer supply nozzle 921 from a first end toward a second end above the main surface of the substrate W for supplying the developer to the substrate W, thereafter moving the rinse supply nozzle 961 from the first end toward the second end above the main surface of the substrate W for supplying the rinse to the substrate W as the stop bath and thereafter moving the rinse supply nozzle 961 above the main surface of the substrate W again for supplying the rinse as the detergent.

Operations of the substrate processing apparatus having the aforementioned structure are described with reference to FIGS. 61A to 61F.

Figure 61A:
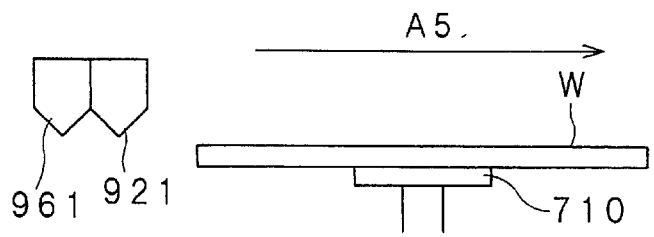
FIGS. 61A to 61F are schematic process diagrams showing operations of the substrate processing apparatus according to the seventeenth embodiment of the present invention.

In an initial standby state, a substrate holding part 710 horizontally supports the substrate W in a stationary state, as shown in FIG. 61A. The developer supply nozzle 921 and the rinse supply nozzle 961 are located on the first end of the substrate W (upstream the scanning direction A5).

Figure 61B:
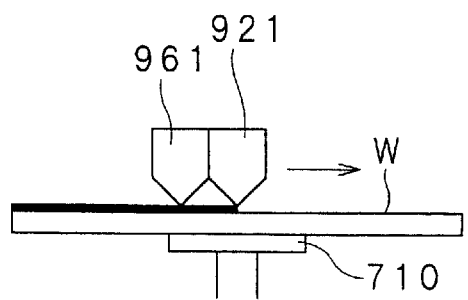

After starting processing, the developer supply nozzle 921 and the rinse supply nozzle 961 first move in the scanning direction A5 from the first end toward the second end of the substrate W above the main surface of the substrate W, as shown in FIG. 61B. When moving above the main surface of the substrate W, the developer supply nozzle 921 discharges the developer for supplying the same to the overall main surface of the substrate W and developing the main surface of the substrate W.

Figure 61C:
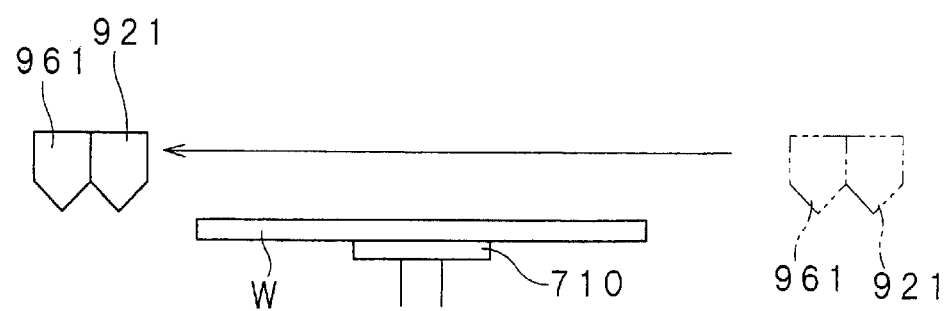

Thereafter the developer supply nozzle 921 and the rinse supply nozzle 961 move oppositely to the scanning direction A5 from the second end of the substrate W (downstream the scanning direction A5) to the first end of the substrate W (upstream the scanning direction A5), as shown in FIG. 61C.

Figure 61D:
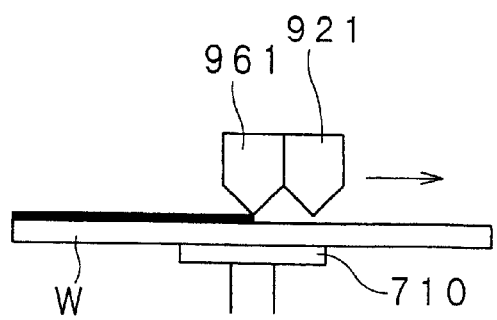

In response to a timing when a prescribed time necessary for developing the substrate W elapses, the rinse supply nozzle 961 and the developer supply nozzle 921 move in the scanning direction A5 from the first end toward the second end of the substrate W above the main surface of the substrate W, as shown in FIG. 61D. At this time, the speed of movement of the rinse supply nozzle 961 is set substantially identical to that of the developer supply nozzle 921 in FIG. 61B. The rinse supply nozzle 961 supplies a relatively small quantity of the rinse sufficient for stopping development. Thus, development of the substrate W can be stopped while rendering the developing time substantially identical on the overall main surface of the substrate W. Thereafter the developer supply nozzle 921 and the rinse supply nozzle 961 are temporarily located downstream the scanning direction A5 (refer to two-dot chain lines in FIG. 61E).

Figure 61E:
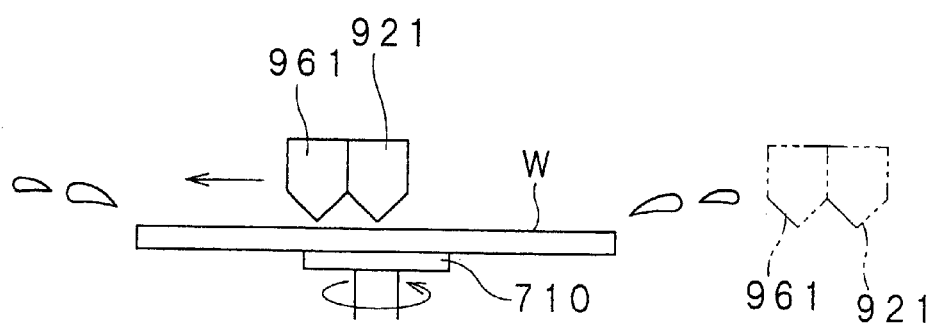

Thereafter the rinse supply nozzle 961 and the developer supply nozzle 921 move oppositely to the scanning direction A5 from the second end toward the first end of the substrate W above the main surface of the substrate W, as shown in FIG. 61E. The rinse supply nozzle 961 discharges the rinse as the detergent when passing above the main surface of the substrate W, which in turn is rotated. Thus, the detergent is supplied to the overall main surface of the rotated substrate W, for sufficiently removing particles.

Figure 61F:
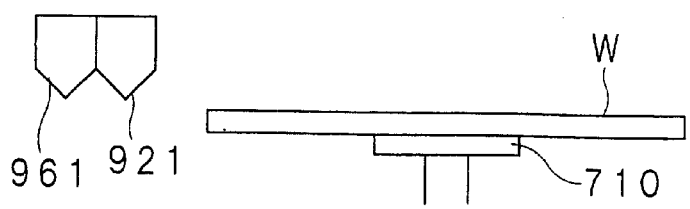

Finally, the developer supply nozzle 921 and the rinse supply nozzle 961 are located on the first end of the substrate W (upstream the scanning direction A5) as shown in FIG. 61F, to complete the series of operations.

In the substrate processing apparatus having the aforementioned structure, effects similar to those in the aforementioned fifteenth and sixteenth embodiments are attained while the nozzle moving mechanism 972 moves the rinse supply nozzle 961 along with the developer supply nozzle 921, whereby a structure for moving the nozzles 261 and 221 is rendered in common for simplifying the overall structure.

In this embodiment, the developer supply nozzle 921 and the rinse supply nozzle 961 may be integrated with each other, i.e., a developer discharge port and a rinse discharge port may be formed in a single nozzle.

In each of the aforementioned fifteenth to seventeenth embodiments, the detergent supply nozzle 941 and the rinse supply nozzle 861 or 261 may either forwardly or backwardly move in the scanning direction A5 for cleaning the substrate W, for example.

The detergent supply nozzle 941 and the rinse supply nozzle 861 or 261 may pass above the main surface of the substrate W a plurality of times in response to the degree of cleaning while discharging the detergent, for more sufficiently cleaning the substrate W.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
   a substrate holding element horizontally holding a substrate in a stationary state;
   a developer supplying moving element including a developer discharge port having a discharge width at least equivalent to the diameter of said substrate for moving from a developer supply start position on a first end of said substrate held by said substrate holding element to a developer supply end position on a second end and supplying a developer to the surface of said substrate; and
   a rinse supplying moving element including a rinse discharge port having a discharge width at least equivalent to the diameter of said substrate for moving from said developer supply start position to said developer supply end position after said developer supplying moving element supplies said developer to the overall surface of said substrate for supplying a rinse to the overall surface of said substrate from said rinse discharge port, wherein,
   said rinse supplying moving element has a rinse suction port having a suction width at least equivalent to the diameter of said substrate at the back of said rinse discharge port in the direction of movement of said rinse supplying moving element so that said rinse supplying moving element moves from said developer supply start position to said developer supply end position after said developer supplying moving element supplies said developer to the overall surface of said substrate for supplying said rinse to the overall surface of said substrate from said rinse discharge port while recovering said supplied rinse from said rinse suction port.

2. The substrate processing apparatus according to claim 1, wherein
   said rinse supplying moving element further has a developer suction port having a suction width at least equivalent to the diameter of said substrate in front of said rinse discharge port in the direction of movement of said rinse supplying moving element,
   for recovering said developer supplied to the overall surface of said substrate from said developer suction port when said rinse supplying moving element moves from said developer supply start position to said developer supply end position.

3. A substrate processing apparatus comprising:
   a substrate holding element horizontally holding a substrate in a stationary state; and
   a solution supplying moving element including a developer discharge port having a discharge width at least equivalent to the diameter of said substrate and a rinse discharge port having a discharge width at least equivalent to the diameter of said substrate and reciprocating on said substrate horizontally held by said substrate holding element for supplying a developer to the overall surface of said substrate from said developer discharge port in forward movement and supplying a rinse to the surface of said substrate from said rinse discharge port in subsequent backward movement, wherein
   said solution supplying moving element has a rinse suction port at the back of said rinse discharge port in the direction of said backward movement of said solution supplying moving element,
   for moving from a developer supply start position on a first end of said substrate held by said substrate holding element to a developer supply end position on a second end in said forward movement for supplying said developer to the surface of said substrate from said developer discharge port,
   while moving from said developer supply end position to said developer supply start position in said backward movement for supplying said rinse to the overall surface of said substrate from said rinse discharge port and recovering said rinse from said rinse suction port.

4. The substrate processing apparatus according to claim 3, wherein
   said solution supplying moving element further includes a developer suction port having a suction width at least equivalent to the diameter of said substrate in front of said rinse discharge port in the direction of said backward movement,
   for sucking and recovering said developer from the surface of said substrate through said developer suction port in said backward movement.

5. A substrate processing apparatus comprising:
   a substrate holding element horizontally holding a substrate in a stationary state; and
   a solution supplying moving element including a developer discharge port having a discharge width at least equivalent to the diameter of said substrate and a rinse discharge port having a discharge width at least equivalent to the diameter of said substrate and reciprocating on said substrate horizontally held by said substrate holding element, wherein
   said solution supplying moving element has a rinse suction port at the back of said rinse discharge port in the direction of frontward movement of said solution supplying moving element,
   for moving from a developer supply start position on a first end of said substrate to a developer supply end position on a second end in the first said forward movement for supplying a developer to the overall surface of said substrate from said developer discharge port, while moving from said developer supply start position to said developer supply end position in second said forward movement for supplying a rinse to the overall surface of said substrate from said rinse supply port and sucking and recovering said rinse supplied to the surface of said substrate from said rinse suction port.

6. The substrate processing apparatus according to claim 5, wherein said solution supplying moving element further includes a developer suction port having a suction width at least equivalent to the diameter of said substrate in front of said rinse discharge port in the direction of said forward movement, for moving from said developer supply start position to said developer supply end portion in said second forward movement for sucking and recovering said developer from the surface of said substrate through said developer suction port.

7. A substrate processing apparatus comprising:

a substrate holding element horizontally holding a substrate in a stationary state;

a solution supplying moving element including a solution discharge port having a discharge width at least equivalent to the diameter of said substrate and a solution suction port having a suction width at least equivalent to the diameter of said substrate for sucking and recovering a solution supplied to the surface of said substrate and reciprocating on said substrate horizontally held by said substrate holding element in a stationary state;

a developer supply source system supplying a developer to said solution discharge port;

a rinse supply source system supplying a rinse to said solution discharge port; and a switching control part making switching for supplying either said developer or said rinse to said solution discharge port, wherein said solution discharge port is arranges in front of said solution suction port in the direction of forward movement of said solution supplying moving element, and said solution supplying moving element moves from a solution supply start position on a first end of said substrate to a solution supply end position on another end in first said forward movement for supplying said developer to the overall surface of said substrate from said solution discharge port, while moving from said solution supply start position to said solution supply end position in second said forward movement for supplying said rinse to the overall surface of said substrate from said solution discharge port and sucking and recovering said rinse supplied to the surface of said substrate from said solution suction port.

8. A substrate processing apparatus comprising:

a substrate holding element holding a substrate;

a developer discharge nozzle discharging a developer;

a processing solution discharge nozzle discharging a processing solution for stopping development;

a gas injection nozzle injecting a gas for removing said developer and said processing solution from said substrate and drying said substrate; and a moving element moving said developer discharge nozzle, said processing solution discharge nozzle and said gas injection nozzle from a position on a first side located outside said substrate held by said substrate holding element in a stationary state to a position on a second side located outside said substrate through said substrate.

9. The substrate processing apparatus according to claim 8, wherein said moving element has an element integrally moving said developer discharge nozzle and said processing solution discharge nozzle from said position on said first side located outside said substrate held by said substrate holding element in a stationary state to said position on said second side located outside said substrate through said substrate.

10. The substrate processing apparatus according to claim 9, wherein said moving element has an element integrally moving said gas injection nozzle along with said developer discharge nozzle and said processing solution discharge nozzle from said position on said first side located outside said substrate held by said substrate holding element in a stationary state to said position on said second side located outside said substrate through said substrate.

11. The substrate processing apparatus according to claim 8, wherein said moving element includes:

a first moving part moving said developer discharge nozzle from said position on said first said located outside said substrate held by said substrate holding element in a stationary state to said position on said second side located outside said substrate through said substrate, and a second moving part moving said processing solution discharge nozzle from said position on said first side located outside said substrate held by said substrate holding element in a stationary state to said position on said second side located outside said substrate through said substrate independently of said developer discharge nozzle.

12. The substrate processing apparatus according to claim 11, wherein said moving element further includes a third moving part moving said gas injection nozzle from said position on said first side located outside said substrate held by said substrate holding element in a stationary state to said position on said second side located outside said substrate through said substrate independently of said developer discharge nozzle and said processing solution discharge nozzle.

13. The substrate processing apparatus according to claim 8, wherein the speed of movement of said developer discharge nozzle discharging said developer and the speed of movement of said processing solution discharge nozzle discharging said processing solution are substantially identical to each other.

14. The substrate processing apparatus according to claim 8, further comprising a control part moving said processing solution discharge nozzle and said gas injection nozzle from said position on said first side located outside said substrate held by said substrate holding element in a stationary state to said position on said second side located outside said substrate through said substrate by said moving element while discharging said processing solution from said processing solution discharge nozzle and injecting said gas from said gas injection nozzle.

15. The substrate processing apparatus according to claim 8, wherein
said developer discharge nozzle has a developer discharge port formed over a region exceeding the diameter of said substrate to be processed,
said processing solution discharge nozzle has a processing solution discharge port formed over a region exceeding the diameter of said substrate to be processed, and
said gas injection nozzle has a gas injection port formed over a region exceeding the diameter of said substrate to be processed.

16. The substrate processing apparatus according to claim 8, wherein
said developer discharge nozzle linearly discharges said developer in a direction substantially perpendicular to the direction of movement by said moving element, and
said processing solution discharge nozzle linearly discharges said processing solution in a direction substantially perpendicular to the direction of movement by said moving element.

17. A substrate processing apparatus comprising:
a substrate holding element horizontally holding a substrate;
a solution discharge nozzle having a discharge port for discharging a developer onto said substrate from said discharge port;
a developer supply source; and
a developer supply pipe connecting said solution discharge nozzle and said developer supply source with each other in a channel manner,
said substrate processing apparatus further comprising a pure water supply source and a pure water supply pipe connected to said pure water supply source and communicatively connected to said solution discharge nozzle, independently of said developer supply pipe, and
a first on-off valve within said developer supply pipe and a second on-off valve in said pure water supply pipe, said first on-off valve and said second on-off valve being selectively operable, further comprising:
a developer recovery pipe communicatively connected to said solution discharge nozzle,
a third on-off valve interposed in said developer recovery pipe,
a recovery suction element sucking the contents of said solution discharge nozzle through said developer recovery pipe, and
a recovery tank arranged between said solution discharge nozzle and said recovery suction element for recovering said developer sucked from said solution discharge nozzle.

18. The substrate processing apparatus according to claim 17, wherein
said developer discharge nozzle linearly discharges said developer in a direction substantially perpendicular to the direction of movement by said moving element, and
said processing solution discharge nozzle linearly discharges said processing solution in a direction substantially perpendicular to the direction of movement by said moving element.

19. The substrate apparatus according to claim 17, wherein said solution discharge nozzle has a slit discharge port on the lower end surface thereof.

20. The substrate processing apparatus according to claim 17 further comprising:
a drain pipe communicatively connected to said solution discharge nozzle,
a fourth on-off valve interposed in said drain pipe, and
a drain suction element sucking the contents of said solution discharge nozzle through said drain pipe.

21. A substrate processing apparatus comprising:
a substrate holding element horizontally holding a substrate;
a solution discharge nozzle having a discharge port for discharging a developer onto said substrate from said discharge port;
a developer supply source; and
a developer supply pipe connecting said solution discharge nozzle and said developer supply source with each other in a channel manner,
said substrate processing apparatus further comprising a pure water supply source and a pure water supply pipe connected to said pure water supply source and communicatively connected to said solution discharge nozzle, independently of said developer supply pipe, and
a first on-off valve within said developer supply pipe and a second on-off valve in said pure water supply pipe, said first on-off valve and said second on-off valve being selectively operable, further comprising:
a gas supply source,
a purge gas pipe communicatively connected to said solution discharge nozzle and said gas supply source, and
a fifth on-off valve interposed in said purge gas pipe, for supplying purge gas into said solution discharge nozzle through said purge gas pipe and purging said solution discharge nozzle with said purge gas.

22. A substrate processing apparatus comprising:
a substrate holding element holding a substrate;
a developer supply element supplying a developer from a first end to a second end of the main surface of said substrate held by said substrate holding element;
a stop bath supply element supplying a stop bath from said first end to said second end of the main surface of said substrate after said developer is supplied to the main surface of said substrate;
a detergent supply element supplying a detergent to the main surface of said substrate; and
a control part causing said detergent to be supplied to the main surface of said substrate from said detergent supply element after said stop bath is supplied to said substrate, wherein
said detergent supply element includes:
a detergent supply nozzle having a discharge port having a width substantially identical to or in excess of the diameter of said substrate, and
a detergent supply nozzle moving element moving said detergent supply nozzle from a first end toward a second end of a position where said substrate holding element holds said substrate, and
said control part causes said detergent to be supplied from said detergent supply nozzle while moving said detergent supply nozzle from said first end toward said second end of said position where said substrate is held or vice versa after said stop bath is supplied to said substrate.

23. The substrate processing apparatus according to claim 22, wherein said stop bath supply element and said detergent supply element share a rinse supply nozzle having a discharge port having a width substantially identical to or in excess of the diameter of said substrate and a rinse supply nozzle moving element moving said rinse supply nozzle from a first end toward a second end of a position where said substrate holding element holds said substrate and vice versa, and said control part causes said rinse to be supplied from said rinse supply nozzle as said stop bath while moving said rinse supply nozzle from a first end toward a second end of the main surface of said substrate held by said substrate holding element after said developer is supplied to said substrate and thereafter causes said rinse to be supplied from said rinse supply nozzle as said detergent while moving said rinse supply nozzle from said first end toward said second end of said position where said substrate holding element holds said substrate or vice versa.

24. The substrate processing apparatus according to claim 23, wherein said developer supply element includes a developer supply nozzle having a discharge port having a width substantially identical to or in excess of the diameter of said substrate, and said rinse supply nozzle moving element serves as a nozzle moving element moving said developer supply nozzle along with said rinse supply nozzle.

25. The substrate processing apparatus according to claim 23, wherein said developer supply element includes:
  a developer supply nozzle, formed independently of said rinse supply nozzle, having a discharge port having a width substantially identical to or in excess of the diameter of said substrate, and
  a developer supply nozzle moving element moving said developer supply nozzle from a first end toward a second end of the main surface of said substrate held by said substrate holding element.

26. The substrate processing apparatus according to claim 22, further comprising a rotating element rotating said substrate held by said substrate holding element, wherein said control part causes said substrate to be rotated while supplying said detergent to said substrate.

27. The substrate processing apparatus according to claim 22, increasing the quantity of said detergent supplied to said substrate beyond the quantity of said stop bath supplied to said substrate.

* * * * *